(12) United States Patent
Hillman et al.

(10) Patent No.: US 12,722,310 B2
(45) Date of Patent: Sep. 1, 2026

(54) METHOD AND/OR SYSTEM FOR PROCESSING A SUBSTRATE AND ROBOT APPARATUS THEREFOR

(71) Applicant: SERVICE SUPPORT SPECIALTIES, INC., Montville, NJ (US)

(72) Inventors: Gary Hillman, Livingston, NJ (US); Matthew Hoffer, Hackensack, NJ (US); Jayant Chandrakant Bhosle, Harrison, NJ (US); Rodrigo Nogueira, Montclair, NJ (US); Mark Hillman, Hoboken, NJ (US)

(73) Assignee: SERVICE SUPPORT SPECIALTIES, INC.

( * ) Notice: Subject to any disclaimer, the term of this patent is extended or adjusted under 35 U.S.C. 154(b) by 0 days.

(21) Appl. No.: 18/851,386

(22) PCT Filed: Apr. 11, 2023

(86) PCT No.: PCT/US2023/018105

§ 371 (c)(1),
(2) Date: Sep. 26, 2024

(87) PCT Pub. No.: WO2023/200746

PCT Pub. Date: Oct. 19, 2023

(65) Prior Publication Data

US 2025/0214227 A1 Jul. 3, 2025

Related U.S. Application Data

(60) Provisional application No. 63/330,520, filed on Apr. 13, 2022.

(51) Int. Cl.

| | |
|---|---|
| ***B25J 15/00*** | (2006.01) |
| ***B25J 11/00*** | (2006.01) |
| ***H10P 72/30*** | (2026.01) |

(52) U.S. Cl.
CPC ....... *B25J 15/0052* (2013.01); *B25J 11/0095* (2013.01); *B25J 15/0014* (2013.01);
(Continued)

(58) Field of Classification Search
CPC B25J 11/0095; B25J 15/0014; B25J 15/0052; H01L 21/67173; H01L 21/67178;
(Continued)

(56) References Cited

U.S. PATENT DOCUMENTS

| | | | |
|---|---|---|---|
| 5,007,784 | A | 4/1991 | Genov et al. |
| 5,571,325 | A | 11/1996 | Yoshio |

(Continued)

FOREIGN PATENT DOCUMENTS

| | | | |
|---|---|---|---|
| JP | 2021525960 | A | 9/2021 |
| WO | 2006069341 | A1 | 6/2006 |
| WO | 2022006003 | A1 | 1/2022 |

OTHER PUBLICATIONS

International Search Report of PCT/US2023/18105, Issued Sep. 5, 2023.

(Continued)

*Primary Examiner* — James Keenan
(74) *Attorney, Agent, or Firm* — The Belles Group, P.C.

(57) ABSTRACT

A semiconductor processing system, a method of processing semiconductors, and a robot apparatus therefor. The robot apparatus may include: a support structure; a first arm having a first axis and being movably mounted to the support structure, the first arm having a first end effector and a second end effector; a second arm having a second axis and being movably mounted to the support structure, the second arm being spaced apart from the first arm, the second arm having a first end effector and a second end effector; a first drive mechanism configured to move the first arm along the first axis; a second drive mechanism configured to move the
(Continued)

second arm along the second axis; and a third drive mechanism configured to move the first and second arms along a third axis that is perpendicular to the first and second axes.

16 Claims, 33 Drawing Sheets

(52) U.S. Cl.
CPC ...... *H10P 72/3302* (2026.01); *H10P 72/3304* (2026.01); *H10P 72/3306* (2026.01)

(58) Field of Classification Search
CPC ......... H01L 21/67742; H01L 21/67745; H01L 21/67748; H10P 72/0456; H10P 72/0458; H10P 72/3302; H10P 72/3304; H10P 72/3306
See application file for complete search history.

(56) References Cited

U.S. PATENT DOCUMENTS 5,789,890 A * 8/1998 Genov .................. B25J 9/1615 414/744.1
6,062,798 A * 5/2000 Muka ................ H01L 21/67745 414/416.03
6,279,724 B1 8/2001 Davis
6,318,951 B1 11/2001 Schmidt et al.
6,585,478 B1 7/2003 Wood et al.
7,988,398 B2 8/2011 Hofmeister et al.
8,419,341 B2 4/2013 Hoey et al.
8,562,275 B2 * 10/2013 Hiroki ............... H01L 21/67766 414/222.01
8,807,905 B2 8/2014 Meulen
10,493,634 B1 12/2019 Alqasemi et al.
11,521,869 B2 * 12/2022 Gould ............... H01L 21/67769
12,142,511 B2 * 11/2024 Krupyshev ....... H01L 21/67742
2004/0218449 A1 11/2004 How et al.
2008/0085173 A1 4/2008 van der Meulen
2008/0206036 A1 * 8/2008 Smith .............. H01L 21/67178 414/788
2008/0232947 A1 9/2008 van der Meulen et al.
2011/0071671 A1 3/2011 Ihrke et al.
2013/0341946 A1 12/2013 Yamanaka
2015/0221534 A1 8/2015 Van Der Meulen

OTHER PUBLICATIONS

Supplemental European Search Report EP23788821, Issued Apr. 30, 2026.

* cited by examiner 139
197
145
B
150
136
142
134
105
141
152
101

METHOD AND/OR SYSTEM FOR PROCESSING A SUBSTRATE AND ROBOT APPARATUS THEREFOR

CROSS-REFERENCE TO RELATED APPLICATIONS

The present application claims priority to U.S. Provisional Patent Application Ser. No. 63/330,520, filed Apr. 13, 2022, the entirety of which is incorporated herein by reference.

BACKGROUND OF THE INVENTION

The semiconductor manufacturing industry is one of continuous improvement in processes which has an ongoing need for higher equipment throughput at ever lower cost. Furthermore, due to the considerable costs associated with cleanroom space, there is a need and desire for a smaller footprint. There are two potential ways to achieve the goals of lower cost and higher throughput in less space. First, tool processes need to be stacked higher, one upon the other, to reduce footprint. Second, tool robots that perform the wafer handling tasks inherent in the tools must be made simpler and have fewer expensive components, while at the same time achieving high throughput and being able to reach ever higher to address the stacked process modules. Thus, a need exists for a tool robot that can achieve these goals in a low-cost manner.

SUMMARY OF THE INVENTION

The present invention is directed to a semiconductor processing system, a method of processing semiconductors, and a robot apparatus therefor.

In one aspect, the invention may be a robot apparatus comprising: a support structure having a longitudinal axis; a first arm movably mounted to the support structure, the first arm extending from a first end to a second end along a first axis, the first arm comprising a first end effector at the first end and a second end effector at the second end; a second arm movably mounted to the support structure and being spaced apart from the first arm in a direction of the longitudinal axis, the second arm extending from a first end to a second end along a second axis that is parallel to the first axis, the second arm comprising a first end effector at the first end and a second end effector at the second end; a first drive mechanism configured to move the first arm along the first axis; a second drive mechanism configured to move the second arm along the second axis; and a third drive mechanism configured to move the first and second arms along a third axis that is perpendicular to the first and second axes.

In another aspect, the invention may be a semiconductor processing system comprising: a first stack of process modules; a second stack of process modules spaced apart from the first stack of process modules; a first transport assembly comprising a first support member configured to support at least one first pre-processed substrate, the first support member being movable between a first position wherein the first support member is aligned with the first stack of process modules and a second position wherein the first support member is aligned with the second stack of process modules; a first robot apparatus located adjacent to the first stack of process modules, wherein when the first support member is in the first position the first robot apparatus is configured to: (1) remove the at least one first pre-processed substrate from the first support member of the first transport assembly and hold the at least one first pre-processed substrate on a first end effector of the first robot apparatus; (2) remove a first post-processed substrate from one of the process modules of the first stack and hold the first post-processed substrate on a second end effector of the first robot apparatus; and (3) transfer the at least one first pre-processed substrate from the first end effector of the first robot apparatus to the one of the process modules of the first stack; and a second robot apparatus located adjacent to the second stack of process modules, wherein when the first support member is in the second position the second robot apparatus is configured to: (1) remove the at least one first pre-processed substrate from the support member of the first transport assembly and hold the at least one first pre-processed substrate on a first end effector of the second robot apparatus; (2) remove a second post-processed substrate from one of the process modules of the second stack and hold the second post-processed substrate on a second end effector of the second robot apparatus; and (3) transfer the at least one first pre-processed substrate from the first end effector of the second robot apparatus to the one of the process modules of the second stack.

In yet another aspect, the invention may be a semiconductor processing system comprising: a first stack of process modules and a third stack of process modules, the first stack of process modules being spaced apart from the third stack of process modules by a first aisle; a second stack of process modules and a fourth stack of process modules, the second stack of process modules being spaced apart from the fourth stack of process modules by a second aisle; a first transport assembly comprising a first support member configured to support at least one substrate, the first support member being movable between a first position wherein the first support member is aligned with the first stack of process modules and a second position wherein the first support member is aligned with the second stack of process modules; a first robot apparatus at least partially located within the first aisle, wherein when the first support member is in the first position the first robot apparatus is configured to: (1) remove a first substrate from one of the process modules of the first stack; and (2) transfer the at least one substrate supported by the first support member of the first transport assembly into the one of the process modules of the first stack; and a second robot apparatus at least partially located within the second aisle, wherein when the first support member is in the second position the second robot apparatus is configured to: (1) remove a second substrate from one of the process modules of the second stack; and (2) position the at least one substrate supported by the first support member of the first transport assembly into the one of the process modules of the second stack.

In a further aspect, the invention may be a method of processing substrates, the method comprising: loading a first substrate onto a first support member of a first transport assembly; maneuvering a first arm of a first robot apparatus to transfer the first substrate from the first support member of the first transport assembly to a first end effector of the first arm of the first robot apparatus; moving the first arm and a second arm of the first robot apparatus in a first vertical direction until the second arm of the first robot apparatus is aligned with a selected process module of a first stack of process modules; maneuvering the second arm of the first robot apparatus to transfer a second substrate from the selected process module of the first stack of process modules to a first end effector of the second arm of the first robot apparatus; and maneuvering the first arm of the first robot apparatus to transfer the first substrate from the first end effector of the first arm into the selected process module of the first stack of process modules.

In another aspect, the invention may be a method of processing substrates, the method comprising: loading a first substrate onto a first support member of a first transport assembly while the first support member is in a first position such that the first support member is aligned with a first stack of process modules; moving the first support member of the first transport assembly from the first position to a second position such that the first support member is aligned with a second stack of process modules; transferring the first substrate from the first support member of the first transport assembly to a first end effector of a first arm of a second robot apparatus; moving the first arm and a second arm of the second robot apparatus in a first vertical direction until the second arm of the second robot apparatus is aligned with a selected process module of a second stack of process modules; maneuvering the second arm of the second robot apparatus to transfer a second substrate from the selected process module of the second stack of process modules to a first end effector of the second arm of the second robot apparatus; and maneuvering the first arm of the first robot apparatus to transfer the first substrate from the first end effector of the first arm into the selected process module of the second stack of process modules.

In yet another aspect, the invention may be a semiconductor processing system comprising: a first stack of process modules and a third stack of process modules, the first stack of process modules being spaced apart from the third stack of process modules by a first portion of an aisle; a first robot apparatus at least partially located within the first portion of the aisle, the first robot apparatus comprising: a first arm having a first end effector at a first end thereof and a second end effector at a second end thereof; and a second arm having a first end effector at a first end thereof and a second end effector at a second end thereof, the second arm being spaced vertically from the first arm; wherein the first robot apparatus is configured to: maneuver the first arm so that the first end effector of the first arm interacts with one of the process modules of the first stack or the second end effector of the first arm interacts with one of the process modules of the third stack; and maneuver the second arm so that the first end effector of the second arm interacts with one of the process modules of the first stack or the second end effector of the second arm interacts with one of the process modules of the third stack.

In still another aspect, the invention may be a semiconductor processing system comprising: an aisle; a first stack of process modules and a second stack of process modules positioned on a first side of the aisle; a third stack of process modules and a fourth stack of process modules positioned on a second side of the aisle, the third stack of process modules being located across from the first stack of process modules and the fourth stack of process modules being located across from the second stack of process modules; a robot apparatus configured to move through the aisle from a first position wherein the robot apparatus is located at least partially between the first and third stacks of process modules and a second position wherein the robot apparatus is located at least partially between the second and fourth stacks of process modules, the robot apparatus comprising: a first arm and a second arm that are maintained in a vertically spaced apart arrangement, each of the first and second arms comprising: a first end effector that is configured to interact with the first stack of process modules when the robot apparatus is in the first position and the second stack of process modules when the robot apparatus is in the second position; and a second end effector that is configured to interact with the third stack of process modules when the robot apparatus is in the first position and the second stack of process modules when the robot apparatus is in the second position.

In a further aspect, the invention may be a method of processing substrates, the method comprising: loading a first substrate onto a first end effector of a first arm of a robot apparatus; moving the robot apparatus along an aisle to a first position wherein the robot apparatus is at least partially located between a first stack of process modules located on a first side of the aisle and a third stack of process modules located on a second side of the aisle; maneuvering a second arm of the robot apparatus to transfer a second substrate from a selected one of the process chambers of the first stack to a first end effector of the second arm; and maneuvering the first arm of the robot apparatus to transfer the first substrate from the first end effector of the first arm to the selected one of the process chambers of the first stack.

In another aspect, the invention may be a robot apparatus comprising: a support structure; a base member mounted to the support structure, the base member comprising a first end, a second end, and a longitudinal axis extending between the first and second ends, the base member comprising a top surface and a first track extending from the top surface along a first track axis that is parallel to the longitudinal axis; a first slider assembly coupled to the first track of the base member, the first slider assembly comprising a first gear and a second gear; a first drive mechanism operably coupled to the first slider assembly to move the first slider assembly along the first track of the base member, the first drive mechanism comprising: a first motor; a first driver pulley operably coupled to the first motor; a first driven pulley spaced apart from the first drive pulley; and a first chain gear operably coupled to the first driver pulley and to the first driven pulley; wherein the first chain gear is operably coupled to the first and second gears of the first slider assembly to move the first slider assembly along the first track when the first motor is activated, wherein when moving the first slider assembly in a first direction along the first track axis the first gear and a first portion of the first slider assembly are configured to move beyond the first driven pulley, and wherein when moving the first slider assembly in a second direction along the first track axis the second gear and a second portion of the first slider assembly are configured to move beyond the first driver pulley.

In yet another aspect, the invention may be a semiconductor processing system comprising: a first stack of process modules and a second stack of process modules, the first stack of process modules being spaced apart from the second stack of process modules by a first gap; a first buffer assembly located in alignment with the first stack of process modules, the first buffer assembly being configured to hold a first plurality of substrates; a second buffer assembly located in alignment with the second stack of process modules, the second buffer assembly being configured to hold a second plurality of substrates; a first robot apparatus at least partially located within the first gap between the first and second stacks of process modules, wherein the first robot apparatus is configured to: (1) swap at least one of the first plurality of substrates with a first substrate located in one of the process modules of the first stack of process modules; and (2) swap at least one of the second plurality of substrates with a second substrate located in one of the process modules of the second stack of process modules.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 8A-8C illustrate a transport assembly of the semiconductor processing system of FIG. 1;

DETAILED DESCRIPTION OF THE INVENTION

Figure 1:
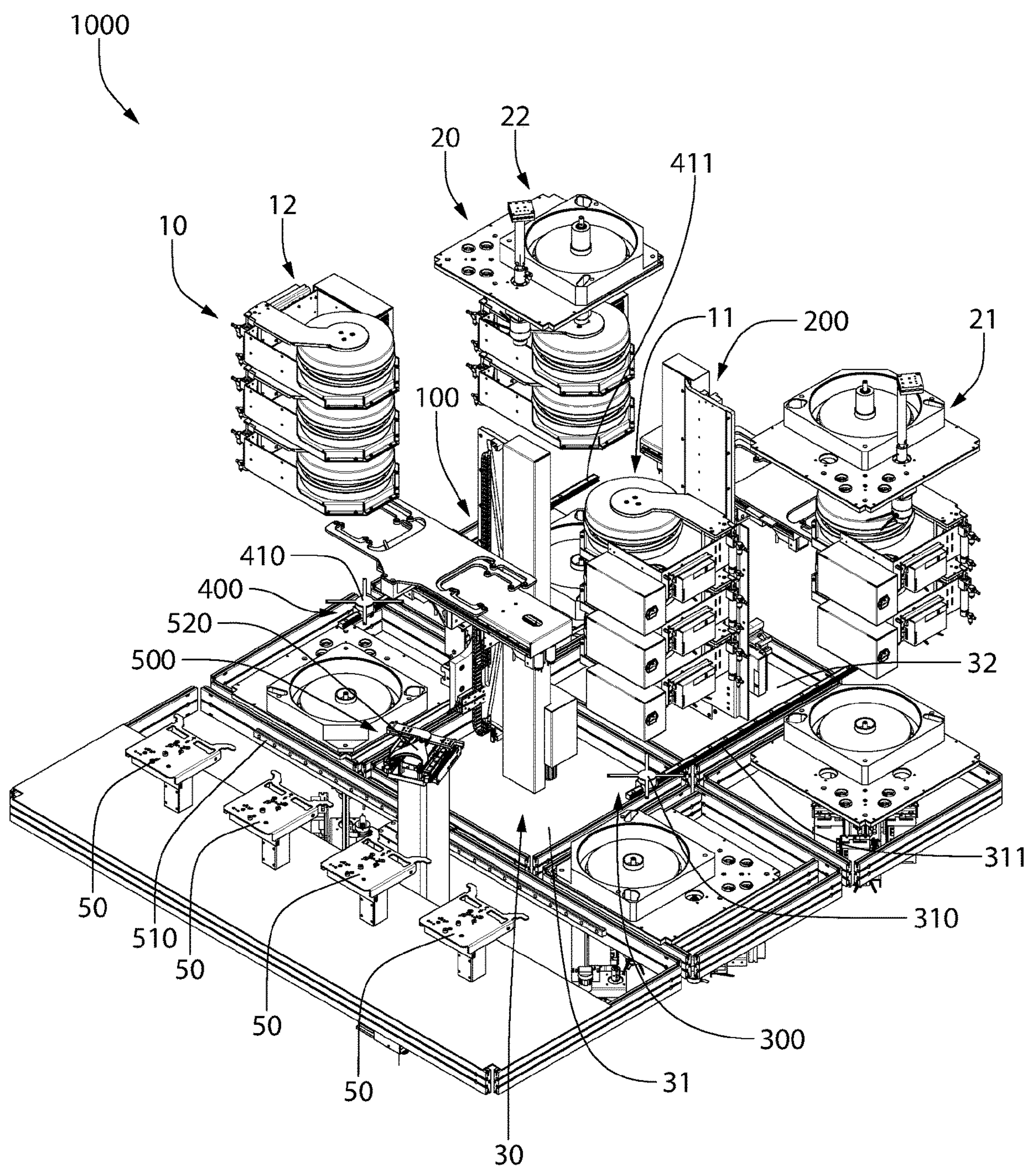
FIG. 1 is a top front perspective view of a semiconductor processing system in accordance with an embodiment of the present invention.

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

Figure 2:
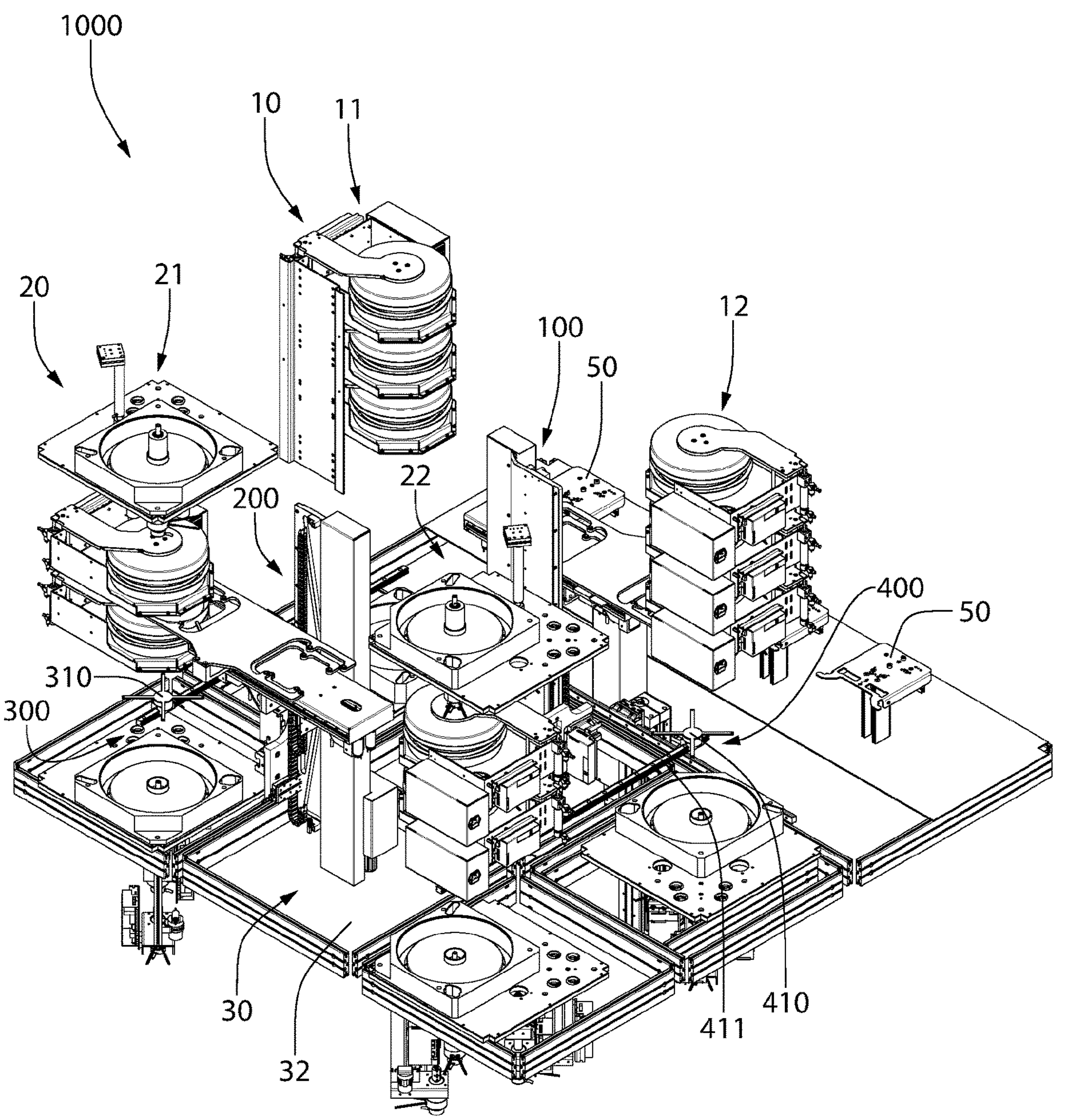
FIG. 2 is a top rear perspective view of the semiconductor processing system of FIG. 1.
Figure 3:
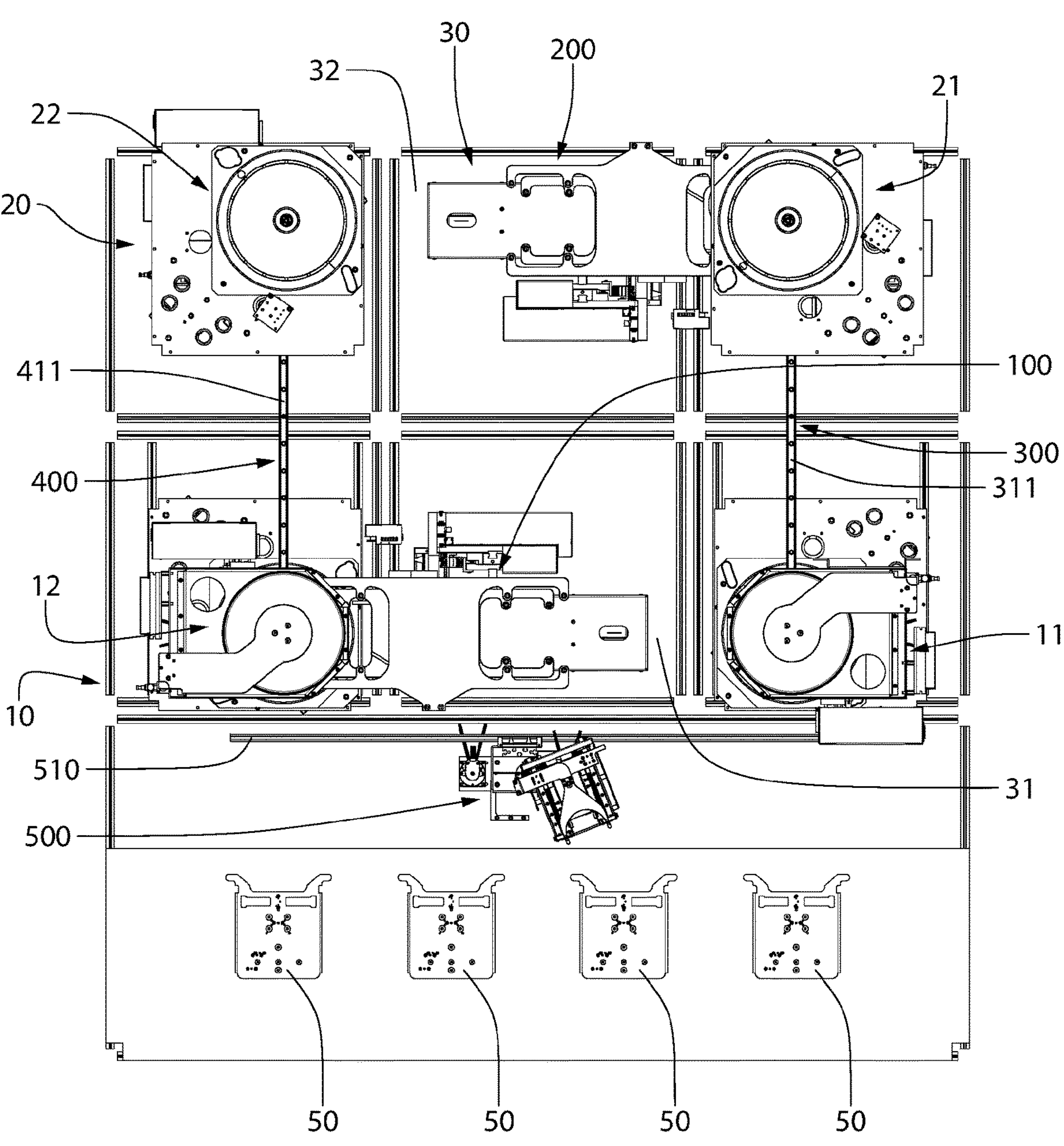
FIG. 3 is a top plan view of the semiconductor processing system of FIG. 1.

Referring to FIGS. 1-3, a semiconductor processing system 1000 is illustrated in accordance with an embodiment of the present invention. The semiconductor processing system 1000 comprises a plurality of blocks 10, 20, with each of the blocks 10, 20 comprising two stacks of process modules 11, 12, 21, 22. In the exemplified embodiment, the semiconductor processing system 1000 comprises a first block 10 comprising a first stack of process modules 11 and a third stack of process modules 12 and a second block 20 comprising a second stack of process modules 21 and a fourth stack of process modules 22. The first and third stacks 11, 12 are spaced apart by a first portion 31 of an aisle 30 and the second and fourth stacks 21, 22 are spaced apart by a second portion 32 of the aisle 30. Thus, the first and second stacks 11, 21 are located on a first side of the aisle 30 and the third and fourth stacks 12, 22 are located on a second side of the aisle 30. The spacing between the first and second stacks 11, 21 and between the third and fourth stacks 12, 22 is not to be limiting of the present invention. The spacing between the first and third stacks 11, 12 and between the second and fourth stacks 21, 22 should be sufficiently large to allow a robot apparatus to fit in that space for purposes of moving substrates through the system 1000. As used herein, the term aisle is used simply to refer to a space between two distinct stacks of process modules. In one embodiment, the term aisle refers to the space between two distinct stacks of process modules whereby the two stacks of process modules are configured to be interacted with by a single robot apparatus. The term aisle does not require an object, such as the robot apparatus, to move within the aisle in all embodiments. In some embodiments, the robot apparatus may be positioned within the aisle but may not move along or through the aisle.

While there are two blocks 10, 20 illustrated in the exemplified embodiment, more than two blocks 10, 20 could be used depending on space and size requirements, throughput needs, or the like. Thus, additional blocks each including a stack of process modules on the first side of the aisle 30 and a stack of process modules on the second side of the aisle 30 may be included as part of the semiconductor processing system 1000. The number of robots located in the aisle 30 may equal the number of blocks so that there is one robot for moving substrates into and out of the process chambers for each block. Additional framework architecture may be included in the system 1000 for supporting the stacks or process modules 11, 12, 21, 22, with much of the framework architecture being omitted in the drawings for clarity. Such framework architecture may include metal or plastic rods, columns, fittings, or the like which are connected to one another to support the other components of the system, such as the process modules, the robot apparatuses, and the like.

Each of the stacks of process modules 11, 12, 21, 22 may comprise a plurality of process modules that are arranged in a vertical stack. The exact number of the process modules in each stack is not to be limiting of the invention described herein. In conventional semiconductor processing systems, the height of the vertical stack and hence the number of processing modules included therewith is limited only by the vertical height to which the handling robot is capable of extending to. Typically such robots are comprised of two or three y axes operating one above the other, on a rotational axis that enables the robot to address both sides of the modules arrayed about the robot. The disadvantage of a rotational axis is that the rotational axis must be located atop of an axis that moves the robot vertically so that as the rotational axis rotates it can clear the obstruction of the vertical axis that hoists the robot end effectors that in turn are mounted on the rotational axis. In order then to achieve extreme heights one is forced to stack the robots as well as the process modules. By eliminating the rotational axis for these robots (as described herein), the height limitations for the stacks of process modules is reduced or eliminated because the handling robots are capable of reaching higher elevations.

The process modules of each of the stacks of process modules 11, 12, 21, 22 may be configured to perform specific functions in the semiconductor processing system 1000. For example for the first block 10, the first stack of process modules 11 may be configured to perform a coating procedure whereas the third stack of process modules 12 may be configured to perform a develop procedure. In another embodiment, both of the first and third stacks of process modules 11, 12 may be configured to perform a coating procedure or both of the first and second stacks of process modules 11, 12 may be configured to perform a develop procedure. Similarly, the second and fourth stacks of process modules 21, 22 may be configured so that one performs a coating procedure and the other performs a develop procedure, or both may be configured to perform a coating procedure or a develop procedure. The process modules of the various stacks 11, 12, 21, 22 may comprise one or more of process modules configured for heating, chilling, spinning, baking, developing, or performing other tasks associated with semiconductor processing. The semiconductor processing system 1000 may be a coating system, a developing system, a coating and developing system, or a system which integrates one or both of coating and developing with a stepper.

The techniques and concepts described herein relate, at least in part, to the movement of substrates during semiconductor processing or device fabrication. Thus, the exact processing or fabrication steps being performed is not to be limiting of the invention in all embodiments. Rather, in an embodiment the invention may be directed to the components, structures, assemblies, and the like that are used to move or transport the substrate from one location of the system to another. In an embodiment, the invention may be directed to the robots which are used to move and transfer the substrates from certain storage locations or cassettes into and out of process modules while substantially simplifying the robot axes and eliminating completely a rotational axis for those particular robots. Other robots involved in the movement of the substrates may have rotational axes, such as the robots that move the substrates from the storage cassettes to the buffers or transport assemblies. Further details regarding the robots that eliminate the rotational axis will be provided below.

The objects that are being moved by the robots may be referred to herein as substrates. The substrates may be articles that are used in the semiconductor industry and may be semiconductor wafers, wafers, raw silicon substrates, flat articles, panels, or the like. Typically, the substrate is a flat article used in the fabrication of an integrated circuit, although the invention is not to be so limited in all embodiments. Such substrates may be formed from a thin slice of a semiconductor material, such as a crystalline silicon.

The semiconductor processing system 1000 may comprise a first robot apparatus 100 and a second robot apparatus 200. The first robot apparatus 100 may be located within the first portion 31 of the aisle 30 between the first and third stacks of process modules 11, 12 of the first block 10. Thus, the first process module 11 is located on a first side of the first robot apparatus 100 and the third process module 12 is located on a second side of the first robot apparatus 100. The first robot apparatus 100 is configured to interact with the process modules of both of the first and third stacks 11, 12 of the first block 10. The second robot apparatus 200 may be located within the second portion 32 of the aisle 30 between the second and fourth stacks of process modules 21, 22 of the second block 20. Thus, the second process module 21 is located on a first side of the first robot apparatus 100 and the fourth process module 22 is located on a second side of the second robot apparatus 200. The second robot apparatus 100 is configured to interact with the process modules of both of the second and fourth stacks 21, 22 of the second block 20. The first and second robot apparatuses 100, 200 may be devoid of any rotational axis, meaning that the movement of the first and second robot apparatuses 100, 200 may be entirely linear including the movement of the robot body itself (if any) and the movement of the arms and/or end effectors thereof. The term interaction may refer to the first and second robot apparatuses 100, 200 adding and/or removing substrates from the various process chambers of the stacks of process chambers 11, 12, 21, 22. Thus, for example, the first robot apparatus 100 may interact with one of the process modules of the first stack of process modules 11 by adding and/or removing a substrate from the one of the process modules and the second robot apparatus 200 may interact with one of the process modules of the second stack of process modules 21 by adding and/or removing a substrate from the one of the process modules. The first and second robot apparatuses 100, 200 may be identical in some embodiments, as described further below. Additional details about the first and second robot apparatuses 100, 200 will be provided below with reference to FIGS. 6A-6C and 7A-7D.

The semiconductor processing system 1000 may further comprise a plurality of storage apparatuses 50 that are configured to hold one or more substrates prior to or after the substrates 50 are processed within one or more of the process chambers of the stacks 11, 12, 21, 22. In the exemplified embodiment, there are four of the storage apparatuses 50, although a single storage apparatus 50 or any other desired number of storage apparatuses 50 may be used. The storage apparatuses 50 may be cassettes that are commonly used to transport and store substrates or wafers during semiconductor manufacturing operations. Each of the cassettes of the storage apparatuses 50 may be configured to house one or more substrates of the same size or different sizes as desired. The exact number of substrates configured to be held or stored in the storage apparatuses 50 is not to be limiting of the invention in all embodiments.

The semiconductor processing system 1000 may further comprise a first transport assembly 300 and a second transport assembly 400 that are configured to transport the substrates so that they are in position to be interacted with and transferred or transported by one of the first and second robot apparatuses 100, 200 into and/or out of the process modules. The first and second transport assemblies 300, 400 may be referred to herein as buffers or buffer assemblies in some embodiments. The transport assemblies 300, 400 or buffers may be used to hold the substrates before and/or after the substrates are put into and/or removed from various process module of the system 1000.

The first transport assembly 300 may comprise a first support member 310 that is configured to support at least one substrate and a first track 311 that extends between the first and second stacks of process modules 11, 21. The first support member 310 may comprise one or more fingers upon which the at least one substrate is configured to be positioned. The first support member 310 may form an intermediary holding member that holds the substrate prior to the substrate being transferred by one of the first and second robot apparatuses 300, 400 to one of the process chambers of one of the stacks of process chambers 11, 12, 21, 22. The first support member 310 may be coupled to the first track 311 either directly or indirectly. The first support member 310 may be configured to move along the first track 311 from a first position wherein the first robot apparatus 100 is configured to interact with the first support member 310 to a second position wherein the second robot apparatus 200 is configured to interact with the first support member 310. The first and/or second robot apparatuses 100, 200 may be configured to add or remove substrates from the first support member 310 when the first support member 310 is in the first and second positions, respectively.

The first transport assembly 300 may comprise a drive system that is configured to facilitate the movement of the first support member 310. The drive system may comprise a motor, a belt drive, a gear system, or the like. For example, a motor may be activated to cause a belt or chain drive to move. The belt or chain drive may be coupled directly or indirectly to the first support member 310 to cause the first support member 310 to move along the first track 310. The first support member 310 may have engagement features which are configured to engage or mate with mating engagement features of the first track 310 to ensure that the first support member 310 moves along the track when the drive system is activated.

In FIG. 1, the first support member 310 is illustrated in the first position 310. In the first position, the first support member 310 may be aligned with the first stack of process modules 11. More specifically, in the first position the first support member 310 may be positioned below a bottommost process module of the first stack of process modules 11. In other embodiments, in the first position the first support member 310 may be at other positions along the first stack of process modules 11 while being aligned therewith. The first support member 310 may not be required to be aligned with the first stack of process modules 11 when in the first position in all embodiments, so long as the first robot apparatus 100 is capable of interacting with the first support member 310 when the first support member 310 is in the first position to achieve the functions as described herein.

When the first support member 310 is in the second position, the first support member 310 may be aligned with the second stack of process modules 21. That is, the first support member 310 may be located below the bottommost processing module of the second stack of process modules 21 or at other locations along the second stack of process modules 21 while being aligned therewith. In other embodiments, the first support member 310 need not be aligned with the second stack of process modules 21 when in the second position so long as the second robot apparatus 200 is capable of interacting with the first support member 310 when the first support member 310 is in the second position to achieve the functions as described herein.

The second transport assembly 400 may be identical to the first transport assembly 400, and thus fewer details will be provided here in the interest of brevity. The second transport assembly 400 may comprise a second support member 410 and a second track 411. The second support member 410 may be identical to the first support member 310 and thus additional details about the second support member 410 will not be provided here in the interest of brevity, it being understood that the description of the first support member 310 is applicable. The second track 411 may be identical to the first track 311, except that the second track 411 may extend between the third and fourth stacks of process modules 12, 22. Thus, the second support member 410 may be configured to move along the second track 411 from a first position wherein the second support member 410 is aligned with the third stack of process modules 12 and a second position wherein the second support member 410 is aligned with the fourth stack of process modules 22. In other embodiments, in the first position the second support member 410 may be positioned so as to be configured for interaction by or with the first robot apparatus 100 and in the second position the second support member 410 may be positioned so as to be configured for interaction by or with the second robot apparatus 200. Thus, the first and second positions may not require alignment with the third and fourth stacks of process modules 12, 22 in the first and second positions, in all embodiments.

The term aligned as used herein refers to a somewhat linear relationship between the support members and the process modules. When the support members and process modules are aligned, a reference cylinder which bounds the outer surfaces of the process modules also surrounds the support member when the support member is aligned with the process modules. In an embodiment, the term aligned may mean that a vertical axis intersects the process modules and the support member, or the vertical axis intersects substrates supported by the process modules and the support member which is aligned with the process modules. In an embodiment, the support member need not be perfectly aligned with the process modules, but rather aligned sufficiently to enable the robot apparatuses to interact with the support member and with the process modules without the robot apparatus or its arms being configured to rotate.

The semiconductor processing system 1000 may further comprise a transport robot 500. The transport robot 500 may be configured to move the substrates between the storage apparatuses 50 and the first and second support members 310, 410 of the first and second transport assemblies 300, 400. The first and second support members 310, 410 may be in the first position described above during this transfer procedure. Specifically, the transport robot 500 may be configured to pick up a substrate from one of the storage apparatuses 50 and then transfer the substrate to one of the first and second support members 310, 410 while the one of the first and second support members 310, 410 is in the first position. The one of the first and second support members 310, 410 may then either remain stationary (in the first position) so that the first robot apparatus 100 may pick up the substrate and move it into one of the process chambers of one of the first and third stacks 11, 12, or the one of the first and second support members 310, 410 may move to the second position whereby the second robot apparatus 200 may pick up the substrate and move it into one of the process chambers of one of the second and fourth stacks 21, 22.

The transport robot 500 may be configured to move axially along a track 510 to move the transport robot 500 between the storage apparatuses 50 and between the first and second support members 310, 410 of the first and second transport assemblies 300, 400. The transport robot 500 may also be configured to rotate about one or more axes to facilitate the necessary movement to allow am arm or end effector 520 of the transport robot 500 to move the substrates between the storage apparatuses and the first and second support members 310, 410 as described herein. A body of the transport robot 500 may be configured to rotate about an axis and the arm or end effector 520 of the transport robot 500 may be configured to rotate about one or more axes.

Figure 4:
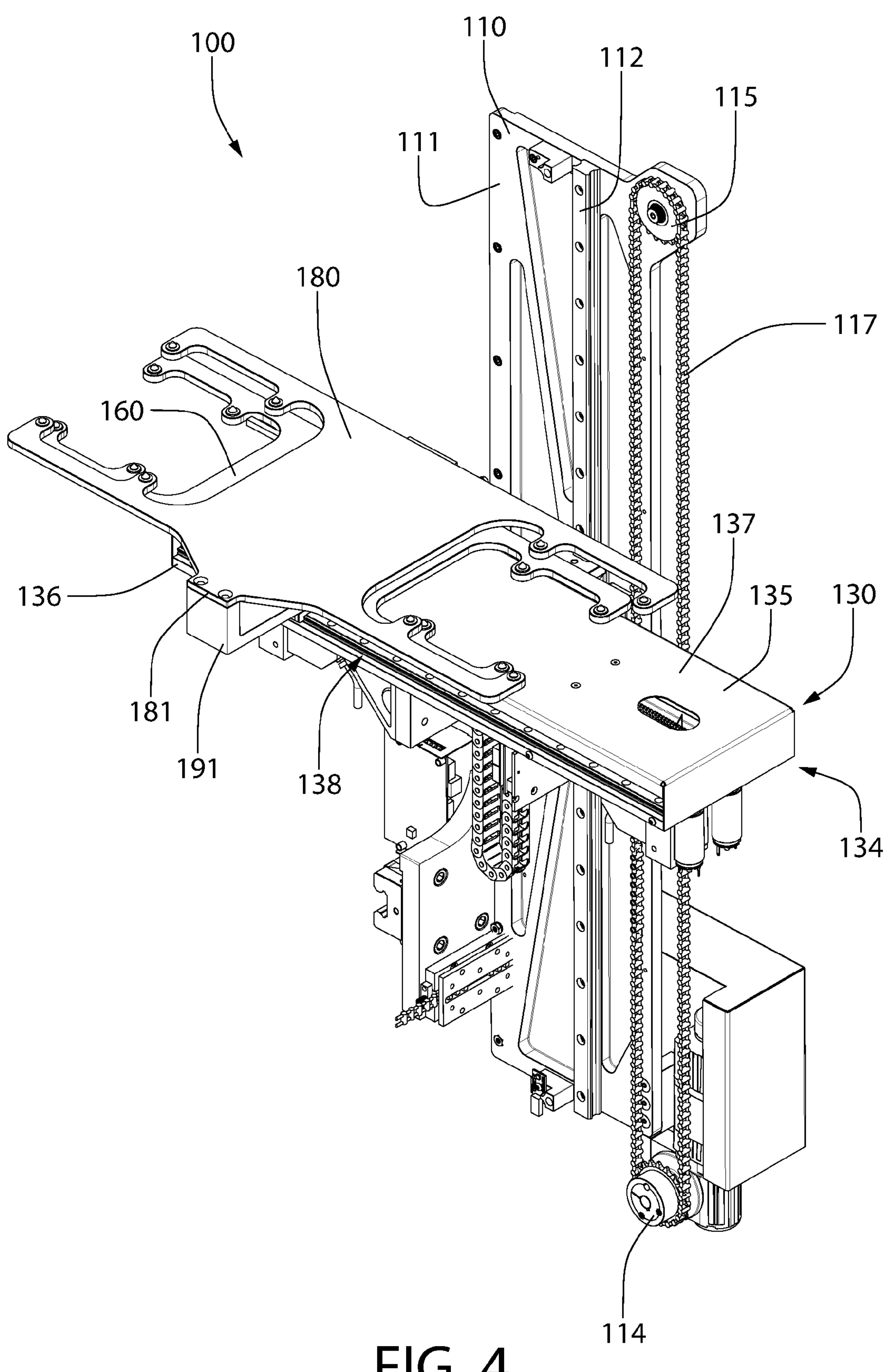
FIG. 4 is a front perspective view of a robot apparatus of the semiconductor processing system of FIG. 1.
Figure 5:
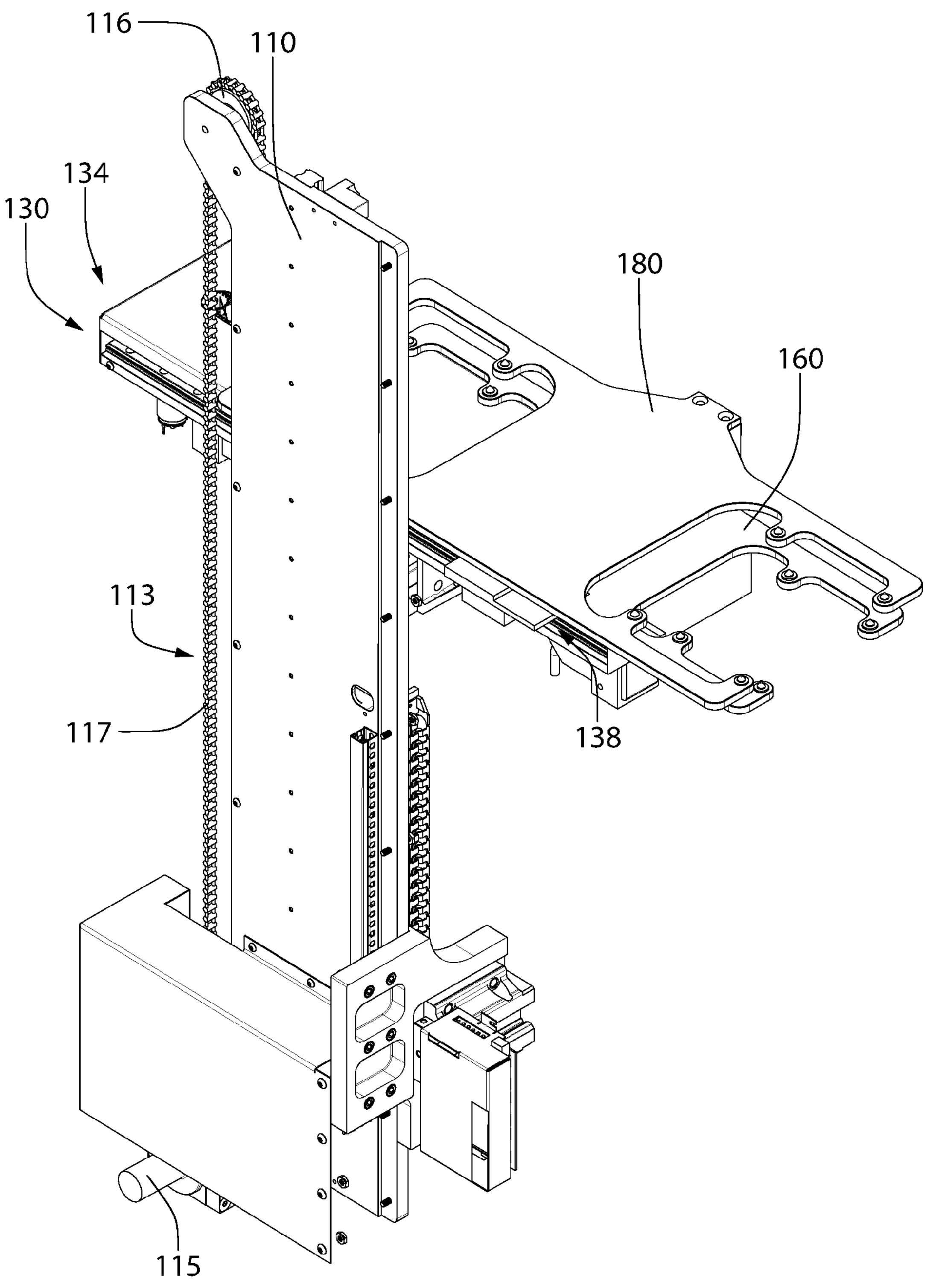
FIG. 5 is a rear perspective view of the robot apparatus of FIG. 4.
Figure 6A:
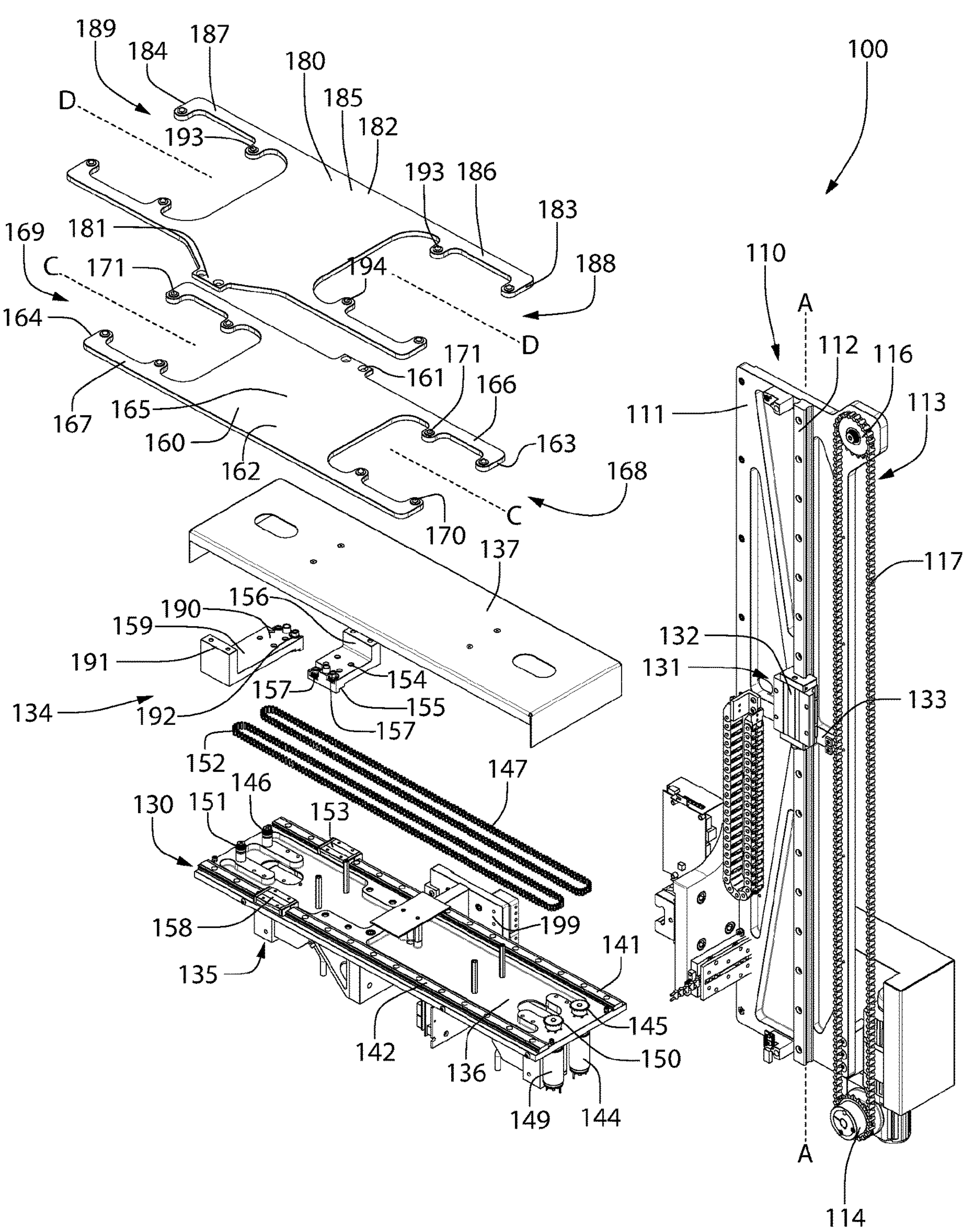
FIG. 6A is an exploded front perspective view of the robot apparatus of FIG. 4.

Referring to FIGS. 4, 5, and 6A, the first robot apparatus 100 will be described. The second robot apparatus 200 may be identical to the first robot apparatus 100. Thus, while a detailed description of the second robot apparatus 200 is not being provided here, it should be appreciated that the details of the first robot apparatus 100 are entirely applicable to the second robot apparatus 200.

The first robot apparatus 100 may comprise a support structure 110 having a longitudinal axis A-A, an elevator assembly 130 coupled to the support structure 110, a first arm 160 operably coupled to the elevator assembly 130, and a second arm 180 operably coupled to the elevator assembly 130. The support structure 110 may comprise a front surface 111 having a track 112 thereon. The track 112 may extend from the front surface 111 of the support structure 110. The track 112 may extend vertically along the support structure 110 in the direction of the longitudinal axis A-A from a bottom end of the support structure 110 to a top end of the support structure 110. In alternative embodiments, the track 112 may have ends that are set inwardly from the top and bottom ends of the support structure 110. The track 112 may be configured to support the elevator assembly 130 which may be configured to move upwardly and downwardly in the direction of the longitudinal axis A-A relative to and along the track 112, as described further below. The longitudinal axis A-A may be a vertically oriented axis when the first robot apparatus 100 is assembled and positioned in an upright orientation.

In an embodiment, the support structure 110 of the first robot apparatus 100 may be stationary. That is, while the elevator assembly 130 and the first and second arms 160, 180 may be configured to move in the manners and directions as described herein, the support structure 110 may be stationary and immovable. Thus, in one embodiment, through only linear movements of the first and second arms 160, 180, the first and second arms 160, 180 may be capable of interacting with the first and second transport assemblies 300, 400 and with the first and third stacks of process modules 11, 12. Because the support structure 110 of the first robot apparatus 100 is stationary, in an embodiment the alignment of the first and second support members 310, 410 with the first and third stacks of process modules 11, 12 when in the first position ensures that the first and second arms 160, 180 are in a position whereby they can interact with all of those components to add/remove substrates therefrom despite not being configured to move in the direction of the aisle 30.

The first robot apparatus 100 may comprise a third drive mechanism 113 that is mounted or coupled to the support structure 110. The third drive mechanism 113 may comprise a driver pulley 114 that is coupled to a motor 115, a driven pulley 116 that is spaced apart from the driver pulley 114, and a chain drive 117 that is annular and wraps around the driver and driven pulleys 114, 116. The driver pulley 114 and the driven pulley 116 may comprise teeth that mate with the links in the chain drive 117 to facilitate rotation of the chain drive 117. Specifically, when the motor 115 is activated, the motor 115 may cause the driver pulley 114 to rotate, which may in turn cause the chain drive 117 to rotate. While the exemplified embodiment illustrates the third drive mechanism 113 as a chain drive type assembly the invention is not to be so limited and in other embodiments the third drive mechanism 113 may be a belt drive assembly, a system of gears, a hydraulic system, a pneumatic system, or the like.

The elevator assembly 130 may comprise an elevator track connector 131 and an elevator member 134. The elevator member 134 may comprise a mounting portion 199 that is configured to be coupled to the elevator track connector 131 to couple or mount the elevator assembly 130 to the elevator track connector 131. In one embodiment, fasteners such as screws or the like may be inserted through holes in the mounting portion 199 and the elevator track connector 131 to facilitate the attachment between the elevator member 134 and the elevator track connector 131. In other embodiments, the elevator track connector 131 and the elevator member 135 may have connection or engagement features that mate with one another to facilitate the attachment between the elevator member 134 and the elevator track connector 131.

The elevator track connector 131 may comprise a track engagement portion 132 and an actuation portion 133. The track engagement portion 132 of the elevator track connector 131 may be configured to mate with the track 112 and ride upwardly and downwardly along the track 112 in the direction of the longitudinal axis A-A of the support structure 110. Thus, the track engagement portion 132 of the elevator track connector 131 may comprise engagement features that mate with engagement features of the track 112 to facilitate the attachment of the track engagement portion 132 of the elevator track member 131 to the track 112. The elevator track connector 113 may comprise grooves or protrusions that mate with protrusions or grooves of the track 112 to facilitate the attachment. The engagement between the track engagement portion 132 of the elevator track connector 131 and the track 112 may allow the elevator track connector 131 to move upwardly and downwardly along the track 112 in the direction of the longitudinal axis A-A of the support structure 110 while preventing the elevator track connector 131 from disengaging from the track 112 in a direction perpendicular to the longitudinal axis A-A of the support structure 110. The actuation portion 133 of the elevator track connector 131 may extend from the track engagement portion 132. The actuation portion 133 of the elevator track connector 131 may comprise teeth or other engagement features that are configured to mate with the links of the chain drive 117. As such, as the chain drive 117 rotates around the driver and driven pulleys 114, 116, the engagement of the links of the chain drive 117 and the engagement features of the actuation portion 133 of the elevator track connector 131 causes the elevator track connector 131 to move upwardly and downwardly along the track 112. Stated another way, the elevator track connector 131 moves along with the chain drive 117 as the chain drive 117 is driven by the motor 115. Depending on the direction of rotation of the motor 115, the elevator track connector 131 will either move upwardly or downwardly along the track 112.

Figure 6B:
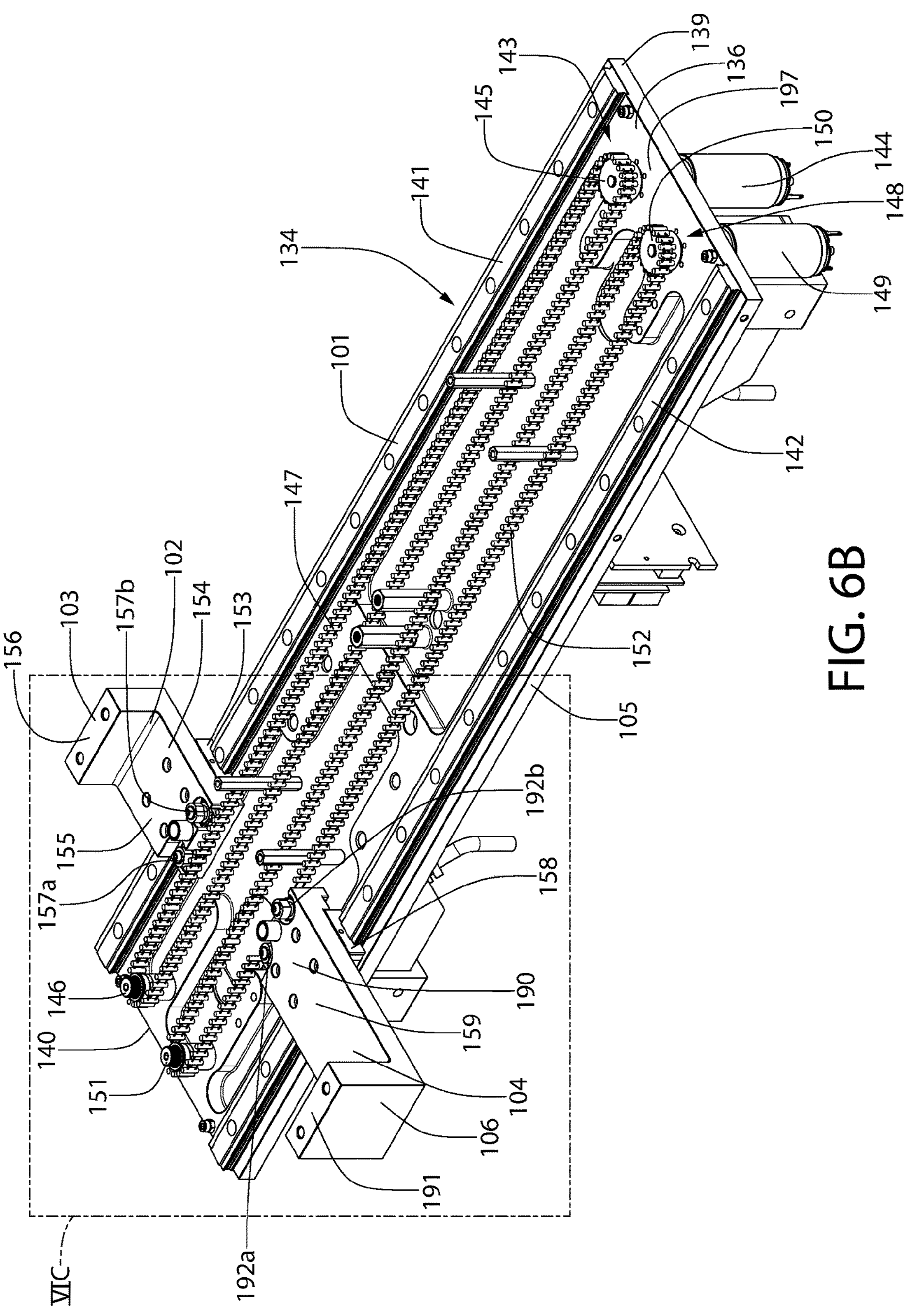
FIG. 6B is a perspective view of a portion of an elevator assembly of the robot apparatus of FIG. 4.
Figure 6C:
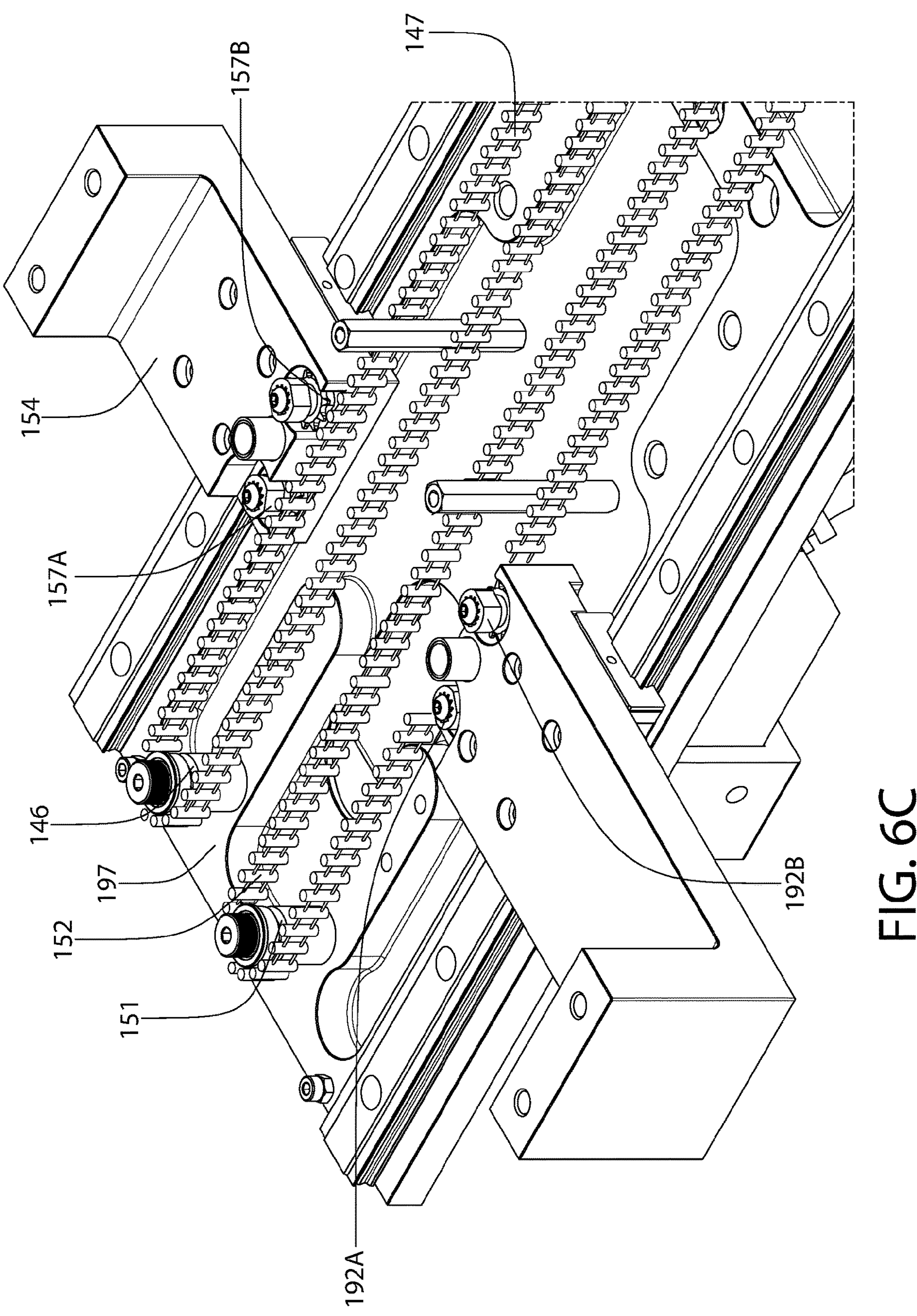
FIG. 6C is a close-up view of area VIC of FIG. 6B.
Figure 6D:
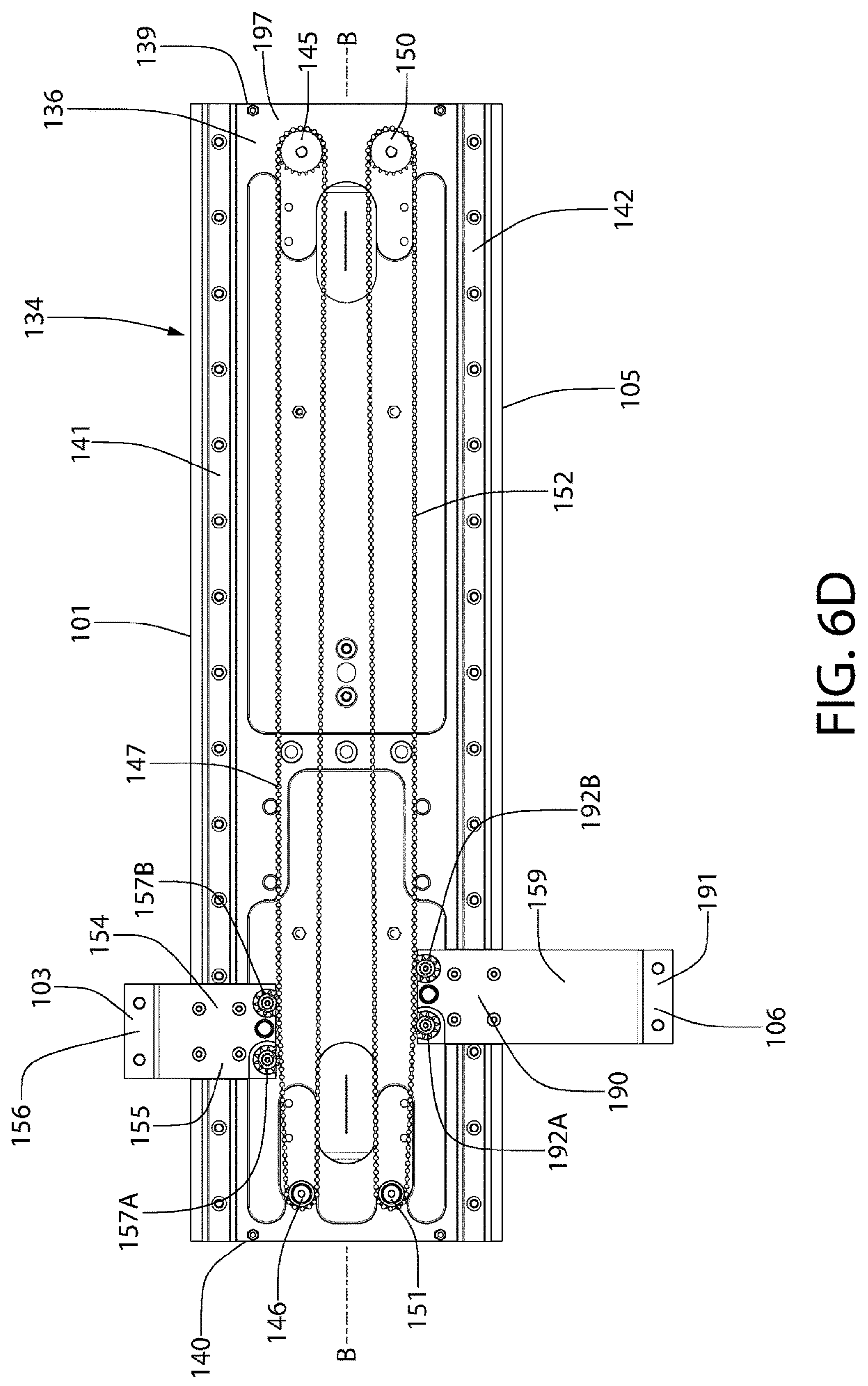
FIG. 6D is a top plan view of the elevator assembly of FIG. 6B.

Referring to FIGS. 6A-6C, the elevator member 134 of the elevator assembly 130 will be further described. As noted above, the elevator member 134 is coupled to the elevator track connector 132 via the mounting portion 199. Thus, as the elevator track connector 132 moves upwardly and downwardly along the track 11, the elevator member 134 also moves upwardly and downwardly in the direction of the longitudinal axis A-A of the support member 110. As discussed further below, the first and second arms 160, 180 are also mounted to or coupled to the elevator member 134, and thus as the elevator member 134 moves upwardly and downwardly, the first and second arms 160, 180 also move upwardly and downwardly.

The elevator member 134 may comprise a housing 135 that defines an internal cavity 138. The housing 135 may comprise a base member 136 and a cover member 137 that, when coupled together, form the housing 135 and define the internal cavity 138. In alternative embodiments, the cover member 137 may be omitted. The base member 136 of the elevator member 134 may comprise a first end 139 and a second end 140, with the base member 136 being elongated between the first and second ends 139, 140. The base member 136 may comprise a longitudinal axis B-B that extends between the first and second ends 139, 140. The base member 136 may further comprise a first track 141 extending from the first end 139 to the second end 140 along or adjacent to a first side edge 101 of the base member 136 and a second track 142 extending from the first end 139 to the second end 140 along or adjacent to a second side edge 105 of the base member 136. While the first and second tracks 141, 142 extend from the first end 139 of the base member 136 to the second end 140 of the base member 136 in the exemplified embodiment, the invention is not to be so limited and the ends of the first and second tracks 141, 142 may be set inwardly from the first and second ends 139, 140 of the base member 136 in other embodiments. The first and second tracks 141, 142 extend along axes that are parallel to one another and parallel to the longitudinal axis B-B of the base member 136.

A first drive mechanism 143 may be coupled to the elevator member 134 to move the first arm 160 relative to the elevator assembly 130 in the direction of the longitudinal axis B-B. The first drive mechanism 143 may comprise a first motor 144, a driver pulley 145, a driven pulley 146, and a chain gear 147. The driver pulley 145 may have a first height and the driven pulley 146 may have a second height that is greater than the first height. The chain gear 147 wraps partially around each of the driver and driven pulleys 145, 146 and extends between the driver and driven pulleys 145, 146. The chain gear 147 may attach to the driver pulley 145 at a first elevation and to the driven pulley 146 at a second elevation, with the second elevation being greater than the first elevation. The term elevation should be understood to mean a height above a top surface 197 of the base member 136. Thus, the chain gear 147 may be oriented on a plane that is angled relative to the longitudinal axis B-B of the base member 136. When the first motor 144 is activated, the first motor 144 rotates the driver pulley 145, which in turn causes the chain gear 147 to rotate or circulate in a loop pattern around the outsides of the driver and driven pulleys 145, 146. In alternative embodiments, the first drive mechanism 143 may comprise a belt drive assembly, a system of gears, a hydraulic system, a pneumatic system, or the like.

A second drive mechanism 148 may be coupled to the elevator member 134 to move the second arm 180 relative to the elevator assembly 130 in the direction of the longitudinal axis B-B. The second drive mechanism 148 may comprise a second motor 149, a driver pulley 150, a driven pulley 151, and a chain gear 152. The driver pulley 150 may have a first height and the driven pulley 151 may have a second height that is greater than the first height. The chain gear 152 may wrap partially around each of the drive and driven pulleys 150, 151 and extend between the driver and driven pulleys 150, 151. The chain gear 152 may attach to the driver pulley 150 at a first elevation and to the driven pulley 146 at a second elevation that is greater than the first elevation. Thus, the chain gear 152 may be oriented on a plane that is angled relative to the longitudinal axis B-B of the base member 136. When the second motor 149 is activated, the second motor 149 may rotate the driver pulley 149, which in turn may cause the chain gear 152 to rotate or circulate in a loop pattern around the outsides of the driver and driven pulleys 150, 151. In alternative embodiments, the second drive mechanism 148 may comprise a belt drive assembly, a system of gears, a hydraulic system, a pneumatic system, or the like. The second drive mechanism 148 may be configured to drive or move the second arm 180 independently of the movement of the first arm 160. Thus, the first drive mechanism 143 may drive movement of the first arm 160 without affecting movement of the second arm 180 and the second drive mechanism 148 may drive movement of the second arm 180 without affecting movement of the first arm 160.

A first track connector 153 is coupled to the first track 141 and is configured to move along the first track 141 between the first and second ends 139, 140 of the base member 136 in the direction of the longitudinal axis B-B. The first track connector 153 and the first track 141 may comprise engagement features, such as a groove and a protrusion, that mate with one another to facilitate the connection of the first track connector 153 to the first track 141. This connection allows the first track connector 153 to ride along the first track 141 in the direction of the longitudinal axis B-B while preventing the first track connector 153 from disengagement with the first track 141 in a direction perpendicular to the longitudinal axis B-B. A first arm coupler 154 is configured to couple the first arm 160 to the first track connector 153. In the exemplified embodiment, the first arm coupler 154 is a separate part from the first track connector 153 with the first arm coupler 154 being configured to be coupled to the first track coupler 153 with fasteners or the like. The first arm coupler 154 may comprise a first connection portion 155 configured to facilitate the coupling of the first arm coupler 154 to the first track connector 153 and a second connection portion 156 configured to facilitate the coupling of the first arm 160 to the first arm coupler 154. In an alternative embodiment, the first arm coupler 154 may be integral with the first track connector 153. In one embodiment, the first arm coupler 154 and the first track connector 153 may be collectively referred to herein as a first slider assembly or a first slider.

The first arm coupler 154 may comprise a first gear 157*a* and a second gear 157*b*. The first gear 157*a* is at a first elevation relative to the top surface 197 of the base member 136 and the second gear 157*b* is at a second elevation relative to the top surface 197 of the base member 136. The second elevation is greater than the first elevation, and thus the second gear 157*b* is located further from the top surface

197 of the base member 136 than the first gear 157*a*. The chain gear 147 may be configured to mate with or engage the first and/or second gears 157*a*, 157*b* to facilitate movement of the first arm coupler 154, the first track connector 153, and the first arm 160 in the direction of the longitudinal axis B-B. That is, as the chain gear 147 moves in one direction, the engagement of the chain gear 147 with the first and/or second gears 157*a*, 157*b* may result in the first arm coupler 154 and the first track connector 153 moving along the first track 141, with the first arm 160 also moving due to its attachment to the first arm coupler 154 (described below). Thus, when the first motor 144 is activated, the chain gear 147 rotates and causes the first arm coupler 154, the first track connector 153, and the first arm 160 to move in the direction of the longitudinal axis B-B (with the movement being in one of two opposite directions, depending on the direction of rotation of the first motor 144).

Furthermore, due to the different heights/elevations of the driver and driven pulleys 145, 146 and due to the different heights/elevations of the first and second gears 157*a*, 157*b*, the overall length of the base member 136 (measured between the first and second ends 139, 140) may be reduced. Specifically, the first gear 157*a* which is at a lower elevation than the second gear 157*b* is located closer to the driven pulley 146 which is taller than the driver pulley 145. Furthermore, the driven pulley 146 extends further from the top surface 197 of the base member 136 than the first gear 157*a*. That is, the chain gear 147 is connected to the driven pulley 146 at an elevation that is greater than the elevation of the first gear 157*a*. As such, the first arm coupler 154 is able to move/slide beyond the driven pulley 146, thereby giving an increased movement of the first arm coupler 154 with a reduced length of the base member 136. Specifically, as the first arm coupler 154 moves to the location of the driven pulley 146, the first gear 157*a* is positioned below the chain gear 147 and continues to move beyond the driven pulley 146 and beyond the second end 140 of the base member 136 until the second gear 157*b* is aligned with the driven pulley 146. As the first gear 157*a* moves to a position near the driven pulley 146, the first gear 157*a* may not be coupled directly to the chain gear 147 which allows the first gear 157*a* to move to a position beyond the chain gear 147. This allows approximately one-half of the first arm coupler 154 and the first track connector 153 to move to a position beyond the driven pulley 146, thereby increasing the distance that the first arm 160 can move in the direction of the longitudinal axis B-B.

Furthermore, the second gear 157*b* is located closer to the driver pulley 145 than the first gear 157*a*. Furthermore, the second gear 157*b* extends further from the top surface 197 of the base member 136 than the driver pulley 145. That is, the chain gear 147 is connected to the driver pulley 145 at a height or elevation that is less than the height or elevation of the second gear 157*b*. As such, the first arm coupler 154 is able to move/slide beyond the driver pulley 145, thereby giving an increased movement of the first arm coupler 154 with a reduced length of the base member 136. Specifically, as the first arm coupler 154 moves to the location of the driver pulley 145, the second gear 157*b* is positioned above the chain gear 147 and continues to move beyond the driver pulley 145 and beyond the first end 139 of the base member 136 until the first gear 157*a* is aligned with the driver pulley 145. As the second gear 157*b* moves to a location near the driver pulley 145, the second gear 157*b* may not be coupled directly to the chain gear 147. Instead, at this position only the first gear 157*a* may be coupled directly to the chain gear 147, which allows the second gear 157*b* to slide past the driver pulley 145. This allows approximately one-half of the first arm coupler 154 and the first track connector 153 to move to a position beyond the driver pulley 145, thereby increasing the distance that the first arm 160 can move in the direction of the longitudinal axis B-B.

A second track connector 158 is coupled to the second track 142 and is configured to move along the second track 142 between the first and second ends 139, 140 of the base member 136 in the direction of the longitudinal axis B-B. The second track connector 158 and the second track 142 may comprise engagement features, such as a groove and a protrusion, that mate with one another to facilitate the connection of the second track connector 158 to the second track 142. This connection allows the second track connector 158 to ride along the second track 142 in the direction of the longitudinal axis B-B while preventing the second track connector 158 from disengagement with the second track 142 in a direction perpendicular to the longitudinal axis B-B. A second arm coupler 159 is configured to couple the second arm 180 to the first track connector 153. In the exemplified embodiment, the second arm coupler 159 is a separate part from the second track connector 158 with the second arm coupler 159 being configured to be coupled to the second track coupler 158 with fasteners or the like. The second arm coupler 159 may comprise a first connection portion 190 configured to facilitate the coupling of the second arm coupler 159 to the second track connector 158 and a second connection portion 191 configured to facilitate the coupling of the second arm 180 to the second arm coupler 159. In an alternative embodiment, the second arm coupler 159 may be integral with the second track connector 158. In one embodiment, the second arm coupler 159 and the second track connector 128 may be collectively referred to herein as a second slider assembly or a second slider.

The second arm coupler 159 may comprise a first gear 192*a* and a second gear 192*b*. The first gear 192*a* is at a first elevation relative to the top surface 197 of the base member 136 and the second gear 192*b* is at a second elevation relative to the top surface 197 of the base member 136. The second elevation is greater than the first elevation, and thus the second gear 192*b* is located further from the top surface 197 of the base member 136 than the first gear 192*a*. The chain gear 152 may be configured to mate with or engage the first and/or second gears 15192*a*, 192*b* to facilitate movement of the second arm coupler 159, the second track connector 158, and the second arm 180 in the direction of the longitudinal axis B-B. That is, as the chain gear 152 moves in one direction, the engagement of the chain gear 152 with the first and/or second gears 192*a*, 192*b* may result in the second arm coupler 159 and the second track connector 158 moving along the second track 142, with the second arm 180 also moving due to its attachment to the second arm coupler 159 (described below). Thus, when the second motor 149 is activated, the chain gear 152 rotates and causes the second arm coupler 159, the second track connector 158, and the second arm 180 to move in the direction of the longitudinal axis B-B (with the movement being in one of two opposite directions, depending on the direction of rotation of the second motor 149).

Furthermore, due to the different heights/elevations of the driver and driven pulleys 150, 151 and due to the different heights/elevations of the first and second gears 192*a*, 192*b*, the overall length of the base member 136 (measured between the first and second ends 139, 140) may be reduced. Specifically, the first gear 192*a* which is at a lower elevation than the second gear 192*b* is located closer to the driven pulley 151 which is taller than the driver pulley 150.

Furthermore, the driven pulley 151 extends further from the top surface 197 of the base member 136 than the first gear 192*a*. That is, the chain gear 152 is connected to the driven pulley 151 at an elevation that is greater than the elevation of the first gear 192*a*. As such, the second arm coupler 159 is able to move/slide beyond the driven pulley 151, thereby giving an increased movement of the second arm coupler 159 with a reduced length of the base member 136. Specifically, as the second arm coupler 159 moves to the location of the driven pulley 151, the first gear 192*a* is positioned below the chain gear 152 and continues to move beyond the driven pulley 151 and beyond the second end 140 of the base member 136 until the second gear 192*v* is aligned with the driven pulley 151. As the first gear 192*a* moves to a position near the driven pulley 151, the first gear 192*a* may not be coupled directly to the chain gear 152 which allows the first gear 192*a* to move to a position beyond the chain gear 152. This allows approximately one-half of the second arm coupler 159 and the second track connector 158 to move to a position beyond the driven pulley 151, thereby increasing the distance that the second arm 180 can move in the direction of the longitudinal axis B-B.

Furthermore, the second gear 192*b* is located closer to the driver pulley 150 than the first gear 192*a*. Furthermore, the second gear 192*b* extends further from the top surface 197 of the base member 136 than the driver pulley 150. That is, the chain gear 152 is connected to the driver pulley 150 at a height or elevation that is less than the height or elevation of the second gear 192*b*. As such, the second arm coupler 159 is able to move/slide beyond the driver pulley 150, thereby giving an increased movement of the second arm coupler 159 with a reduced length of the base member 136. Specifically, as the second arm coupler 159 moves to the location of the driver pulley 150, the second gear 192*b* is positioned above the chain gear 152 and continues to move beyond the driver pulley 150 and beyond the first end 139 of the base member 136 until the first gear 192*a* is aligned with the driver pulley 150. As the second gear 192*b* moves to a location near the driver pulley 150, the second gear 192*b* may not be coupled directly to the chain gear 152. Instead, at this position only the first gear 192*a* may be coupled directly to the chain gear 152, which allows the second gear 192*b* to slide past the driver pulley 150. This allows approximately one-half of the second arm coupler 159 and the second track connector 158 to move to a position beyond the driver pulley 150, thereby increasing the distance that the second arm 180 can move in the direction of the longitudinal axis B-B.

The first connection portion 155 of the first arm coupler 154 may comprise a horizontal wall 102 that protrudes from the first side edge 101 of the base member 136 when the first arm coupler 154 is coupled to the first track coupler 153. The second connection portion 156 may comprise a vertical wall 103 that extends upwardly from first connection portion 155. The vertical wall 103 may have a first height. The first connection portion 190 of the second arm coupler 159 may comprise a horizontal wall 104 that protrudes from the second side edge 105 of the base member 136 when the second arm coupler 159 is coupled to the second track coupler 158. The second connection portion 191 of the second arm coupler 159 may comprise a vertical wall 106 that extends upwardly from the first connection portion 190. The vertical wall 106 may have a second height. The second height may be greater than the first height. Because the first and second arms 160, 180 are mounted to the second connection portions 156, 191 of the first and second arm couplers 154, 159, respectively, by having the second height be greater than the first height the first and second arms 160, 180 are maintained in a spaced apart manner with the second arm 180 being elevated relative to the first arm 160. That is, the second arm 180 which is coupled to the second arm coupler 159 may be elevated above the first arm 160 which is coupled to the first arm coupler 154 due to the difference in the heights of the vertical wall portions thereof.

The first arm 160 comprises a first connection portion 161 comprising two holes. The first arm 160 is configured to be coupled to the second connection portion 156 of the first arm coupler 154 by aligning the two holes of the first connection portion 161 of the first arm 160 with the two holes of the second connection portion 156 of the first arm coupler 154 and inserting fasteners such as screws or the like therethrough. The second arm 180 comprises a second connection portion 181 comprising two holes. The second arm 180 is configured to be coupled to the second connection portion 191 of the second arm coupler 159 by aligning the two holes of the second connection portion 181 of the second arm 180 with the two holes of the second connection portion 191 of the second arm coupler 159 and inserting fasteners such as screws or the like therethrough.

Thus, due to the connections described herein, activation of the first motor 144 of the first drive mechanism 143 causes the first arm 160 to move in the direction of the longitudinal axis B-B (in either direction) and activation of the second motor 149 of the second drive mechanism 148 causes the second arm 180 to move in the direction of the longitudinal axis B-B (in either direction). If only the first motor 144 is activated, then only the first arm 160 is moving and the second arm 180 is stationary. If only the second motor 149 is activated, then only the second arm 180 is moving and the first arm 160 is stationary. Furthermore, activation of the third motor 115 of the third drive mechanism 113 causes the elevator assembly 130 to move either upwardly or downwardly in the direction of the longitudinal axis A-A. Since the first and second arms 160, 180 are coupled to the elevator assembly 130 as described above, as the elevator assembly 130 moves upwardly and downwardly in the direction of the longitudinal axis A-A, the first and second arms 160, 180 also move upwardly and downwardly along with the elevator assembly 130.

The first and second arms 160, 180 are mounted to the elevator assembly 130 in a vertically spaced apart manner so that the second arm 180 is spaced a distance above the first arm 160. The spacing between the first and second arms 160, 180 is maintained during activation of the third drive mechanism 113. That is, as the first and second arms 160, 180 move upwardly/downwardly, they do not move upwardly/downwardly relative to one another but instead move simultaneously so that the same spacing distance is maintained between the first and second arms 160, 180 in the direction of the longitudinal axis A-A at all times. As one or both of the arms 160, 180 move in the direction of the longitudinal axis B-B and/or the longitudinal axis B-B, the spacing between the first and second arms 160, 180 in the direction of the longitudinal axis A-A is constant. In one embodiment, the spacing distance between a top surface of the first arm 160 and a bottom surface of the second arm 180 is greater than a thickness of a substrate intended to be loaded onto the first and/or second arms 160, 180 to ensure that the second arm 180 does not contact any substrate loaded on the first arm 160. In one embodiment, the first and second arms 160, 180 may be spaced apart by between 1 mm and 10 mm, although spacing distances greater than 10 mm may be used in other embodiments.

The first arm 160 comprises a first plate 162 having planar top and bottom surfaces that are parallel to one another. The first plate 162 comprises a first end 163 and a second end 164. The first arm 160 may extend from the first end 163 to the second end 164 along a first axis or a first arm axis C-C. The first arm 160 comprises a first end effector 168 located at the first end 163 and a second end effector 169 located at the second end 164. Specifically, the first plate 162 comprises a central portion 165 having a first end and a second end, a first pair of support arms 166 extending from the first end of the first central portion 165, and a second pair of support arms 167 extending from the second end of the central portion 165. The first pair of support arms 166 may be spaced apart from one another and the second pair of support arms 167 may be spaced apart from one another. The first pair of support arms 166 may form the first end effector 168 and the second pair of support arms 167 may form the second end effector 169. In an embodiment, instead of the pairs of arms 166, 167, there may just be a single arm or more than two arms, or the plate may simply extend continuously to the first and second ends 163, 164 so that the end effectors are formed as end portions of the first plate 162. However, having the two arms with the space therebetween may allow the first and second end effectors 168, 169 to interact with another support member to either take a substrate therefrom or place a substrate thereon, without interference.

In the exemplified embodiment, each of the support arms 166, 167 comprises fingers 171 that extend inwardly into the space between the support arms 166, 167 of each pair. Thus, the fingers 171 of the first pair of support arms 166 extend towards one another and the fingers 171 of the second pair of support arms 167 extend towards one another. In the exemplified embodiment, there are pins 170 extending from each of the first and second pairs of arms 166, 167. More specifically, the pins 170 may extend or protrude from the fingers 171. The first and second end effectors 168, 169 are configured to support a substrate or wafer thereon. The substrate or wafer may rest atop of the pins 170 when supported by the first and/or second end effectors 168, 169 of the first arm 160. The first connection portion 161 of the first arm 160 may extend outwardly from an edge of the first plate 162 along the central portion 165.

The second arm 180 is essentially identical to the first arm 160, although it may have slightly different dimensions. However, the general structure of the second arm 180 is the same as the structure of the first arm 160. The second arm 180 comprises a second plate 182 having planar top and bottom surfaces that are parallel to one another. The second plate 182 comprises a first end 183 and a second end 184. The second arm 180 may extend from the first end 183 to the second end 184 along a second axis or a second arm axis D-D. When the first robot apparatus 100 is assembled, the first and second axes C-C, D-D may be coincident axes and they may also be coincident with the longitudinal axis B-B of the elevator assembly 130. However, more specifically the first and second axes C-C, D-D are parallel because the second arm 180 is mounted in an elevated position relative to the first arm 160. Furthermore, the first and second axes C-C, D-D may be parallel to the longitudinal axis B-B because the first and second arms 160, 180 are mounted to the elevator assembly 130 in an elevated position relative to the elevator assembly 130.

The second arm 180 comprises a first end effector 188 located at the first end 183 and a second end effector 189 located at the second end 184. Specifically, the second plate 182 comprises a central portion 185 having a first end and a second end, a first pair of support arms 186 extending from the first end of the first central portion 185, and a second pair of support arms 187 extending from the second end of the central portion 185. The first pair of support arms 186 may be spaced apart from one another and the second pair of support arms 187 may be spaced apart from one another. The first pair of support arms 186 may form the first end effector 188 and the second pair of support arms 187 may form the second end effector 189. In an embodiment, instead of the pairs of arms 186, 187, there may just be a single arm or more than two arms, or the plate may simply extend continuously to the first and second ends 183, 184 so that the end effectors are formed as end portions of the second plate 182. However, having the two arms with the space therebetween may allow the first and second end effectors 188, 189 to interact with another support member to either take a substrate therefrom or place a substrate thereon, without interference.

In the exemplified embodiment, each of the support arms 186, 187 comprises fingers 193 that extend inwardly into the space between the support arms 187, 187 of each pair. Thus, the fingers 193 of the first pair of support arms 186 extend towards one another and the fingers 193 of the second pair of support arms 187 extend towards one another. In the exemplified embodiment, there are pins 194 extending from each of the first and second pairs of arms 186, 187. More specifically, the pins 194 may extend or protrude from the fingers 193. The first and second end effectors 188, 189 are configured to support a substrate or wafer thereon. The substrate or wafer may rest atop of the pins 194 when supported by the first and/or second end effectors 188, 189 of the first arm 180. The first connection portion 181 of the second arm 180 may extend outwardly from an edge of the second plate 182 along the central portion 185.

In the exemplified embodiment, the first and second end effectors 168, 188, 169, 189 of the first and second arms 160, 180 are integral with the plate structures of the first and second arms 160, 180. Thus, the first and second end effectors 168, 188, 169, 189 do not move relative to the rest of the first and second arms 160, 180, but instead the first and second end effectors 168, 188, 169, 189 move along with the plate structures of the first and second arms 160, 180. The first and second end effectors 168, 188, 169, 189 do not rotate or move in any direction that the first and second arms 160, 180 do not move. That is, the first and second end effectors 168, 188, 169, 189 may be configured to move up and down in the direction of the longitudinal axis A-A and side-to-side in the direction of the first and second axes C-C, D-D.

Referring to FIGS. 7A-7D, the movement and/or maneuvering of the first and second arms 160, 180 of the first robot apparatus 100 will be described. As noted above, when the first robot apparatus 100 is assembled, the elevator assembly 130 is mounted to the support member 110, and the first and second arms 160, 180 are mounted to the elevator assembly 130. The elevator assembly 130 (and the first and second arms 160, 180 that are coupled thereto) are configured to move upwardly and downwardly in the direction of the longitudinal axis A-A of the support member 110 when the third drive mechanism is activated. When the first drive mechanism is activated, the first arm 160 is configured to move side-to-side in the direction of the first arm axis C-C (which is coincident with the longitudinal axis B-B of the elevator member 130 and with the second arm axis D-D). When the second drive mechanism is activated, the second arm 180 is configured to move side-to-side in the direction of the second arm axis D-D (which is coincident with the longitudinal axis B-B of the elevator member 130 and with the first arm axis C-C). The components of the first and second drive mechanisms, with the exception of the motors 144, 149, may be hidden within the internal cavity 138 of the elevator assembly 130.

Figure 7A:
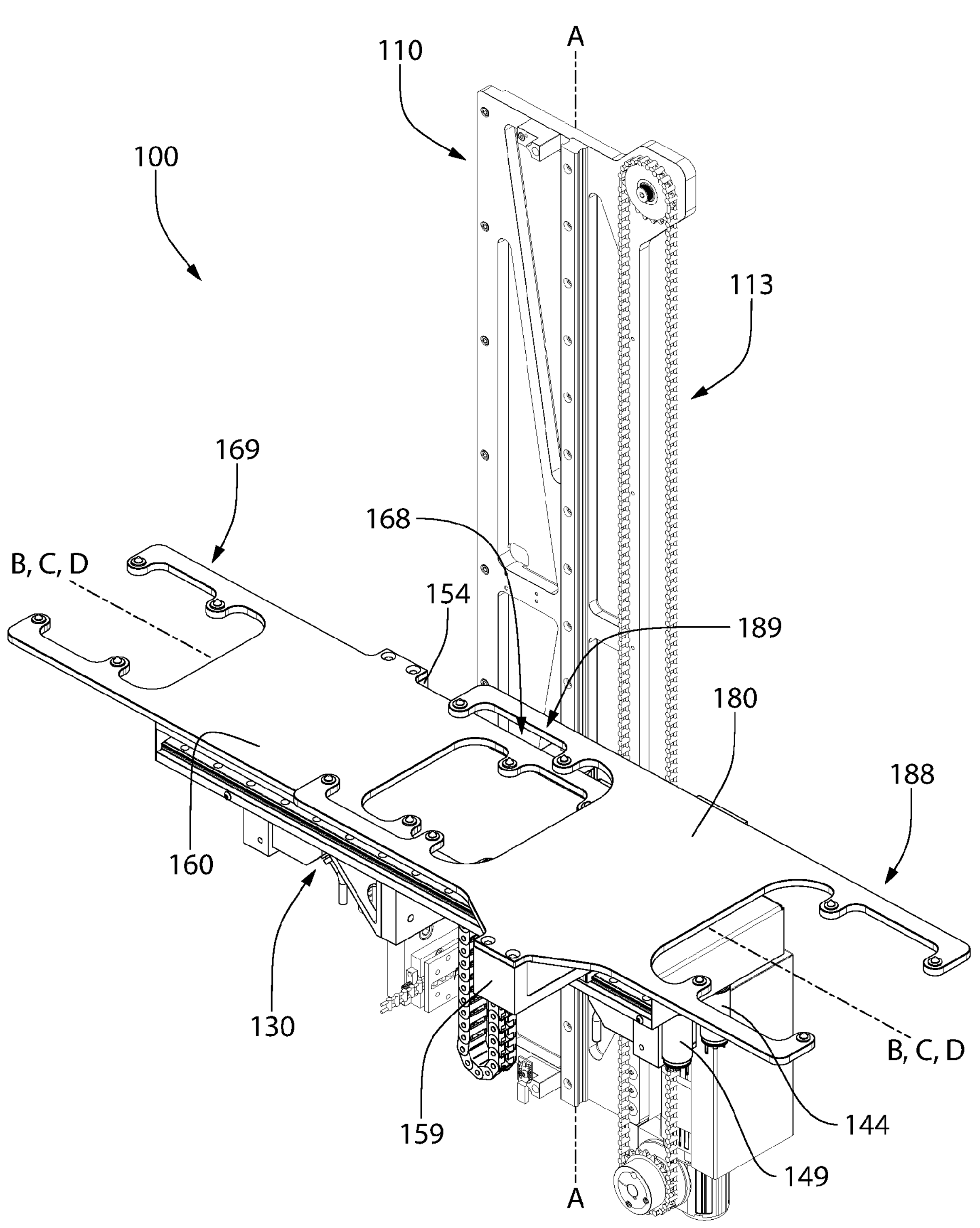
FIGS. 7A-7D are front perspective views of the robot apparatus of FIG. 4 illustrating the first and second arms thereof in different positions.
Figure 7B:
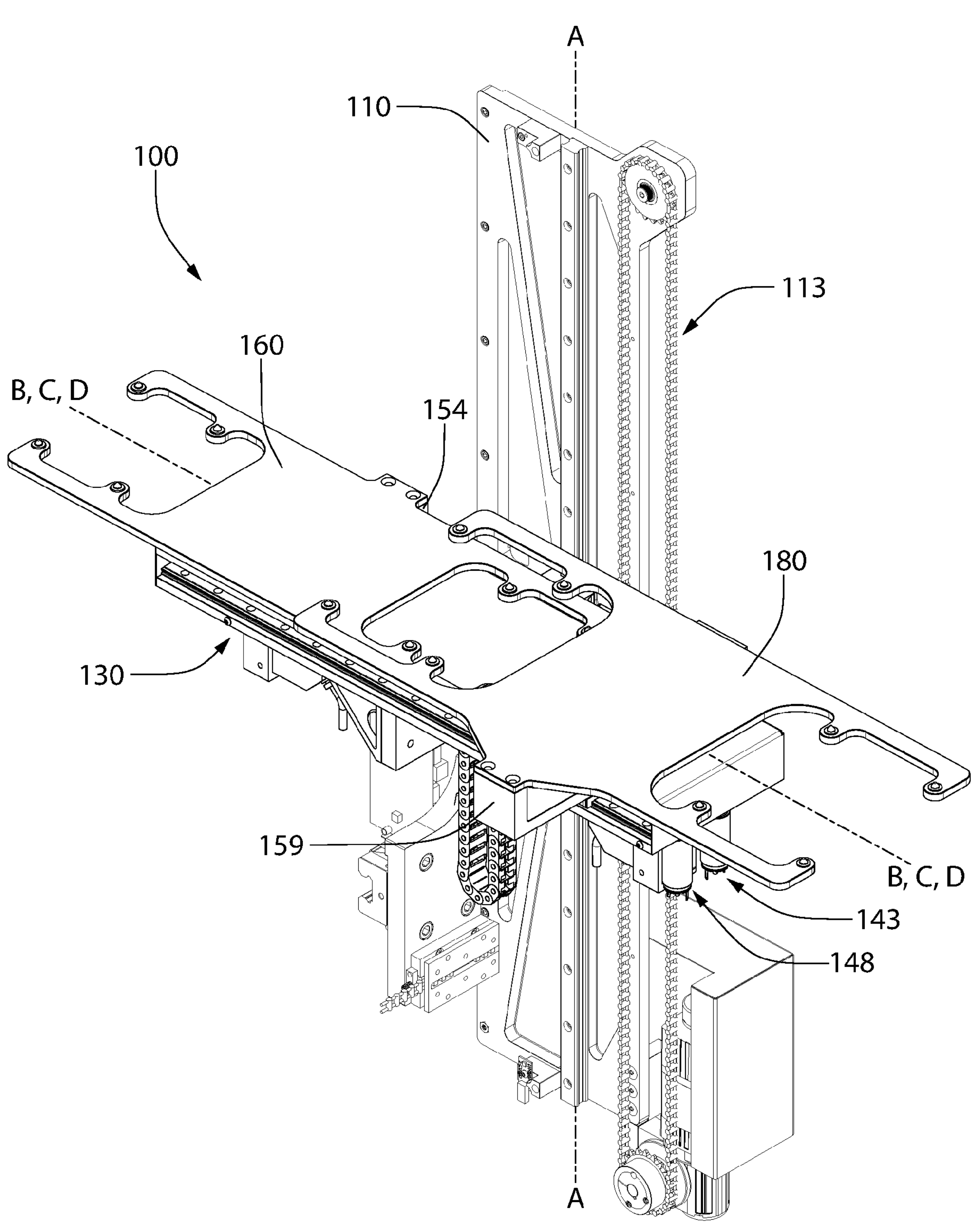

Comparing FIGS. 7A and 7B, the first and second arms 160, 180 and the elevator assembly 130 are located at a different elevation along the support structure 110. Thus, from FIG. 7A to FIG. 7B, the third drive mechanism 113 has been activated to move the elevator assembly 130 and the first and second arms 160, 180 upwardly relative to the support structure 110 in the direction of the longitudinal axis A-A. As noted above, the vertical spacing distance between the first and second arms 160, 180 is fixed because the first and second arms 160, 180 are fixed axially relative to the elevator assembly 130. Thus, the spacing distance between the first and second arms 160, 180 remains constant even as the first and second arms 160, 180 move upwardly/downwardly in the direction of the longitudinal axis A-A.

Figure 7C:
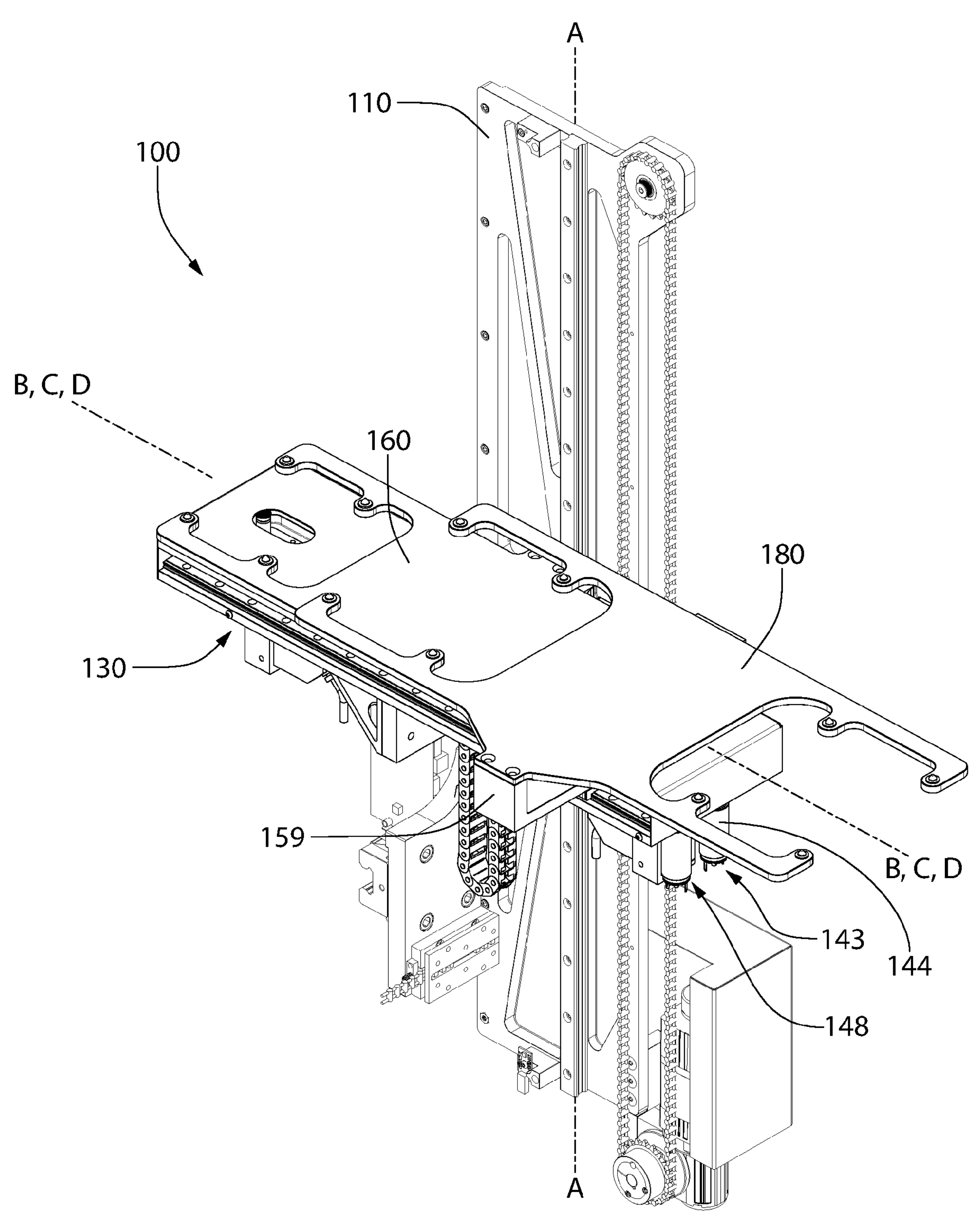

Next, comparing FIGS. 7B and 7C, the first arm 160 has moved in a first direction (to the right on the page) along the first arm axis C-C while the second arm 180 has not moved at all. This is achieved by activating the first drive mechanism 143 which causes the first motor 144 to rotate the chain gear 147 which engages the first track connector 153. Because the first track connector 153 is coupled to the first arm 160 (via the first arm coupler 154), as the first track connector 153 moves along the first track 141, the first arm 160 moves in the direction of the first arm axis C-C. The direction of rotation of the first motor 144 may control the direction of movement of the first arm 160 along the first arm axis C-C. The first arm 160 may move only linearly along the first arm axis C-C and may be devoid of any rotational axis such that the first arm 160 may be incapable of rotation.

Figure 7D:
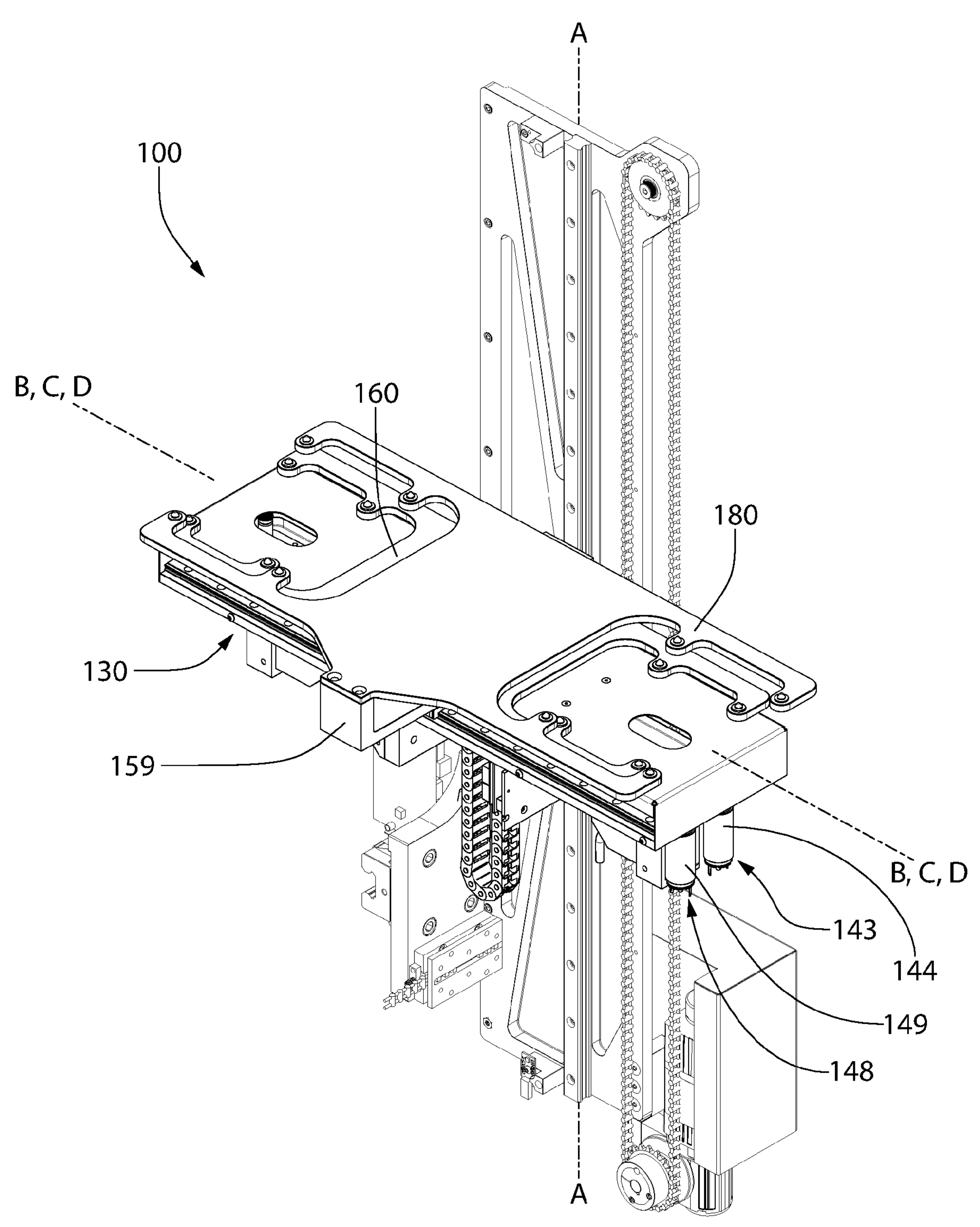

Next, comparing FIGS. 7C and 7D, the second arm 180 has moved in a first direction (to the left on the page) along the second arm axis D-D while the first arm 160 has not moved at all. This is achieved by activating the second drive mechanism 148 which causes the second motor 149 to rotate the chain gear 152 which engages the second track connector 158. Because the second track connector 158 is coupled to the second arm 180 (via the second arm coupler 159), as the second track connector 158 moves along the second track 142, the second arm 180 moves in the direction of the second arm axis D-D. The direction of rotation of the second motor 149 may control the direction of movement of the second arm 180 along the second arm axis D-D. The second arm 180 may move only linearly along the second arm axis D-D and may be devoid of any rotational axis such that the second arm 180 may be incapable of rotation. Thus, the first drive mechanism 113 is configured to move the first and second arms simultaneously along the longitudinal axis A-A, the first drive mechanism 143 is configured to move the first arm 160 along the first arm axis C-C, and the second drive mechanism 148 is configured to move the second arm 180 along the second arm axis D-D. The first and second arm axes C-C, D-D may be perpendicular to the longitudinal axis A-A. While the up/down movement is simultaneous for the first and second arms 160, 180, the movement along the first and second arm axes C-C, D-D is independently achieved for the first and second arms 160, 180. In an embodiment, the movement along the longitudinal axis A-A could also be independent for the first and second arms 160, 180 rather than simultaneous. There may be a control unit, either formed as part of the first robot apparatus 100 or separately, which is operably coupled to each of the first, second, and third drive mechanisms to activate and deactivate the first, second, and third drive mechanisms and control operation of the first robot apparatus 100.

Figures 8A, 8B, 8C:
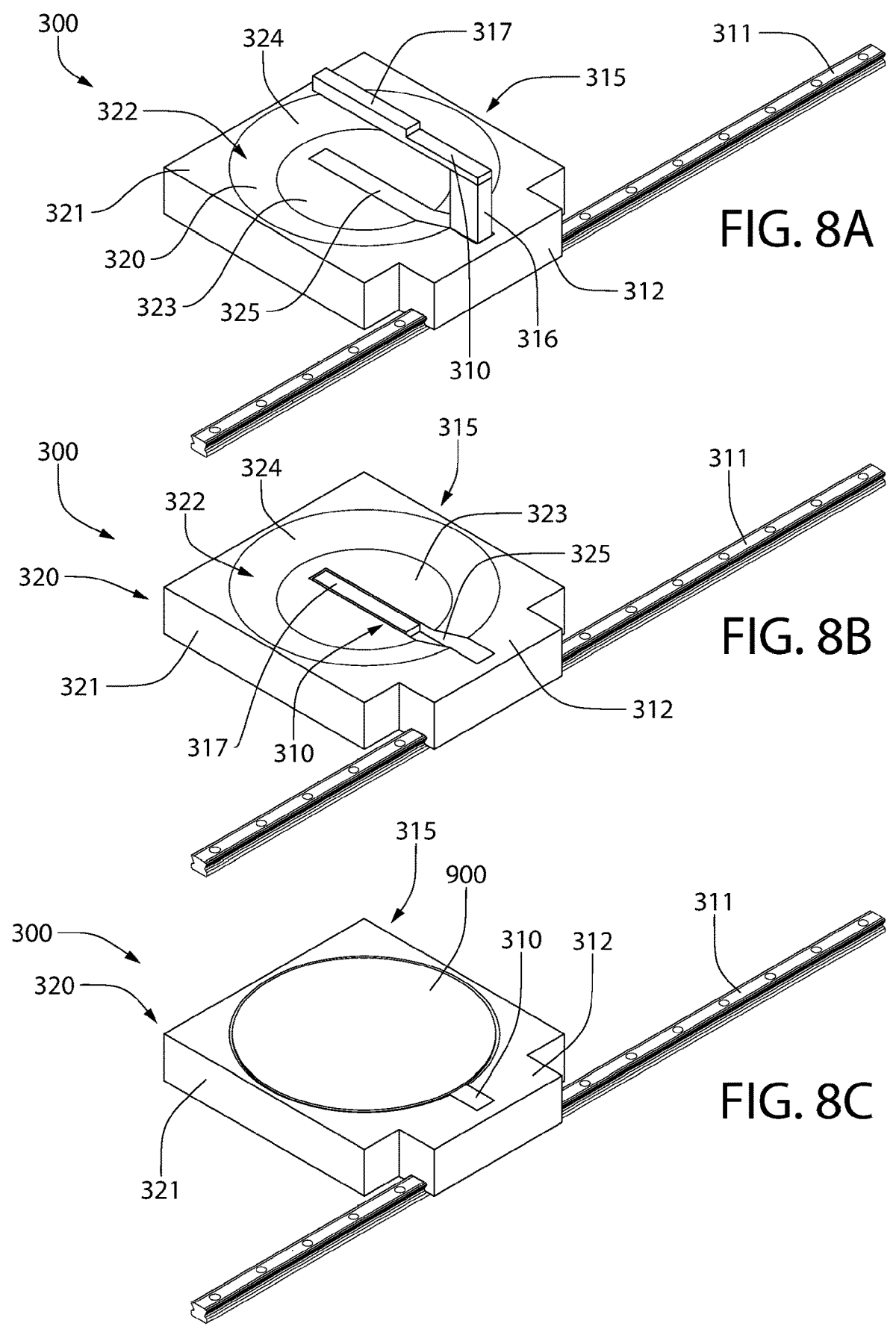

Referring to FIG. 8A, the first transport assembly 300 will be described in accordance with an embodiment of the present invention. The second transport assembly 400 may be identical to the first transport assembly 300 and thus a detailed description of the second transport assembly 400 will not be provided herein separately in the interest of brevity, it being understood that the description of the first transport assembly 300 is applicable to the second transport assembly 300. Furthermore, it is noted that the first and second transport assemblies 300, 400 are illustrated in a simplified format in FIGS. 1 and 2, and it should be appreciated that the structure shown in FIG. 8A-8C or 8D may be used for the first and second transport assemblies 300, 400 as shown in FIGS. 1 and 2.

The first transport assembly 300 generally comprises the first track 311 and a transport apparatus 315 that is configured to ride along the first track 311 between the first and second positions as described above. The transport apparatus 315 may comprise the first support member 310, a first positioning assembly 320, and a track connection portion 312. The first track 311 may comprise an engagement feature, such as a groove or a protuberance, that is configured to mate with an engagement feature, such as a protuberance or a groove, of the track connection portion 312 of the transport apparatus 315. In an embodiment, the track connection portion 312 may not be formed integrally with the transport apparatus 315, but may instead be a separate component to which the transport apparatus 315 is operably coupled. In the exemplified embodiment, the track connection portion 312 is integral with the first positioning assembly 320, but in other embodiments the first positioning assembly 320 may be coupled to the track connection portion 312 but they may be separate parts. A drive mechanism may be included which is configured to move the transport apparatus 315 along the first track 311 from the position shown in FIGS. 8A-8C to the opposite end of the first track 311. The drive mechanism may include a motor, a belt drive, a chain drive, a set of gears, hydraulics, pneumatics, or any other mechanism or set of parts which is capable of causing movement of the transport apparatus 315 along the first track 311.

The first positioning assembly 320 comprises a body 321 having a recess 322 that extends from a floor 323 to an opening in a top end of the body 321. In other embodiments, the floor 323 may be omitted and an opening may extend through to the bottom end of the body 321. That is, in an embodiment, instead of the recess 322, there may be a through-hole extending through the body 321 from the top end to the bottom end. In the exemplified embodiment, the body 321 comprises a conical sidewall 324 that bounds the recess 322. The conical sidewall 324 helps to center a substrate on the first support member 310, as described in more detail below. In the exemplified embodiment, the track connection portion 312 is integral with the first positioning assembly 320, but in other embodiments these may be separate parts with the first positioning assembly 320 coupled to the track connection portion 312 so that the positioning assembly 320 moves along the track along with the track connection portion 312. The first positioning assembly 320 further comprises a slot 325 that extends into the conical sidewall 324 and the floor 323. The slot 325 provides a space for the first support member 310 to nest within when the first support member 310 is moved into a lowered position, such as shown in FIG. 8B.

In the exemplified embodiment, the first support member 310 comprises a vertical post 316 and a support finger 317 that extends generally perpendicularly from the vertical post 316. The support finger 317 is configured to support a substrate thereon. While in the exemplified embodiment there is only one support finger 317 illustrated, in alternative embodiments more than one support finger 317 may be included and positioned on the same plane and in a spaced apart manner to support a substrate. In other embodiments, the support finger 317 may comprise two axially spaced finger members such that a substrate is configured to be supported between the two finger members. Thus, variations are possible within the scope of the invention described herein. Having more than one support finger 317 may be useful to provide stability in the support of the substrate.

The first support member 310 may be alterable between a raised position, as shown in FIG. 8A, and a lowered position, as shown in FIG. 8B. Any type of known drive mechanism may be used to alter the first support member 310 between the raised and lowered positions, such as motor and gears, belt, or chain drive, a pneumatic system, a hydraulic system, or the like. The invention is not to be limited by the manner of moving the first support member 310 between the raised and lowered positions and this may be achieved in many ways as would be understood by persons in the art. When the first support member 310 is in the raised position, the support finger 317 is elevated above the top end of the body 321 of the first positioning assembly 320 so that the first support member 310 may be loaded with a substrate. That is, when the first support member 310 is in the raised position, a substrate may be loaded onto the first support member 310, such as by a robot, and more specifically the transport robot 500 described earlier.

As shown in FIG. 8B, when the first support member 310 is altered into the lowered state, the support finger 317 nests within the slot 325 in the body 321 of the first positioning assembly 320. Furthermore, as shown in FIG. 8C, if the support finger 317 is supporting a substrate and is altered from the raised state to the lowered state, the support finger 317 nests within the slot 325 and the substrate 900 nests within the recess 322 of the body 321 of the first positioning assembly 320. Due to the tapering shape of the conical sidewall 324 of the body 321 of the first positioning assembly 320, the positioning assembly 320 assists in centering the substrate 900 on the support finger 317 as the support finger 317 is altered from the raised position to the lowered position. That is, as the support finger 317 is lowered into the recess 322, the conical sidewall 324 of the body 321 repositions the substrate 900 if needed to center the substrate 900 onto the support finger 317. Thus, even if the initial transfer of the substrate 900 onto the support finger 317 does not result in the substrate 900 being centered perfectly on the support finger 317, the lowering of the support finger 317 into the recess 322 will center the substrate 900 on the support finger 317 so that it is properly positioned for later steps in the substrate processing.

In use, the substrate 900 is loaded onto the support finger 317 while the support finger 317 is in the raised position. If the substrate 900 is going to be transferred from the first transport assembly 300 to the first robot apparatus 100 (which then loads the substrate 900 into one of the process modules of one of the first and third stacks 11, 12), then the support finger 317 may simply remain in the raised position. Alternatively, the support member 310 may be altered to the lowered position to center the substrate 900 thereon, and then immediately be altered back to the raised position to be interacted with by the first robot apparatus 100 as described herein. If the substrate 900 is going to be transferred form the transport assembly 300 to the second robot apparatus 200 (which then loads the substrate 900 onto one of the process modules of one of the second and fourth stacks 21, 22), the support member 310 may be altered to the lowered position and then the transport apparatus 315 may be moved along the track 311 from the first position to the second position. Once the transport apparatus 315 arrives at the second position, the support member 310 may be altered to the raised position and the second robot apparatus 200 may unload the substrate from the support finger 317 and perform further process steps as described herein. By having the support member 310 in the lowered position during movement of the transport apparatus 315 along the track 311, the substrates are maintained centered on their respective support fingers 317 during the movement of the transport apparatus 315 along the track 311.

Figure 9:
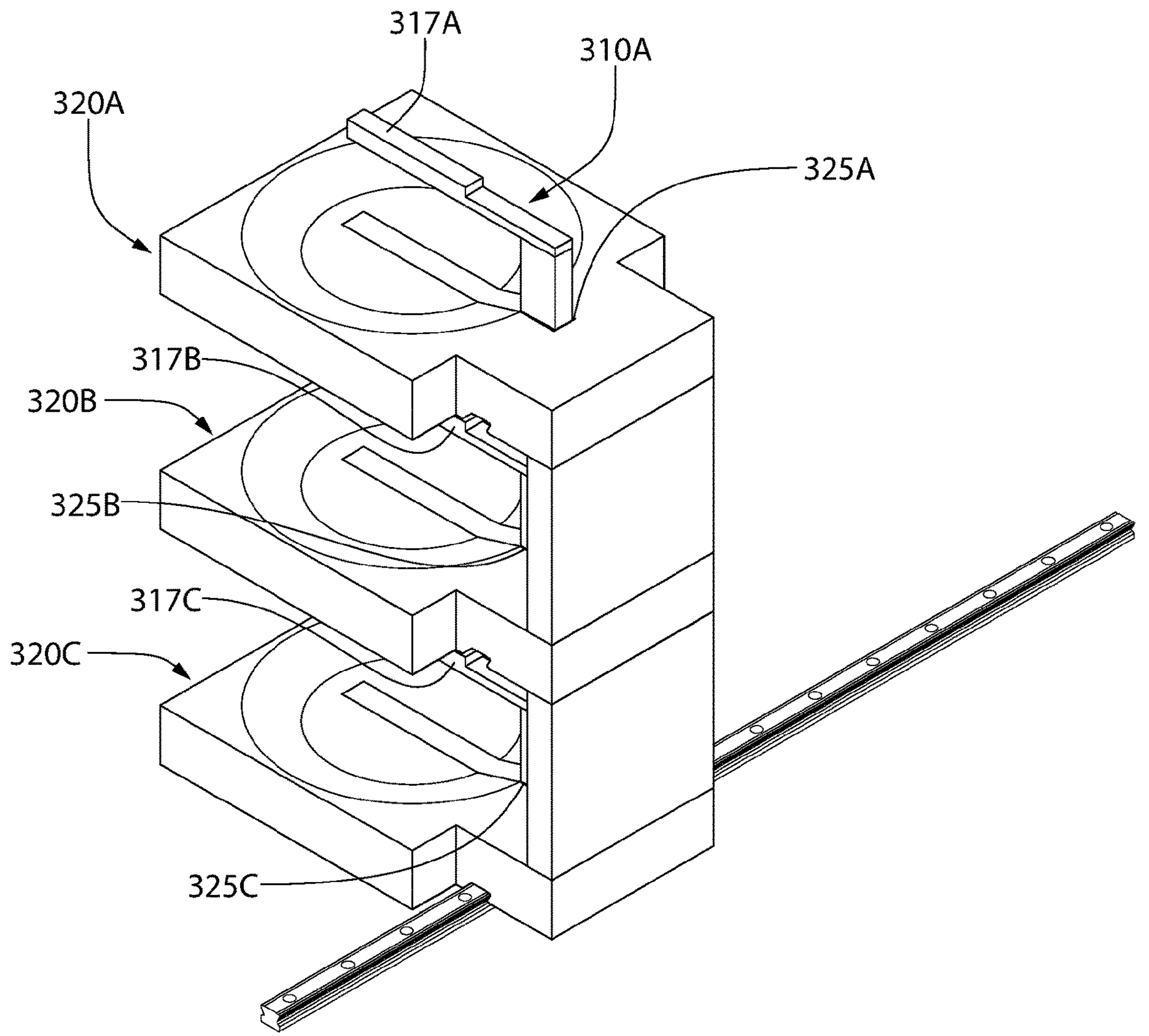
FIG. 9 illustrates an alternative embodiment of a transport assembly of the semiconductor processing system of FIG. 1.

FIG. 9 illustrates an alternative embodiment whereby the parts previously noted are duplicated. In particular, in FIG. 9 the positioning assembly comprises a first positioning assembly 320*a*, a second positioning assembly 320*b*, and a third positioning assembly 320*c*. Each of the first, second, and third positioning assemblies 320*a-c* is identical to the positioning assembly 320 described in FIGS. 8A-8C. The first, second, and third positioning assemblies 320*a-c* are in a stacked arrangement. The first, second, and third positioning assemblies 320*a-c* may be coupled together so that the bottommost positioning assembly 320*c* is coupled to the track and all of the positioning assemblies 320*a-c* move collectively along the track due to their being coupled together. Furthermore, in this embodiment the support member 310*a* comprises a first support finger 317*a*, a second support finger 317*b*, and a third support finger 317*c*. The first, second, and third support fingers 317*a-c* may be coupled together. Alternatively, the first, second, and third support fingers 317*a-c* may be distinct and not attached to one another.

The support member 310*a* may be altered between a raised state (shown in FIG. 9) and a lowered state (not shown). In one embodiment, rather than all of the first, second, and third support fingers 317*a-c* being raised and lowered collectively, the first, second, and third support fingers 317*a-c* may be raised and lowered independently of one another. In the lowered state, the support member 310 and the fingers 317*a-c* thereof extend into and/or through the slots 325*a-c* in the first, second, and third positioning assemblies 320*a-c*. In the exemplified embodiment, there is a single finger used to support each substrate. In alternative embodiments, each of the fingers 317*a-c* may comprise two fingers or support struts or the like to provide stability for the substrate being supported by the fingers.

In this embodiment, a different substrate may be loaded onto each of the first, second, and third fingers 317*a-c* while the first, second, and third fingers 317*a-c* are in the raised position as shown in FIG. 9. The first, second, and third fingers 317*a-c* may then be altered into the lowered state. When being altered into the lower state, the substrate on the third finger 317*c* passes through the first and second positioning assemblies 320*a*, 320*b* and nests within the recess of the third positioning assembly 320*c*. Similarly, the substrate on the second finger 317*b* passes through the first positioning assembly 320*a* and nests within the recess of the second positioning assembly 320*b*. The substrate on the first finger 317*a* passes into and nests within the recess of the first positioning assembly 320*a*. Once again, the conical sidewalls of the positioning assemblies 320*a-c* help to center the substrates on the fingers 317*a*-*c* so that when the fingers 317*a*-*c* are later altered into the raised position the substrates are centered thereon.

As noted herein, in some embodiments there may be two, or three, or four blocks of the stacks of process modules, with each block including a stack on the first side of the aisle and a stack on the second side of the aisle. Thus, by forming the support member 310 with multiple fingers each capable of supporting a substrate, the transport apparatus 315 can move along the track 311 to multiple different positions, with one position for each block. So, the transport apparatus 315 can be in a first position that is aligned with a first block where a first one of the substrates is unloaded from the first finger 317*a* and loaded onto a first robot apparatus which then loads that substrate into one of the process modules of the first block. Then, the transport apparatus 315 may be moved to a second position that is aligned with a second block where a second one of the substrates is unloaded from the second finger 317*b* and loaded onto a second robot apparatus which then loads the second substrate into one of the process modules of the second block. Then, the transport apparatus 315 may be moved to a third position that is aligned with a third block where a third one of the substrates is unloaded from the third finger 317*c* and loaded onto a third robot apparatus which then loads the third substrate into one of the process modules of the third block. And this may continue for as many blocks that there are in the system and as many fingers as are included in the support member.

Figure 10A:
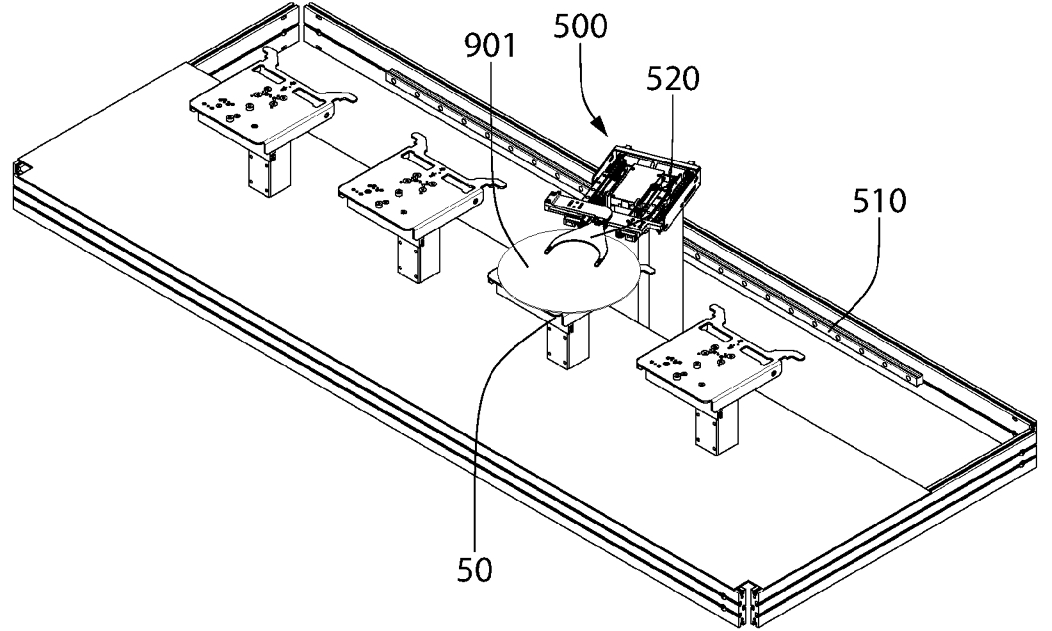
FIGS. 10A-10G illustrate operation of the semiconductor processing system of FIG. 1 and specifically operation of the robot apparatus to move substrates through the system.

Referring sequentially to FIGS. 10A-10G, the operation of the semiconductor processing system 1000 will be described. As shown in FIG. 10A, the first step is for the transport robot 500 to maneuver over to a selected one of the storage apparatuses or cassettes 50 and to load one of the substrates 901 onto the end effector 520. As noted above, the transport robot 500 is able to move linearly along the track 510 and is also capable of rotation along one or more rotational axis to facilitate the loading of the substrate 901. In other embodiments, the transport robot 500 may perform only linear movements and no rotational movements as with the first and second robot apparatuses 100, 200 described above.

Figure 10B:
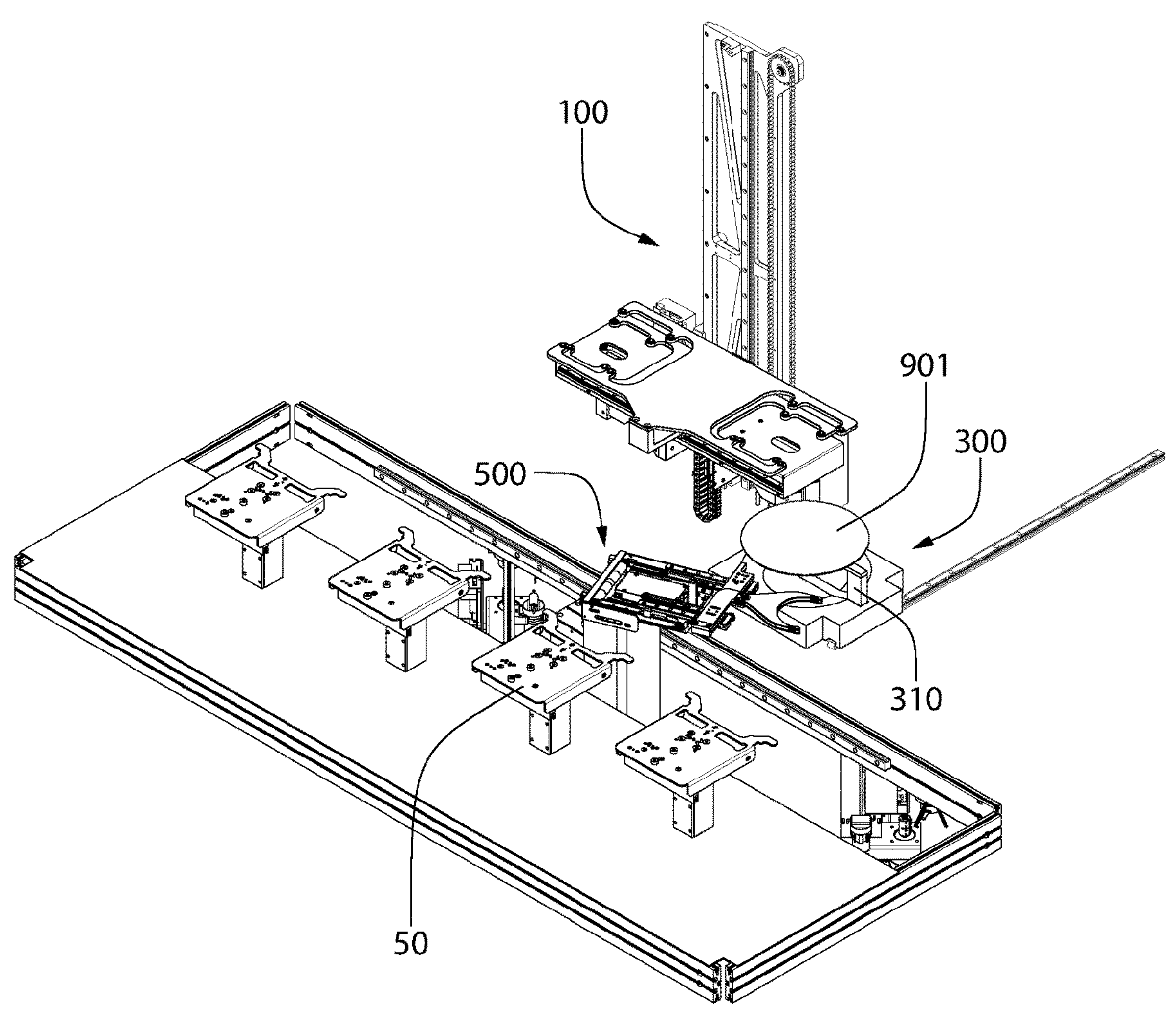

Next, referring to FIG. 10B, the transport robot 500 moves or maneuvers into a position whereby the transport robot 500 is able to transfer the substrate 901 onto one of the first and second transport assemblies 300, 400. In the exemplified embodiment, the transport robot 500 transfers the substrate 901 onto the first transport assembly 300, but the transport robot 500 could just as easily transfer the substrate 901 onto the second transport assembly 400. This is dictated by whether the substrate 901 is to be later loaded into one of the process modules of one of the first and second stacks of process modules 11, 21 (in which case the substrate 901 is transferred onto the first transport assembly 300) or onto one of the process modules of one of the third and fourth process modules 12, 22 (in which case the substrate is transferred onto the second transport assembly 400). In this embodiment, the substrate 901 is transferred from the transport robot 500 onto the first transport assembly 300, and more specifically the substrate 901 is loaded onto the first support member 310 of the first transport assembly 300. It should be noted that at this stage in the process, the first support member 310 is in the raised position, which is shown in FIG. 10B. The first support member 310 may be altered to the lowered position and then back to the raised position to center the substrate 901 on the first support member 310, although this may not be required in all embodiments.

Figure 10C:
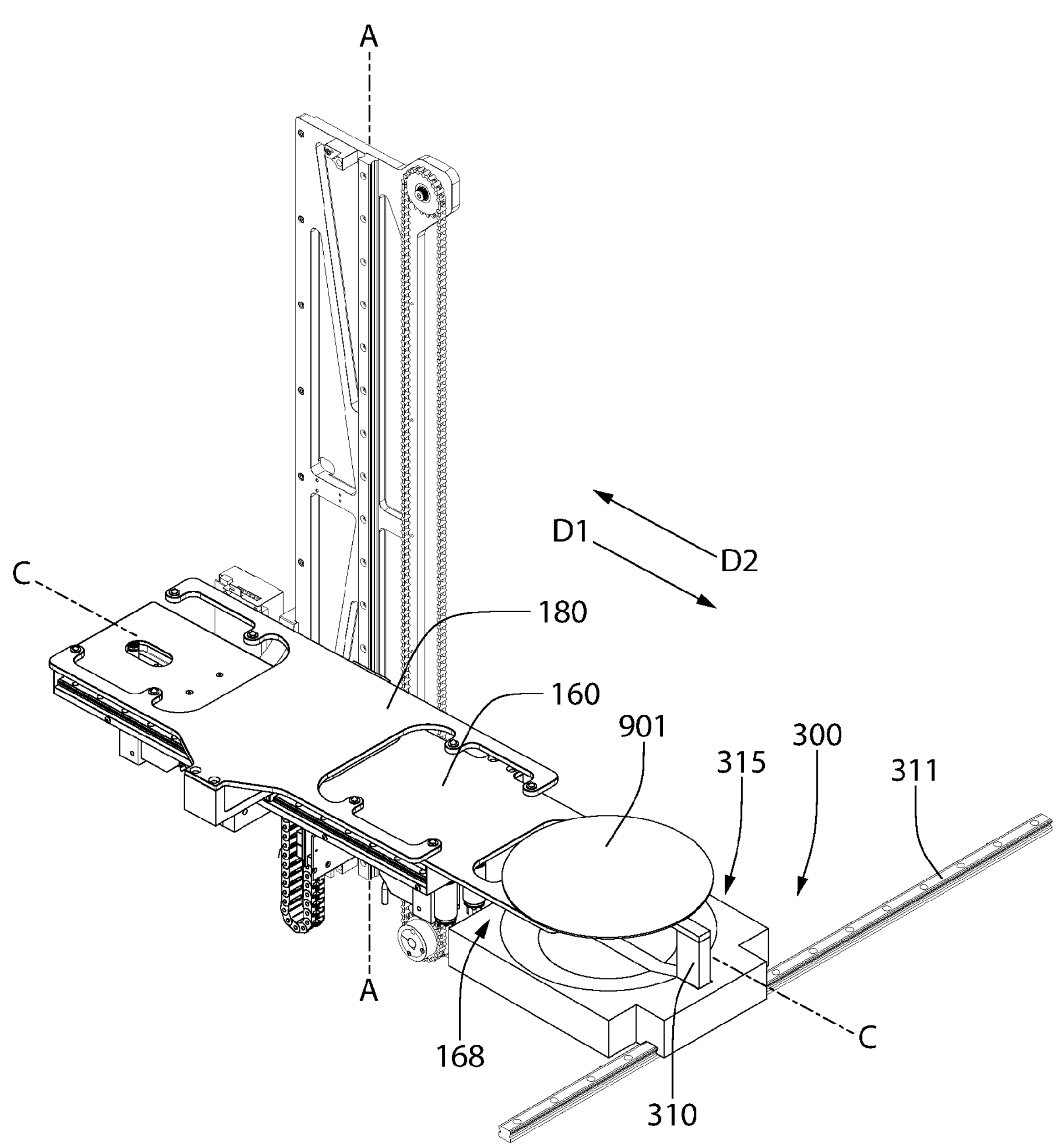

Next, referring to FIG. 10C, the first arm 160 of the first robot apparatus 100 is maneuvered so that the substrate 901 may be transferred from the first support member 310 on the first transport assembly 300 onto the first arm 160 of the first robot apparatus 100. Such maneuvering of the first arm 160 of the first robot apparatus 100 may include: (1) moving the first arm 160 downwardly along the axis A-A until the first arm 160 is positioned below the bottom surface of the substrate 901; (2) moving the first arm 160 in a first direction D1 along the first arm axis C-C until the first end effector 168 of the first arm 160 is positioned below the substrate 901 and in aligned with the first substrate 901; and (3) moving the first arm 160 upwardly along the axis A-A until the first arm 160 fully supports the substrate 901 and the first support member 310 of the first transport assembly 300 no longer supports the substrate 901. At this point, the substrate 901 is loaded on the first end effector 168 of the first arm 160.

While not shown, in a following step the first arm 160 may be moved in a second direction D2 along the first arm axis C-C which is opposite the first direction D1 to retract the first arm 160 and move the first arm 160 away from the transport assembly 300. This may be necessary to ensure that the first arm 160 is clear from the first stack of process modules 11 when the first arm 160 begins its movements towards unloading and loading one of the process modules 11. However, if the first transport assembly 300 is not aligned with the first stack of process modules 11, this additional retraction of the first arm 160 in the second direction D2 may not be needed. The term maneuver may include movement in a first linear direction (i.e., a first horizontal direction) followed by movement in a second linear direction that is perpendicular to the first linear direction (i.e., a first vertical direction). The term maneuver may also include movement in a third linear direction (i.e., a second horizontal direction) following the movement in the first linear direction. That is, the arms may be maneuvered so as to be extended linearly to be underneath one of the substrates, hoisted vertically to load the substrate onto the arm, and then retracted linearly to move the arm away from the process module. Of course, the exact movements required in each maneuvering step associated with the arms may change depending on the specific circumstances and the specific loading and unloading sequence being performed. In an embodiment, the term maneuver may include multiple linear directional movements but no rotational movements.

Figure 10D:
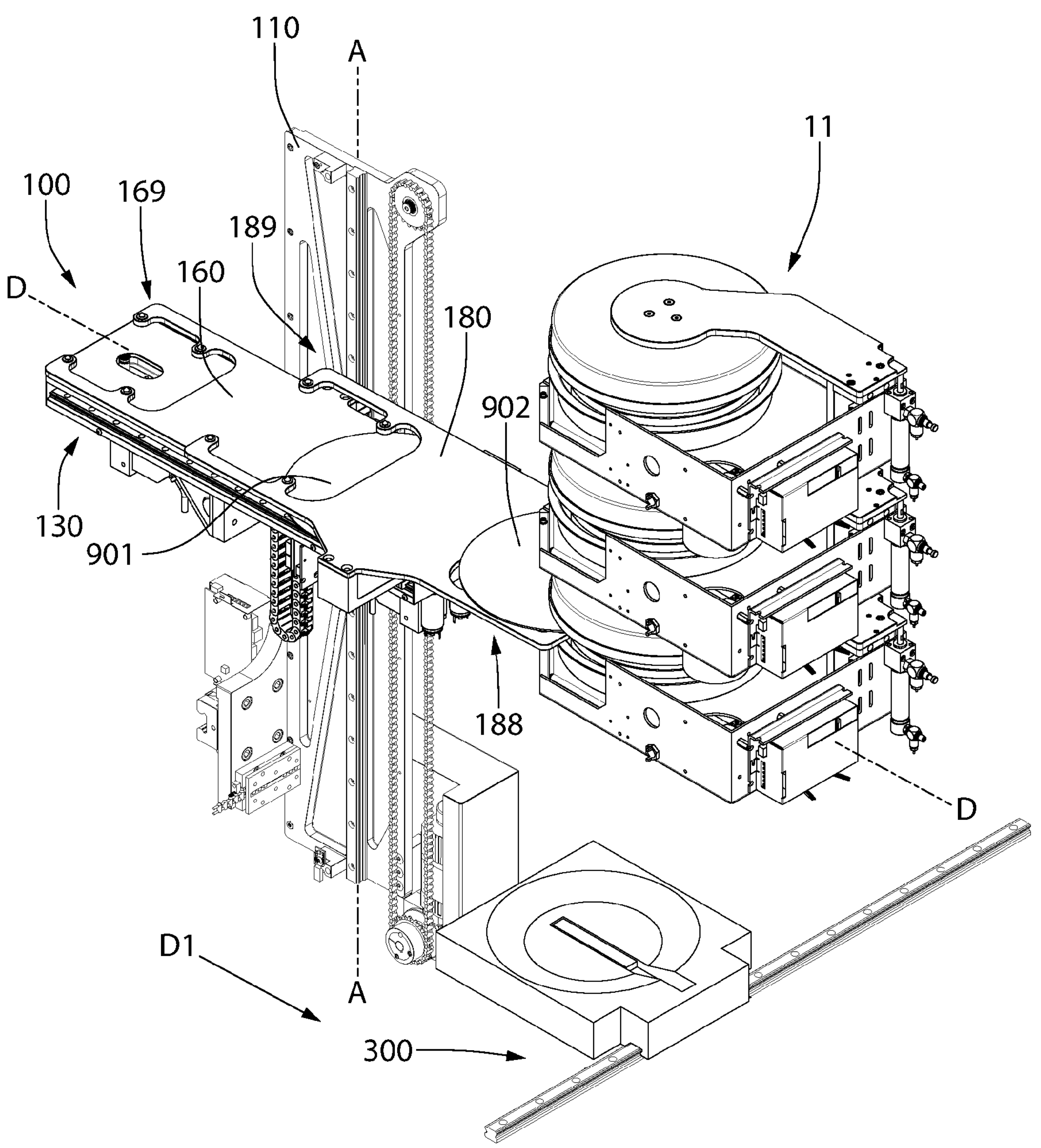

Referring to FIG. 10D, once the substrate 901 is loaded onto the first end effector 168 of the first arm 160, the first and second arms 160, 180 are moved upwardly in the direction of the longitudinal axis A-A towards a selected one of the process modules of the first stack of process modules 11. As noted above, the first arm 160 may be retracted or moved in the second direction D2 before being moved upwardly. As also noted above, the first and second arms 160, 180 move in the direction of the longitudinal direction A-A simultaneously because both are connected to the elevator assembly 130. While the exemplified embodiment shows the bottommost process module as the selected one, any of the process modules of the first stack 11 could be used depending on which is ready to have a substrate unloaded and a new substrate loaded. The first and second arms 160, 180 are moved upwardly until the second arm 180 is positioned just below a location of a second substrate 902 which is already positioned within the selected process module.

In some embodiments, the first substrate 901 which is loaded onto the transport assembly 300 and then onto the first arm 160 of the robot apparatus 100 may be referred to herein as a pre-processed substrate and the second substrate 902 which is unloaded from the selected one of the process modules may be referred to herein as a post-processed substrate. The term pre-processed substrate does not necessarily mean that the substrate has not had any prior processing. Rather, the term pre-processed simply means that this substrate is intended to be loaded into a process chamber for initial or further processing. Furthermore, the term post-processed substrate does not mean that the substrate has finished all processing, but simply means that the substrate is being unloaded from one of the process chambers because a step in the processing has been completed in that process chamber. So, the terms pre-processed and post-processed refer to the substrate swapping, such that the post-processed substrate is the substrate being removed from a selected process chamber and the pre-processed substrate is the substrate being inserted into the selected process chamber after the post-processed substrate is removed/unloaded therefrom.

Still referring to FIG. 10D, once the second arm 180 is positioned axially below the position of the second substrate 902, the second arm 180 is moved in the first direction D1 along the second arm axis D-D into the selected process chamber until the first end effector 188 of the second arm 180 is immediately below the second substrate 902. Next, the second arm 180 is moved upwardly in the direction of the longitudinal axis A-A to load the second substrate 902 onto the first end effector 188 of the second arm 180 and unload the second substrate 902 from the support member of the selected process chamber. Of course, the first and second arms 160, 180 both move upwardly or downwardly any time it is mentioned that one of the first and second arms 160, 180 moves upwardly sine they are coupled to the elevator assembly 130 and therefore move in the direction of the longitudinal axis A-A together.

Figure 10E:
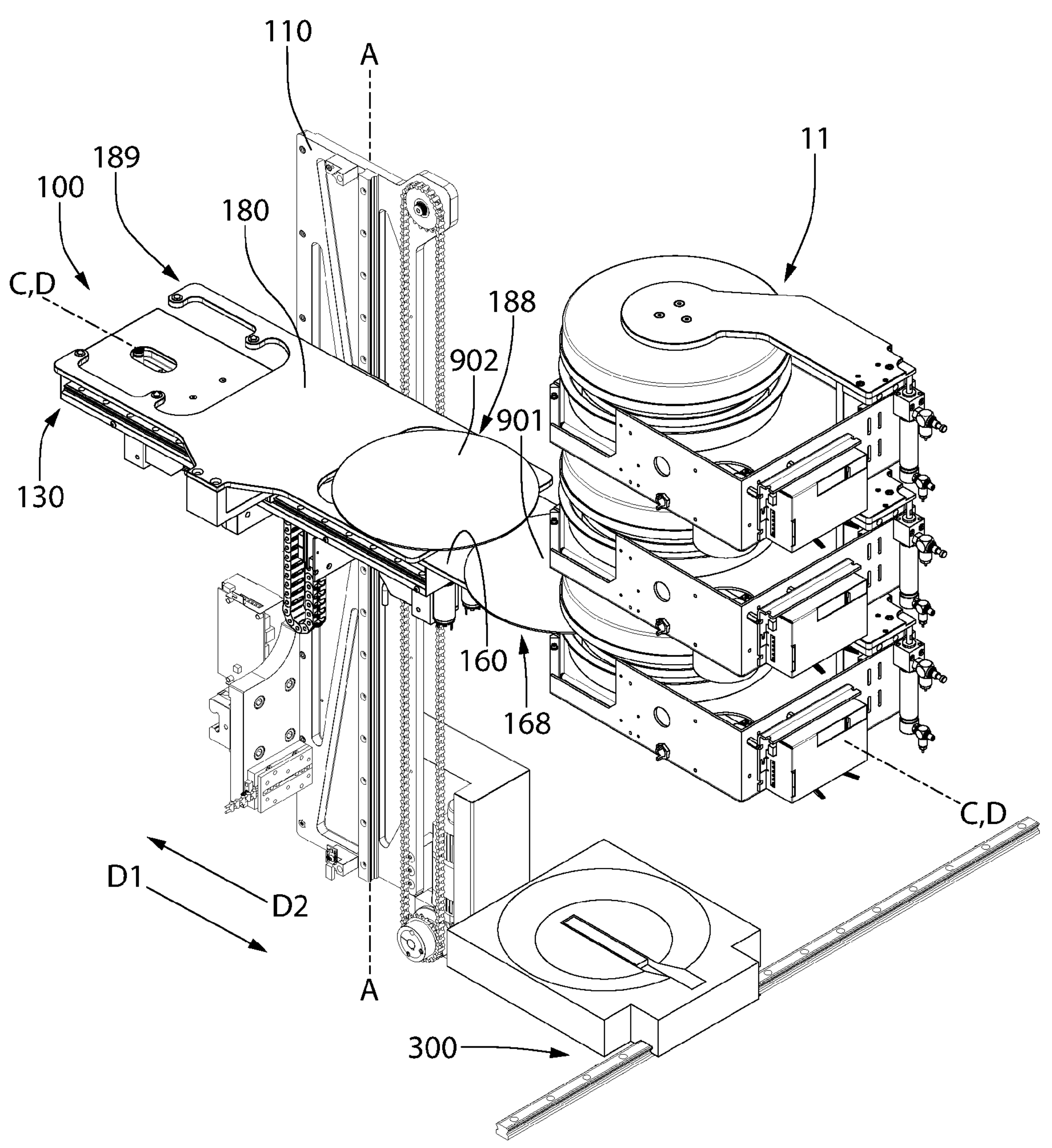

Referring to FIG. 10E, the next step involves moving the second arm 180 in the second direction D2 along the second arm axis D-D away from the stack of process chambers 11. Afterwards, or at the same time, the first arm 160 is moved in the first direction D1 along the first arm axis C-C towards the stack of process chambers 11. The first substrate 901 is still positioned on the first end effector 168 of the first arm 160 at this point. The first arm 160 moves in the first direction D1 until the first end effector 168 and the first substrate 901 are located within the selected process chamber. The first arm 160 may then be moved slightly downwardly to unload the first substrate 901 from the first end effector 168 of the first arm 160 and load the first substrate 901 onto a support structure of the selected process chamber (such as a chuck or the like). Next, the first arm 160 may be retracted by moving the first arm 160 in the second direction D2 away from the stack of process modules 11.

In the exemplified embodiment, the second arm 180 is used to unload the second substrate 902 from the selected process module and the first arm 160 is used to load the first substrate 901 into the selected process module. In other embodiments the opposite may be true and the first arm 160 may unload the second substrate 902 from the selected process module and the second arm 180 may load the new substrate into the selected process module. Moreover, while the steps of FIGS. 10A-10E are described whereby the first end effectors 168, 188 of the first and second arms 160, 180 of the first robot apparatus 100 are used for the loading and unloading procedures, in other embodiments the second end effectors 169, 189 may be used. In particular, the second end effectors 169, 189 would be used to load a substrate from the second transport assembly 400 onto the first robot apparatus 100, then unload a substrate from a selected one of the process modules of the third stack of process modules 12, and then load the substrate from the first robot apparatus into the selected process module of the third stack of process modules 12.

Figure 10F:
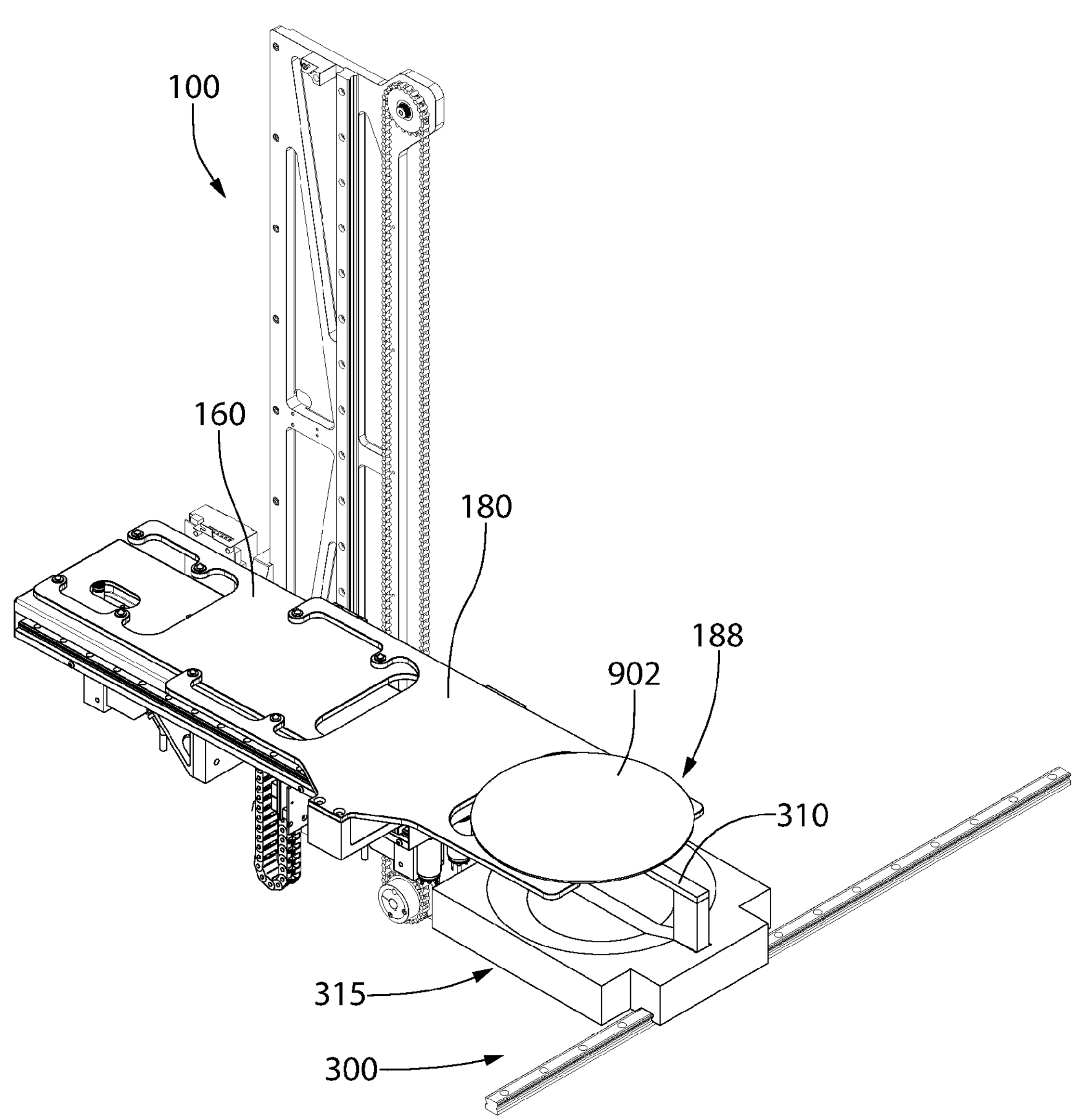
Figure 10G:
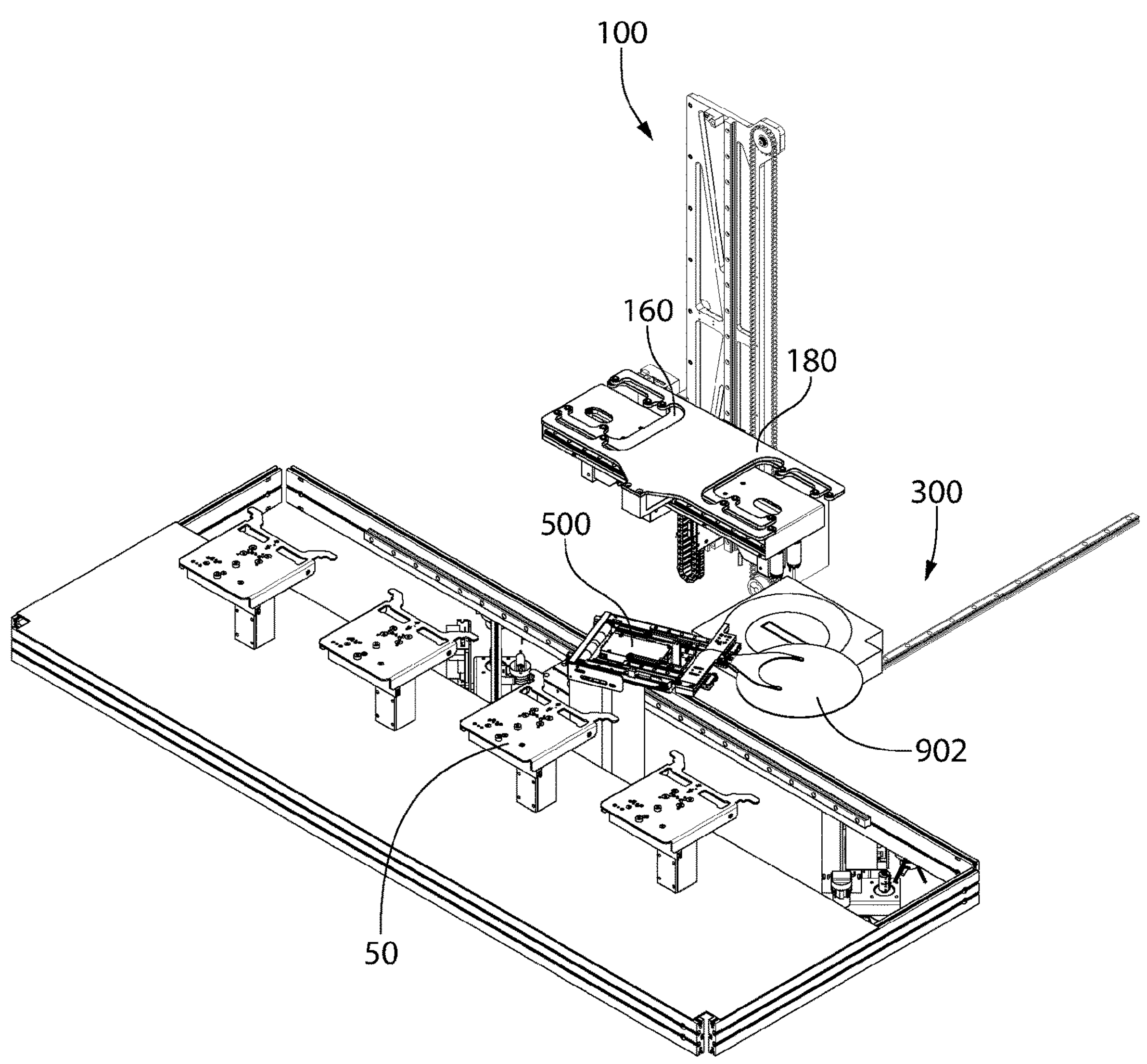

Next, referring to FIG. 10F, the first robot apparatus 100 may be maneuvered so as to unload the second substrate 902 from the first end effector 188 of the second arm 180 and load the second substrate 902 onto the support member 310 of the transport assembly 300. Finally, referring to FIG. 10G, the transport robot 500 may be used to unload the second substrate 902 from the support member 310 of the transport assembly 300 and load the second substrate 902 into one of the storage apparatuses 50.

Thus, as noted above, the first and second robot apparatuses 100, 200 are able to load and unload substrates from the process modules without any rotational axis. Rather, the end effector 168, 169, 188, 189 are on a common axis which can extend in either direction permitting the robot apparatuses 100, 200 without a rotation axis to address process modules on both sides. Furthermore, because there is no rotational axis, the vertical distance that the robot apparatus 100, 200 is able to travel in the direction of the longitudinal axis A-A is limited only by the mechanical stiffness of the support system, virtually not at all. For access to an array of stacked process modules, conventional robots would need to have a total of at least 4×axes, 2 rotational (theta axes) 2 Y axes (side to side) and two Z axes (up and down). The first and second robot apparatuses 100, 200 achieve the same goal with only a total of four axes, 2×, one Z and one Y. As there are four end effectors (two for each arm 160, 180), each move is accomplished by a move followed by a swap, an earlier move having loaded the free end effector, while in the conventional robot system a swap, move, swap is imperative, adding to the complexity.

Figure 11A:
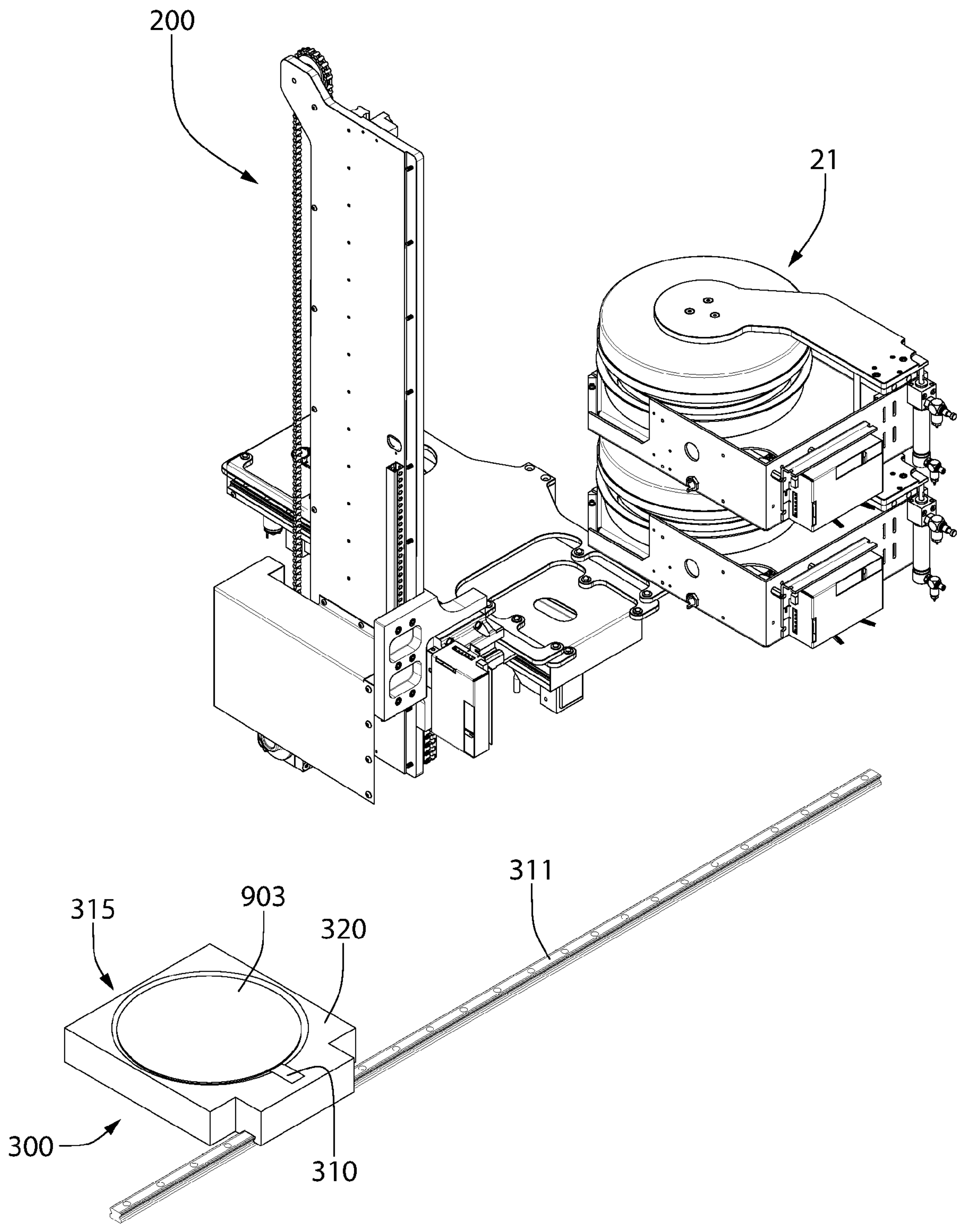
FIGS. 11A-11C illustrate operation of the semiconductor processing system of FIG. 1 and specifically operation of the transport assembly of FIGS. 8A-8C to move substrates through the system.
Figure 11B:
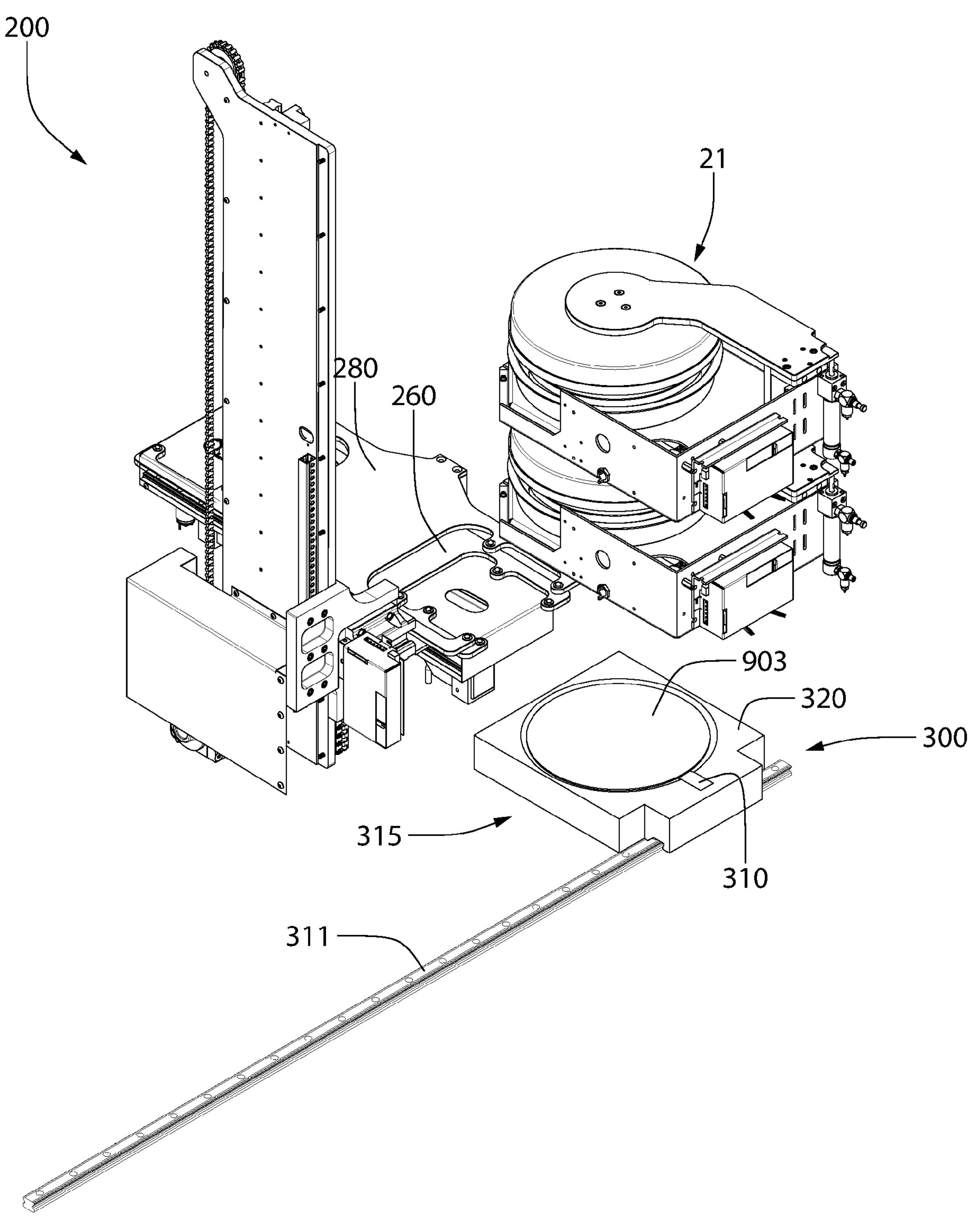
Figure 11C:
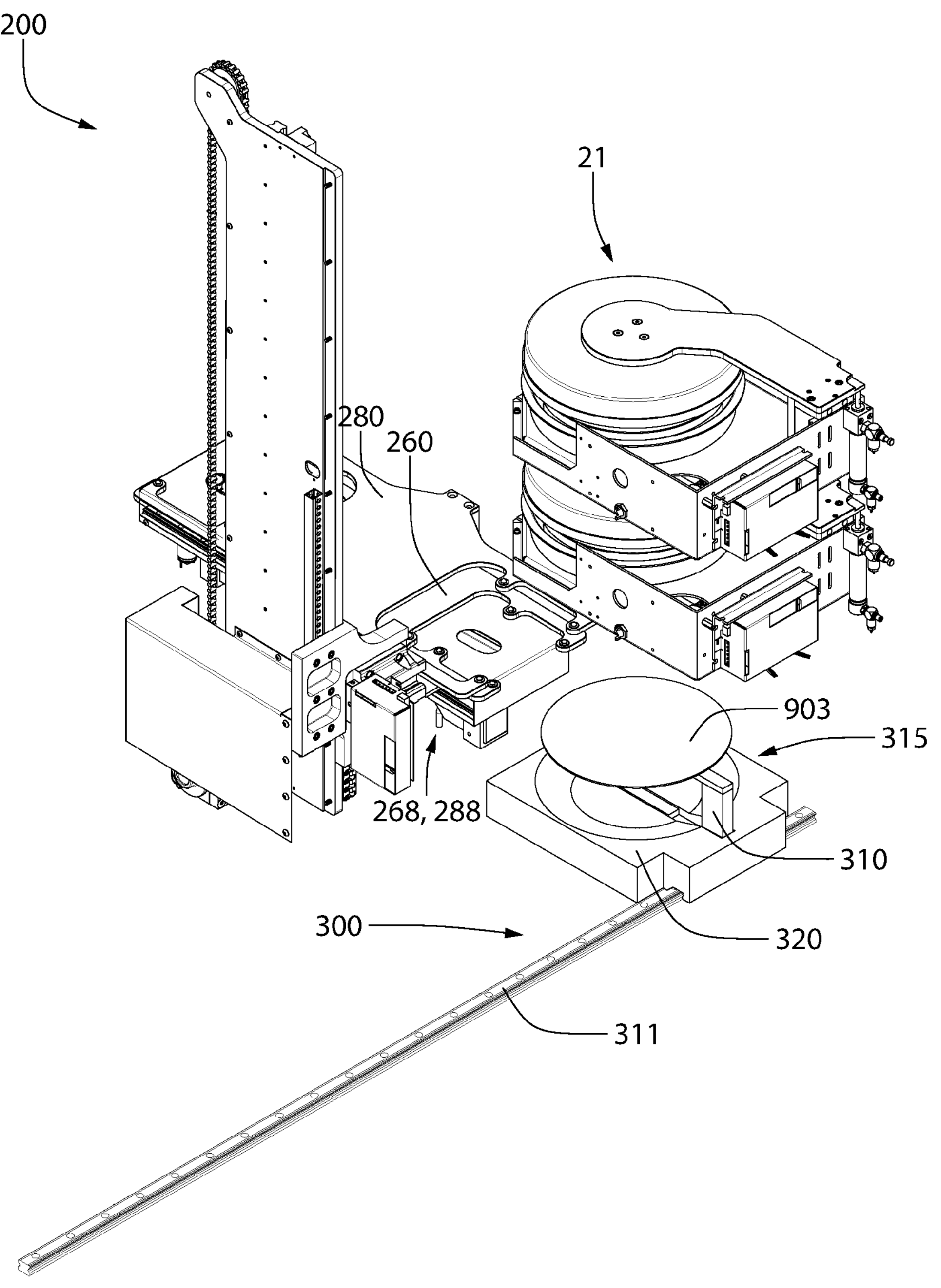

FIGS. 11A-11C illustrate how the transport apparatus 315 of the transport assembly 300 may move from the first position (aligned with the first block 10) to the second position (aligned with the second block 20) so that a substrate loaded on the transport apparatus 315 may be transferred into one of the process modules of the second stack of process modules 21. The same techniques and processes may be used with the second transport assembly 400 in order to transfer a substrate from the transport apparatus of the second transport assembly 400 into one of the process modules of the fourth stack of process modules 22. In FIG. 11A, a substrate 903 is loaded on the transport apparatus 315 of the first transport assembly 300 as described above. Furthermore, the second robot apparatus 200 and the second stack of process modules 21 are shown in FIG. 11A.

Referring to FIG. 11B, the transport apparatus 315 of the transport assembly 300 moves along the track 311 from the first position (position shown in FIG. 11A) to the second position (position shown in FIG. 11B). In the first position, the transport apparatus 315 may be aligned with the first and second arms 160, 180 of the first robot apparatus 100 as described above. In the second position, the transport apparatus 315 may be aligned with a first arm 260 and a second arm 280 of the second robot apparatus 200. As noted above, the second robot apparatus 200 is identical to the first robot apparatus 100 and thus the details thereof are not provided, it being understood that the components, function, and operation of the second robot apparatus 200 are the same as the components, function, and operation of the first robot apparatus 100 as described herein. As the transport apparatus 315 moves from the first position to the second position, the first support member 310 of the transport apparatus 315 is in the lowered position. As such, the first positioning assembly 320 maintains the substrate 903 centered on the support member 310 during the movement of the transport apparatus 315 from the first position to the second position.

FIG. 11C illustrates the transport apparatus 315 in the second position just like FIG. 11B, but further illustrates the support member 320 of the transport apparatus 315 having being altered from the lowered position to the raised position. Once in the raised position, the substrate 903 is elevated above the positioning assembly 320 in preparation for interaction with the second robot apparatus 200. In particular, the second robot apparatus 200 may then be activated to unload the substrate 903 from the support member 310 and load the substrate 903 onto either the first end effector 268 of the first arm 260 or the first end effector 288 of the second arm 280. The steps of loading the substrate 903 onto the second robot apparatus 200 and then using the second robot apparatus 200 to unload a substrate from a selected one of the process chambers of the second stack 21 and then load the substrate 903 into the selected one of the process chambers is the same as the operation described above with reference to the first robot apparatus 100 and will not be repeated herein in the interest of brevity. However, it should be noted that the second robot apparatus 200 operates by moving the first and second arms 260, 280 linearly in a side-to-side manner and/or an up/down manner as needed to load and unload the substrates. The second robot apparatus 200, like the first robot apparatus 100, may have no rotational axis.

In an embodiment, the first and second transport assemblies 300, 400 may be replaced by storage apparatuses such as cassettes. Thus, for each position that the transport assemblies 300, 400 are described herein as being capable of being located, there may instead be a cassette with a plurality of slots each configured to hold a substrate. Thus, there may be separate/distinct cassettes located in alignment with each of the first, second, third, and fourth stacks 11, 12, 21, 22. The cassettes may be rotatable approximately 180° about a rotational axis that extends vertically from a bottom end to a top end of the cassette or cassette assembly. Thus, the cassettes may be capable of being in a first position whereby the slots of the cassettes face an operator who can either take/remove substrates form the cassettes or can remove the entire cassette and replace it with another cassette. The cassettes may also be capable of being in a second position whereby the slots of the cassettes face the first robot apparatus 100 or the second robot apparatus 200 so that the first and/or second robot apparatuses 100, 200 may remove substrate from or place substrates into the slots of the cassettes. The first and second positions may be 180° apart from one another, although this exact rotational distance between the first and second positions it not to be limiting of the present invention. In any case, the cassettes may be rotatable between the two positions noted above in some embodiments. In other embodiments, the cassettes may not be rotatable and may instead be in a fixed position with the slots facing the robot apparatus which is intended to address and/or interact with it to add and/or remove substrates therefrom in accordance with the disclosure set forth herein.

Thus, this embodiment may eliminate the need for the transport assemblies 300, 400, instead replacing them with cassettes containing multiple storage chambers for holding the substrates before and after they are placed into the process modules as described herein. This eliminates the need for a track and other components to move the transport assemblies 300, 400 (including a drive mechanism and the expenses that come with that), and instead uses cassettes that may rotate but do not move from alignment with one stack to alignment with another stack. Instead, the cassettes are in a fixed position (other than possible rotational movement as described above) in axial alignment with one of the stacks and remain in a position whereby the substrates can be placed into and removed from the cassettes.

Figure 12:
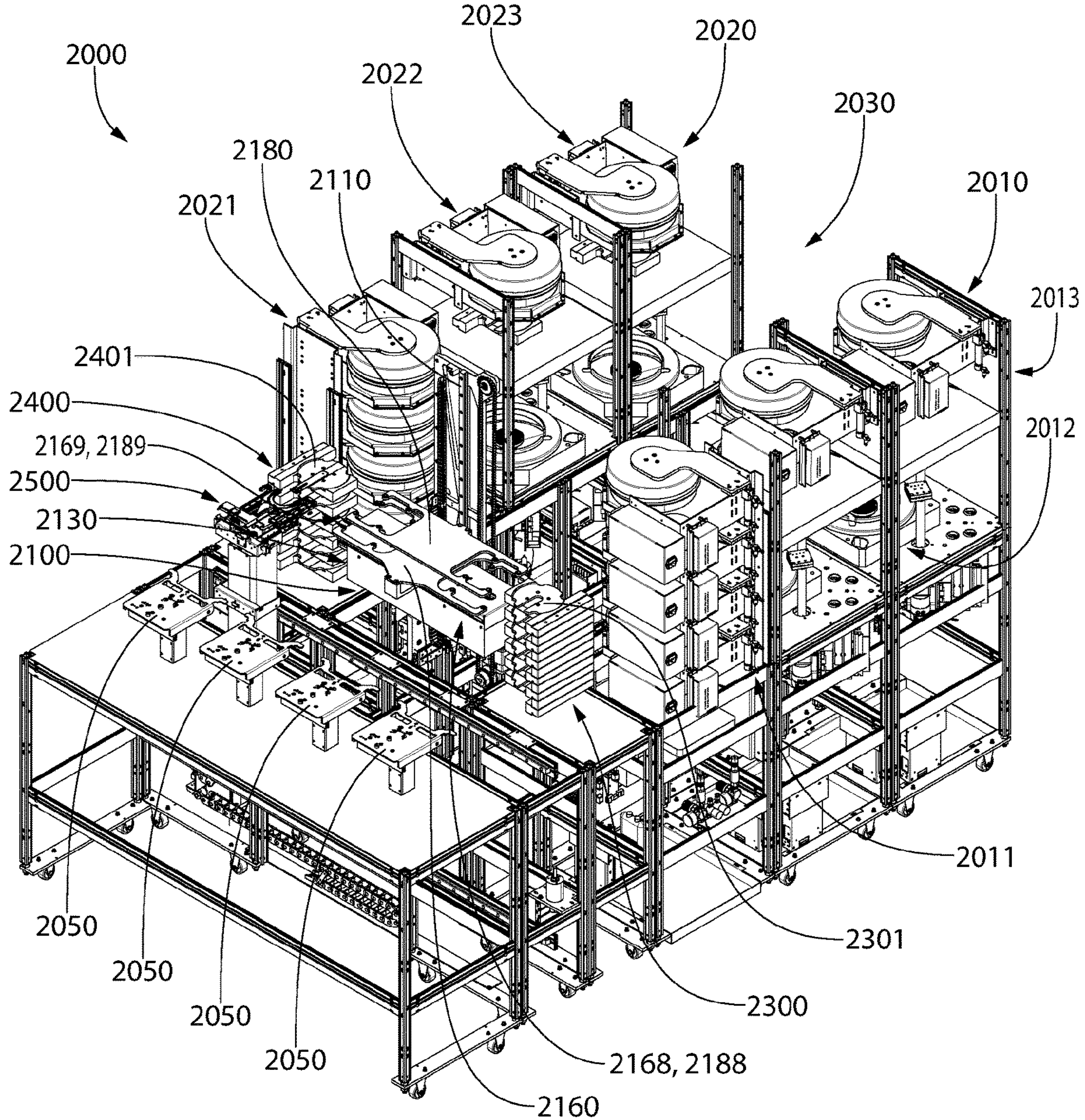
FIG. 12 is a top front perspective view of a semiconductor processing system in accordance with another embodiment of the present invention.
Figure 13:
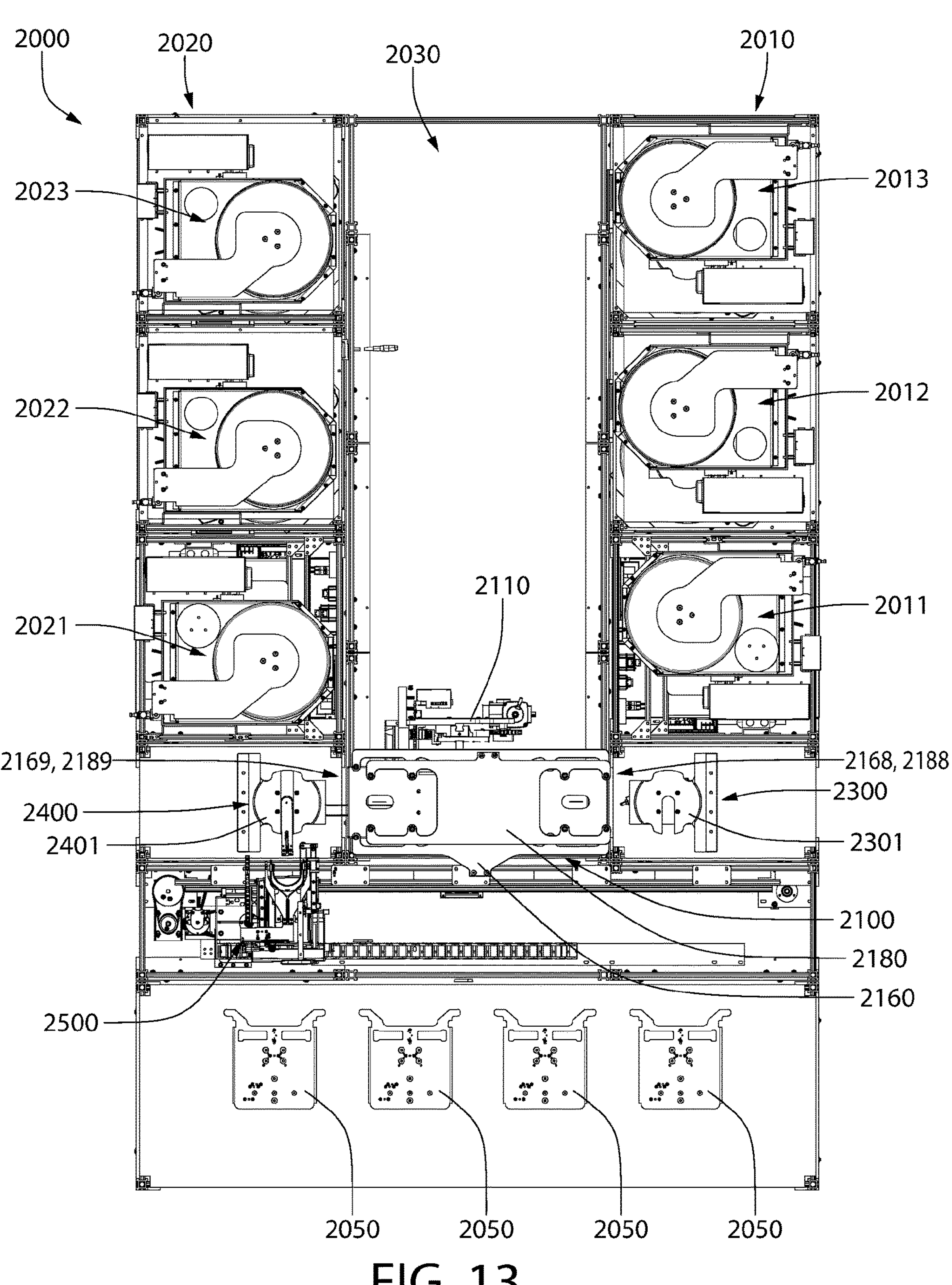
FIG. 13 is a top view of the semiconductor processing system of FIG. 12.

Referring to FIGS. 12 and 13, a semiconductor processing system 2000 is illustrated in accordance with another embodiment of the present invention. There are several overlapping features and components among the semiconductor processing system 2000 that will be described below and the semiconductor processing system 1000 described above. Thus, certain features and components of the semiconductor processing system 2000 will not be described in detail, but instead reference will be made to the description of a similar feature or component of the semiconductor processing system 1000 with the understanding that the description of that similar feature with reference to the semiconductor processing system 1000 is applicable.

The semiconductor processing system 2000 comprises an aisle 2030, a first plurality of stacks of process modules 2010 located on a first side of the aisle 2030, and a second plurality of stacks of process modules 2020 located on a second side of the aisle 2030 that is opposite the first side of the aisle 2030. The process modules may be used for coating, developing, or other steps in a semiconductor processing or fabrication process, as described above. The invention is not to be limited to the types of process modules included within each stack as this may be modified and changed depending on the specific processing steps that are taking place within the system.

In this embodiment, the first plurality of stacks of process modules 2010 comprises a first stack of process modules 2011, a second stack of process modules 2012, and a third stack of process modules 2013. Furthermore, the second plurality of stacks of process modules 2020 comprises a fourth stack of process modules 2021, a fifth stack of process modules 2022, and a sixth stack of process modules 2023. Fewer or greater numbers of stacks of process modules may be used in other embodiments. For example there may be just a single stack of process modules on either side of the aisle 2030, or there may be greater than three stacks of process modules on either side of the aisle 2030. The spacing between the process modules of the first plurality of stacks of process modules 2010 and the spacing between the process modules of the second plurality of stacks of process modules 2020 may be modified from that which is depicted in the drawings.

The semiconductor processing system 2000 may comprise a plurality of storage apparatuses or cassettes 2050, which have been described above with reference to the semiconductor processing system 1000 and will not be repeated here. Generally, the storage apparatuses 2050 are configured to hold substrates either before or after those substrates are processed in the process modules.

The semiconductor processing system 2000 may further comprise a first buffer assembly 2300 located on the first side of the aisle 2030 and a second buffer assembly 2400 located on the second side of the aisle 2030. Thus, the first buffer assembly 2300 may be arranged in a row or column with the first plurality of stacks of process modules 2010 and the second buffer assembly 2400 may be arranged in a row or column with the second plurality of stacks of process modules 2020. The first buffer assembly 2300 may be located next to the first stack of process modules 2011 and the second buffer assembly 2300 may be located next to the fourth stack of process modules 2021. The first buffer assembly 2300 may comprise a plurality of first buffer units 2301, each of which may be configured to hold one or more substrates. The second buffer assembly 2400 may comprise a plurality of second buffer units, each of which may be configured to hold one or more substrates.

The first and second buffer assemblies 2300, 2400 could potentially be omitted by positioning the storage apparatuses 2050 at the location of the buffer assemblies 2300, 2400. This is because the storage apparatuses 2050 and the buffer assemblies 2300, 2400 may all be configured to hold or store the substrates while the substrates are not actively being processed in a process module. In such embodiment, the robot apparatus 2100 may remove substrates directly from the storage apparatus 2050 and return the substrates to the storage apparatus 2050. The robot apparatus 2100 may be configured to remove a substrate from a cassette of the storage apparatuses 2050 and return the substrate to the same slot in the cassette. In this embodiment, there is only one robot assembly and it may use vacuum end effectors.

In the exemplified embodiment, the semiconductor processing system 2000 further comprises a transport robot 2500 that is configured to move the substrates from the storage apparatuses 2050 to the buffer assemblies 2300, 2400. The transport robot 2500 is identical to the transport robot 500 described above in terms of structure and function and will therefore not be described in further detail here, it being understood that the description above is applicable.

In embodiments where the storage apparatuses are omitted, the transport robot 2500 may transport the substrates from some other area of the processing system to the buffer assemblies 2300, 2400.

The semiconductor processing system 2000 further comprises a robot apparatus 2100. The robot apparatus 2100 comprises all of the same features and components and functions as the first robot apparatus 100 and the second robot apparatus 200 described above. Specifically, the robot apparatus 2100 comprises a support structure 2110, an elevator assembly 2130, a first arm 2160 with a first end effector 2168 and a second end effector 2169 and a second arm 2180 with a first end effector 2188 and a second end effector 2189. The first and second arms 2160, 2180 are mounted to the support structure 2110 in a vertically spaced apart manner, and that space is maintained consistent throughout any movement of the components of the robot apparatus 2100. The movement of the first and second arms 2160, 2180 is the same as the movement of the first and second arms 160, 180 and thus this will not be repeated here in the interest of brevity, it being understood that the description of the first robot apparatus 100 is applicable to the robot apparatus 2100. The robot assembly 2100 may include a first drive mechanism for controlling movement of the elevator assembly 2130 and the first and second arms 2160, 2180 in the up/down direction (i.e., vertical), a second drive mechanism for controlling movement of the first arm 2160 in the side-to-side direction (i.e., horizontal), and a third drive mechanism for controlling movement of the third arm 2180 in the side-to-side direction (i.e., horizontal).

One difference between the robot apparatus 2100 as compared to the first and second robot apparatuses 100, 200 is that the robot apparatus 2100 may be configured to move axially along the aisle 2030 whereas the first and second robot apparatuses 100, 200 are fixed in position and only the arms thereof are movable. In this embodiment, the entire robot apparatus 2100 is configured to move along the aisle 2030. Thus, the robot apparatus 2100 may be positioned between the first and second buffer assemblies 2300, 2400 as shown in FIGS. 12 and 13. In this position the robot apparatus 2100 may be configured to interact with the first and second buffer assemblies 2300, 2400 to load substrates into or unload substrates from the buffer units 2301, 2401 thereof. The robot apparatus 2100 may then move from this position to another position wherein the robot apparatus 2100 is positioned between the first and fourth stacks of process modules 2011, 2021. In this position the robot apparatus 2100 may be configured to interact with the process modules of the first and fourth stacks of process modules 2011, 2021 to load substrates into or unload substrates from the process modules of the first and fourth stacks of process modules 2011, 2022. The robot apparatus 2100 may further move to another position wherein the robot apparatus 2100 is positioned between the second and fifth stacks of process modules 2012, 2022. In this position, the robot apparatus 2100 may be configured to interact with the process modules of the second and fifth stacks of process modules 2012, 2022 to load substrates into or unload substrates from the process modules of the second and fifth stacks of process modules 2012, 2022. The robot apparatus 2100 may further move to another position wherein the robot apparatus 2100 is positioned between the third and sixth stacks of process modules 2013, 2023. In this position, the robot apparatus 2100 may be configured to interact with the process modules of the third and sixth stacks of process modules 2013, 2023 to load substrates into or unload substrates from the process modules of the third and sixth stacks of process modules 2013, 2023.

Figure 14A:
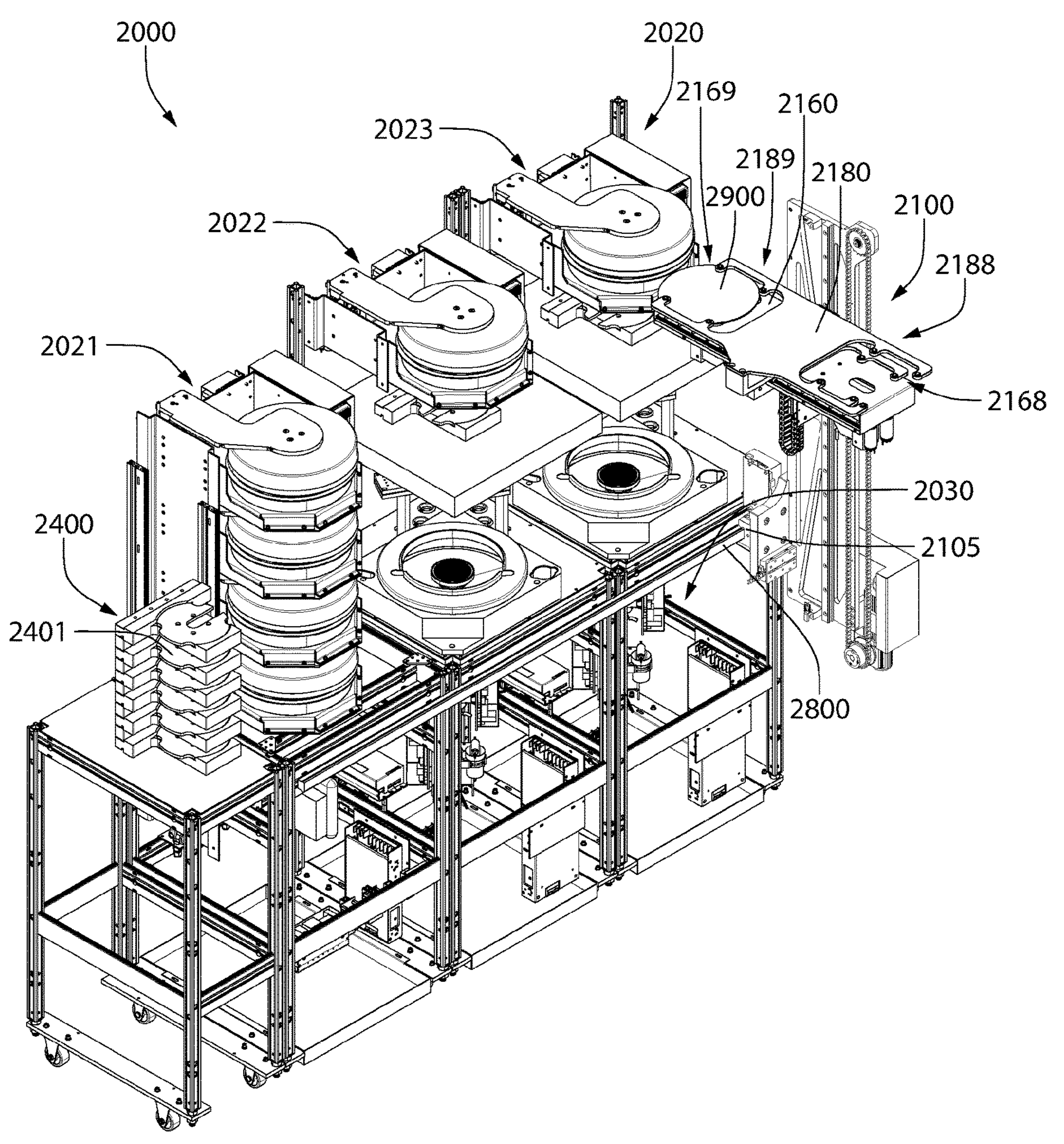
FIGS. 14A-14E illustrate operation of the semiconductor processing system of FIG. 12 and specifically operation of the robot apparatus to move substrates through the system.

As best seen in FIG. 14A, in this embodiment the semiconductor processing system 2000 may comprise a robot track 2800 and the robot apparatus 2100 may comprise a robot track coupler 2105 that is configured to mate with the robot track 2800 to mount the robot apparatus 2100 to the robot track 2800 and facilitate the movement of the robot apparatus 2100 along the robot track 2800. The robot track coupler 2105 may have features that mate with features of the robot track 2800 (grooves and protuberances, for example) to allow the robot track coupler 2105 to slide or otherwise move along the robot track 2800 without becoming detached therefrom. The semiconductor processing system 2000 may comprise a drive mechanism or assembly that is configured to facilitate the movement of the robot apparatus 2100 via the robot track coupler 2105 along the robot track 2800. The drive mechanism may comprise a motor, a gear system, a chain driver, a belt driver, a hydraulic system, a pneumatic system, or any other system or mechanism that is capable of controlling movement of the robot apparatus 2100 along the robot track 2800. The robot track 2800 may extend along a substantial entirety of the aisle 2030 to enable the robot apparatus 2100 to be located in the different positions as described above.

In terms of function and operation, the semiconductor processing system 2000 may operate as follows. The transport robot 2500 may transfer one or more of the substrates from one or more of the storage apparatuses 2050 to one or more of the buffer units 2301, 2401 of the buffer assemblies 2300, 2400. This may involve the transport robot 2500 moving some substrates from the buffer assemblies 2300, 2400 to the storage apparatuses 2050 and moving other substrates from the storage apparatuses 2050 to the buffer assemblies 2300, 2400. Next, the robot apparatus 2100 is moved into a position whereby the robot apparatus 2100 is located between the first and second buffer assemblies 2300, 2400. The robot apparatus 2100 may then be operated to maneuver the first and second arms 2160, 2180 so that: (1)

one of the first end effectors 2168, 2188 of one of the first and second arms 2160, 2180 takes a substrate from one of the buffer units 2301 of the first buffer assembly 2300 so that the substrate is supported by the one of the first end effectors 2168, 2188; or (2) one of the second end effectors 2169, 2189 of one of the first and second arms 2160, 2180 takes a substrate from one of the buffer units 2401 of the second buffer assembly 2400 so that the substrate is supported by the one of the second end effectors 2169, 2189. In one embodiment, one of the first end effectors 2168, 2188 may take a substrate from the first buffer assembly 2300 and one of the second end effectors 2169, 2189 may take a substrate from the second buffer assembly 2400. However, it should be appreciated that at this stage only one of the first end effectors 2168, 2188 may be supporting one of the substrates while the other one of the first end effectors 2168, 2188 is not supporting one of the substrates. Similarly, at this stage only one of the second end effectors 2169, 2189 may be supporting one of the substrates while the other one of the second end effectors 2169, 189 is not supporting one of the substrates. This is because, as with the previously described embodiment, the robot apparatus 2100 is next going to remove a substrate from one of the process modules and transfer the substrate that it is supporting into that process module. This swap is possible by having one of the first end effectors 2168, 2188 2188 empty so that it can remove a substrate from one of the process modules with the other one of the first end effectors 2168 supporting a substrate to be placed into the process module after the other substrate is removed.

The maneuvering required to allow the first and second end effectors 2168, 2188, 2169, 2189 to take a substrate from the buffer assemblies 2300, 2400 and support the substrate is the same as the maneuvering described above. A brief description will be provided here with reference to the first end effector 2168, it being understood that similar movements/maneuvering can be done to any of the arms for the other end effectors to take a substrate from the buffer assemblies 2300, 2400. With the robot assembly 2100 in the position shown in FIGS. 12 and 13, the third drive mechanism is activated to move the first and second arms 2160, 2180 upwardly/downwardly in the vertical direction to a desired position so that the first arm 2160 is aligned with a selected one of the buffer units 2301. The first drive mechanism is then activated to move the first arm 2160 towards the selected one of the buffer units 2301. During this movement, the first arm 2160 may be located slightly below the substrate that is located in the selected one of the buffer units 2301. Next, the third drive mechanism is activated to move the first arm 2160 upwardly in the vertical direction so that the first arm 2160 takes over support of the substrate. Finally, the first drive mechanism may be activated to retract the first arm 2160 away from the selected one of the buffer units 2301, with the first end effector 2168 of the first arm 2160 now supporting the selected substrate. The robot apparatus 2100 may then be maneuvered to remove a substrate from one of the process modules and insert the substrate that is currently supported by the first end effector 2168 of the first arm 2160 into the process module from which the substrate is removed.

In FIG. 14A, the second end effector 2169 of the first arm 2160 is supporting a first substrate 2900. This means that while the robot apparatus 2100 was located between the first and second buffer assemblies 2300, 2400 (the position shown in FIGS. 12 and 13), the first arm 2160 was maneuvered as described above to remove the first substrate 2900 from one of the buffer units 2401 of the second buffer assembly 2400. Next, the robot apparatus 2100 was moved along the robot track 2800 until the robot apparatus 2100 is positioned between the third and sixth process modules 2013, 2023. As noted above, at this stage it may be possible for one of the first end effectors 2168, 2188 to also be supporting a substrate, although this is not shown in the exemplified embodiment. In FIG. 14A, the second end effector 2169 of the first arm 2160 is supporting the first substrate 2900 and the second end effector 2189 of the second arm 2180 is empty and is not supporting a substrate. Furthermore, in FIG. 14A the robot apparatus 2100 is located between the third and sixth process modules 2013, 2023 (although only the sixth process module 2023 is illustrated for clarity).

Figure 14B:
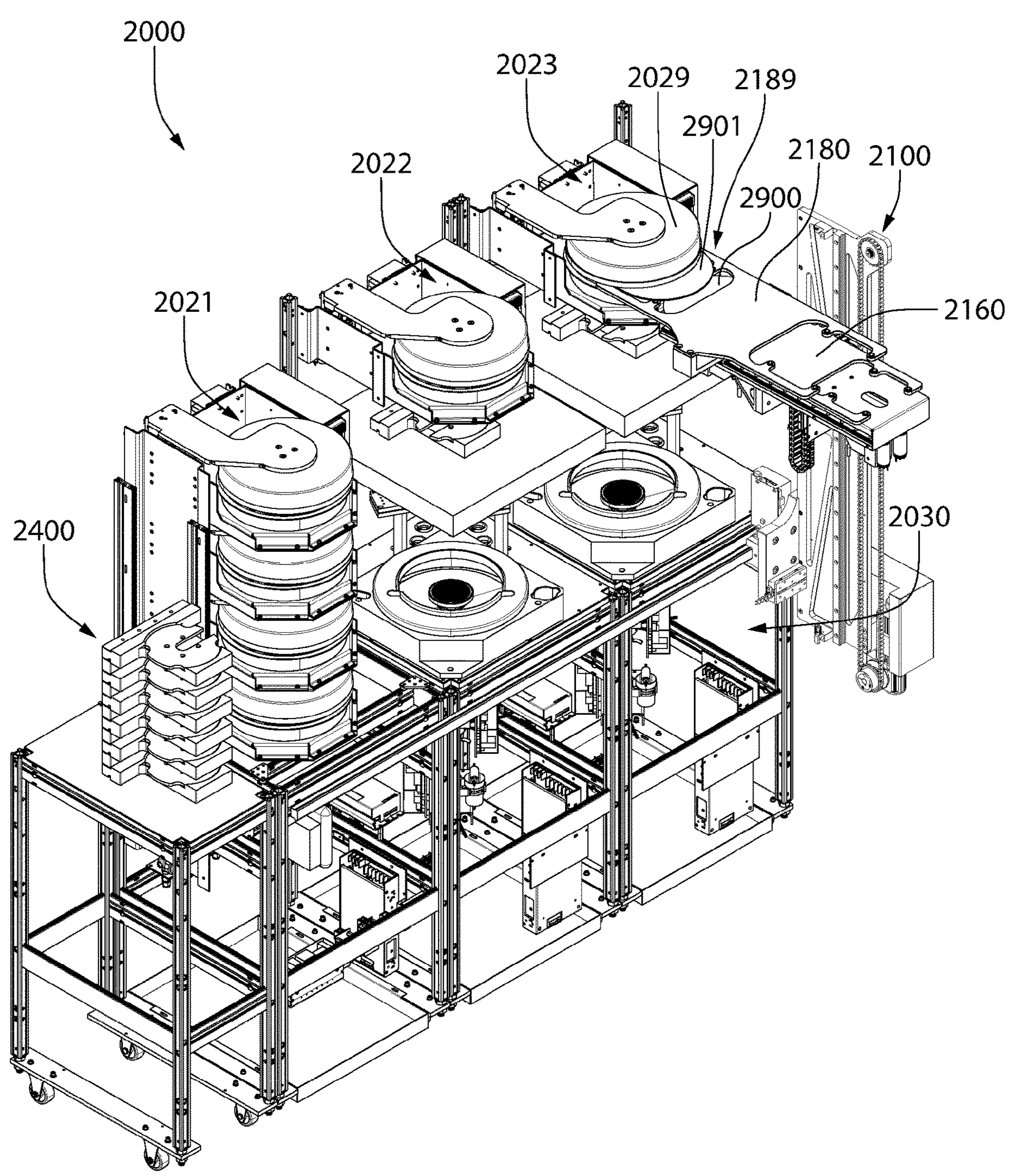

Referring to FIG. 14B, the next step in the process involves maneuvering the second arm 2180 of the robot apparatus 2100 so that the second arm 2180 of the robot apparatus 2100 interacts with a selected process module 2029 of the sixth stack of process modules 2023. The second arm 2180 may be maneuvered by activating the third drive mechanism and the second drive mechanism of the robot apparatus 2100 in a sequence that allows the second end effector 2189 of the second arm 2180 to move into the selected process module 2029 below a second substrate 2901, move upwardly to take over support of the selected substrate 2901, and then move away from the selected process module 2029. Once this step is complete, the second end effector 2189 of the second arm 2180 of the robot apparatus 2100 is supporting the second substrate 2901 and the second end effector 2169 of the second arm 2160 of the robot apparatus 2100 is supporting the first substrate 2900. The second substrate 2901 has been processed in the selected process module 2029 and is removed therefrom whereas the first substrate 2900 is ready to be inserted into the selected process module 2029 for processing.

Figure 14C:
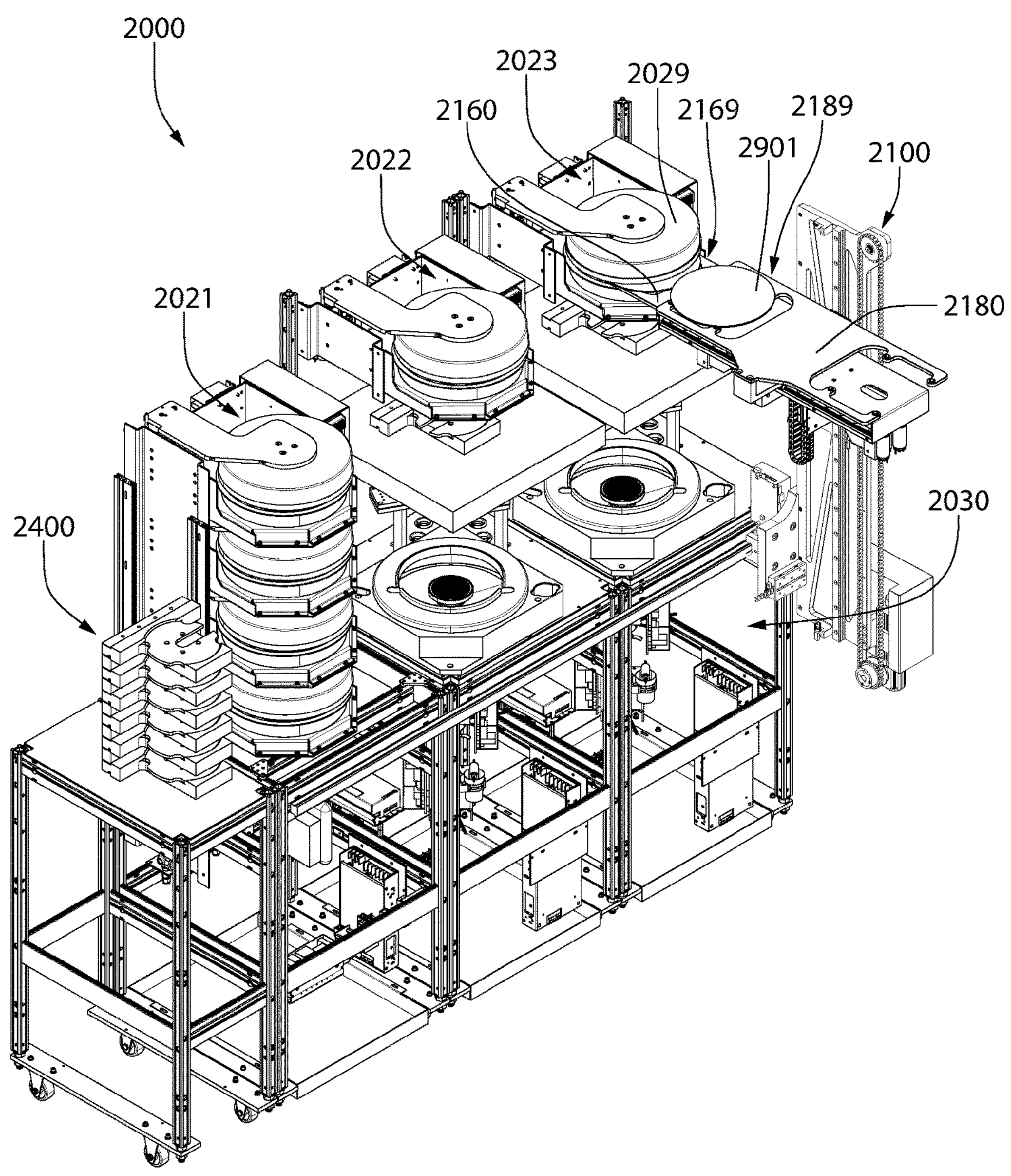

Next, referring to FIG. 14C, the first arm 2160 of the robot apparatus 2100 is maneuvered in the manner described herein to insert the first substrate 2900 into the selected process module 2029 so that the first substrate 2900 may be processed therein. Once again, this is achieved by activating the third drive mechanism and the first drive mechanism of the first robot 2100 in a specific sequence, the third drive mechanism controlling the up/down vertical movement of the first arm 2160 and the first drive mechanism controlling the side-to-side horizontal movement of the first arm 2160. As shown in FIG. 14C, the second arm 2180 is in the retracted position holding the second substrate 2901 which it has previously removed from the selected process module 2029. Thus, this step transfers the first substrate 2900 from the second end effector 2169 of the first arm 2160 into the selected process module 2029 from which the second substrate 2901 was just removed.

Figure 14D:
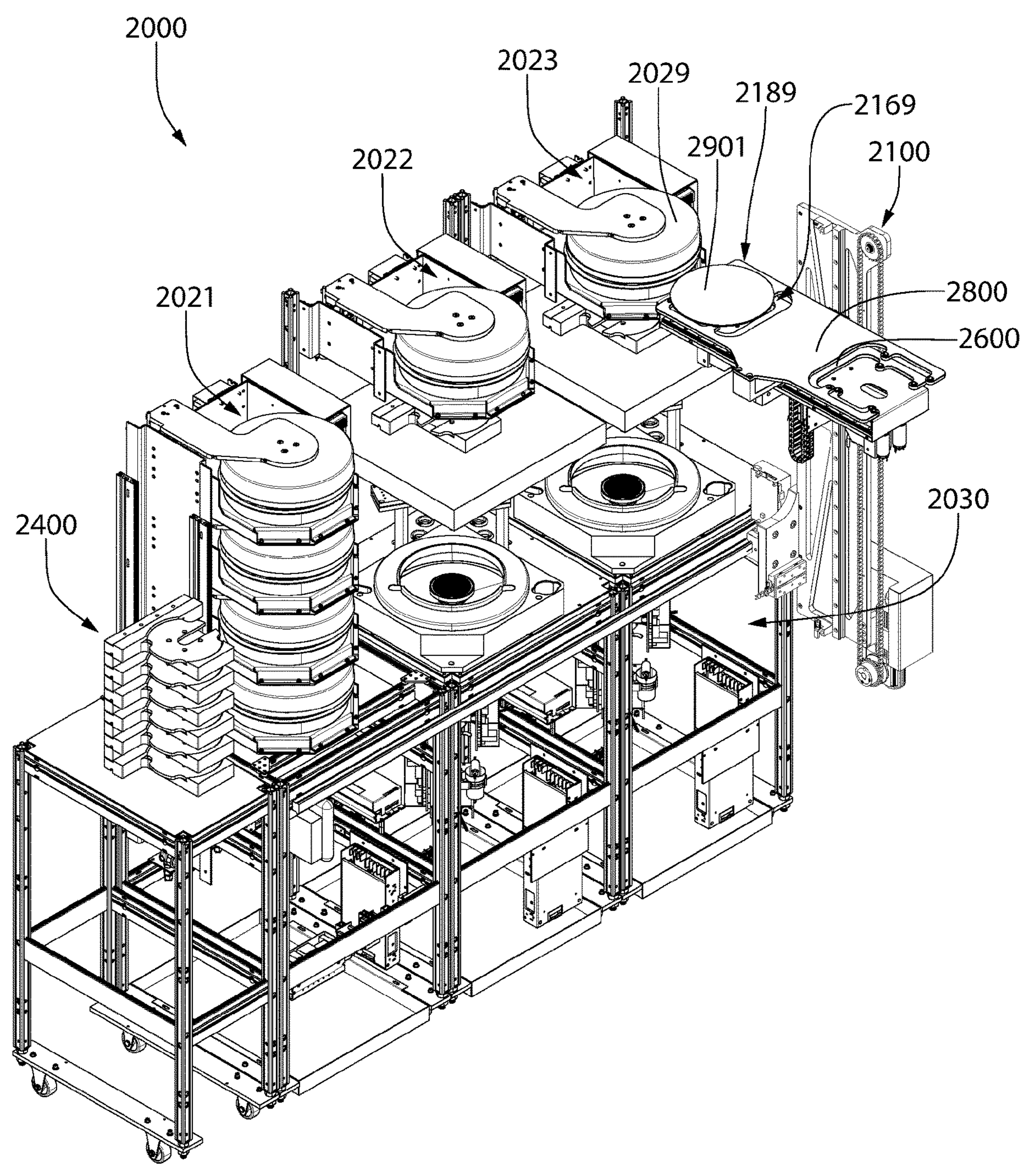

Next referring to FIG. 14D, the first arm 2160 is retracted back out of the selected process module 2029. This is achieved by activating the first drive mechanism of the robot apparatus 2100 to move the first arm 2160 horizontally away from the selected process module 2029. In FIG. 14D, the second end effector 2189 of the second arm 2180 is still supporting the second substrate 2901, but the second end effector 2169 of the first arm 2160 is no longer supporting the first substrate 2900 because it has previously transferred the first substrate 2901 into the selected process module 2029.

Figure 14E:
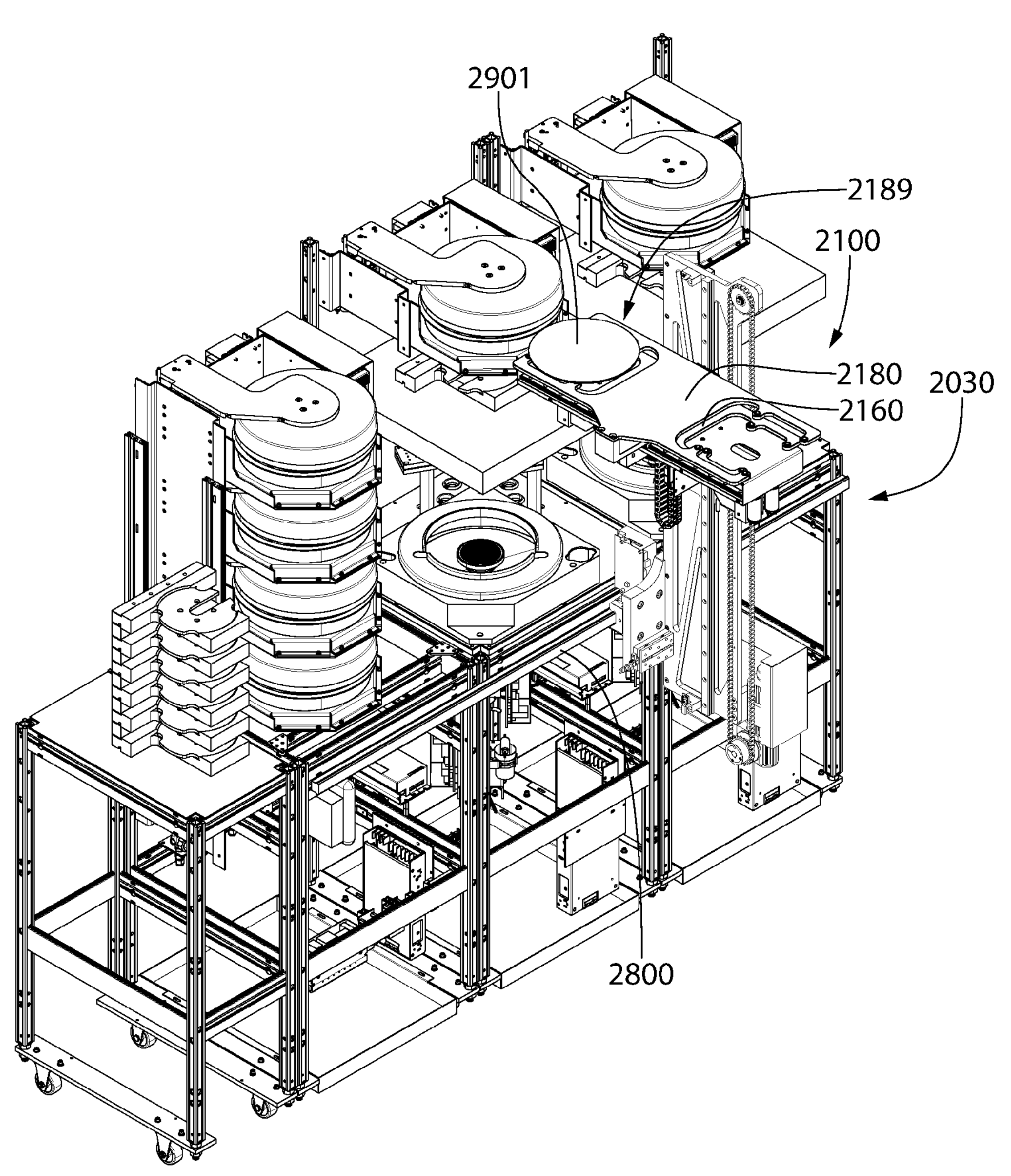

Next, referring to FIG. 14E, the robot apparatus 2100 is moved along the track 2800 to its next location where it will transfer the second substrate 2901 to its next location. In one embodiment, the robot apparatus 2100 may be moved to the position between the buffer assemblies 2300, 2400 to transfer the second substrate 2901 back into one of the buffer units of the second buffer assembly 2400. In another embodiment, the robot apparatus 2100 may be moved to a position between the second and fifth stacks of process modules 2012, 2022 or between the first and fourth stacks of process modules 2011, 2021 to transfer the second substrate 2901 into one of the process modules of one of the fourth and fifth stacks of process modules 2021, 2022. This may depend on what the next step in the processing is for the second substrate 2901.

Thus, it should be appreciated that using only linear motion, the robot apparatus 2100 may interact with the process modules on both sides of the aisle 2030. In this embodiment, a single robot apparatus 2100 may be used to interact with (i.e., add/remove substrates from) all of the process modules in the system 2000. Whereas with the system 1000 the transport assemblies 300, 400 move the substrate to the different positions along the aisle, with the system 2000 the robot apparatus 2100 moves the substrates to the different positions along the aisle. The same exact robot apparatus 100, 200, 2100 may be used in both embodiments, although multiple of the robot apparatuses 100, 200 are needed in the system 1000 whereas just one of the robot apparatuses 2100 is needed in the system 2000.

Figure 15:
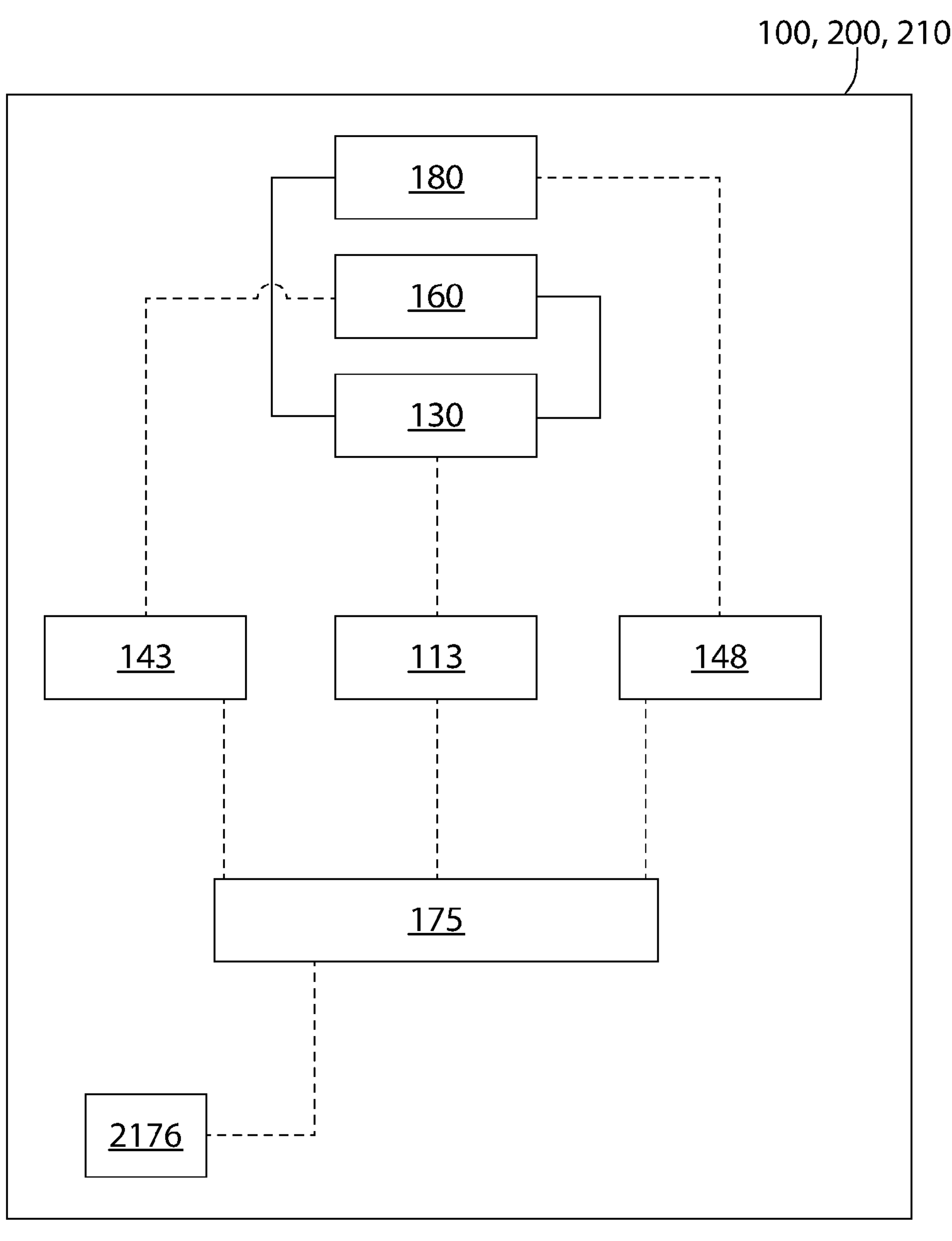
FIG. 15 is a schematic diagram of a robot apparatus in accordance with an embodiment of the present invention.

Referring to FIG. 15, a schematic diagram is provided. The schematic diagram symbolically illustrates the main working parts of the various robot apparatuses 100, 200, 2100 described herein. Many of the parts have been described in significant detail above, and the diagram is provided as a simplified illustration of these parts and their interconnections. The numerals used relate to the first robot apparatus 100. However, the first and second robot apparatuses 100, 200 are identical and thus all descriptions relevant to the first robot apparatus 100 are applicable to the second robot apparatus 200. Furthermore, the robot apparatus 2100 is identical to the first and second robot apparatuses 100, 200 except for the addition of a fourth drive mechanism 2176 which is illustrated in the schematic but may only be included with the robot apparatus 2100 and not with the first and second robot apparatuses 100, 200.

The robot apparatuses 100, 200, 2100 comprise the first arm 160 and the second arm 180 which are coupled to the elevator assembly 130. The third drive mechanism 113 is operably coupled to the elevator assembly 130. The third drive mechanism 113 controls movement of the elevator assembly 130, and hence also the first and second arms 160, 180, in a vertical direction (up and down). The robot apparatuses 100, 200, 2100 further comprise the first drive mechanism 143 that is operably coupled to the first arm 160 and the second drive mechanism 148 that is operably coupled to the second arm 180. The first drive mechanism 143 controls movement of the first arm 160 in a horizontal direction (side-to-side). The second drive mechanism 148 controls movement of the second arm 180 in a horizontal direction (side-to-side). As described in detail above, the third drive mechanism 113 moves the elevator assembly 130 and the first and second arms 160, 180 together so that the first and second arms 160, 180 move in the vertical direction simultaneously. As described above, the first drive mechanism 160 only controls movement of the first arm 160 in the horizontal direction and the second drive mechanism 180 only controls movement of the second arm 180 in the horizontal direction. Thus, the first drive mechanism 143 moves the first arm 160 independently of the movement of the second arm 180 and the second drive mechanism 148 moves the second arm 180 independently of the movement of the first arm 160. The first, second, and third drive mechanisms 113, 143, 148 control movement of the first and second arms 160, 180 in linear directions only. The first and second arms 160, 180 may not be moved in rotational directions.

In the exemplified embodiment the robot apparatuses 100, 200, 2100 are illustrated to comprise a control unit 175 that is operably coupled to each of the first, second, and third drive mechanisms 113, 143, 148. The control unit 175 may be a processor or controller or computer device or the like which is configured to activate and deactivate the first, second, and third drive mechanisms 113, 143, 148 in accordance with a desired movement sequence. The control unit 175 may comprise, or be coupled to, a memory device which stores instructions related to the movement of the first and second arms 160, 180 so that the control unit 175 and selectively activate and deactivate the first, second, and third drive mechanisms 113, 143, 148 in the manner required to achieve the necessary movement of the first and second arms 160, 180. While the control unit 175 is illustrated as being part of the robot apparatuses 100, 200, 2100, in an embodiment the control unit 175 may be a separate part or system which is external to and operably coupled to the robot apparatuses 100, 200, 2100.

The diagram also illustrates the fourth drive mechanism 2176. The robot apparatus 2100 may comprise the fourth drive mechanism 2176, but the first and second robot apparatuses 100, 200 may not include the fourth drive mechanism 2176. The fourth drive mechanism 2176 is the drive mechanism that is configured to move the robot apparatus 2100 along the track 2800 so that the robot apparatus 2100 can move through the aisle 2030. The fourth drive mechanism 2176 may not be needed for the first and second robot apparatuses 100, 200 because the robot apparatuses 100, 200 do not move through the aisle of the system 1000 since there are multiple robot apparatuses 100, 200 in the system. The fourth drive mechanism 2176 may be operably coupled to the control unit 175 so that the control unit 175 can control the activation of the fourth drive mechanism 2176 in accordance with an algorithm or instructions stored in memory.

Some variations to the structures and mechanics of the robot apparatuses 100, 200, 2100 may be used in alternative embodiments. For example, in an embodiment there may be two separate drive mechanisms for controlling the vertical up/down movement of the first and second arms 160, 180. Specifically, there may be one drive mechanism coupled to the first arm 160 to control the up/down movement of the first arm 160 and another drive mechanism coupled to the second arm 180 to control the up/down movement of the second arm 180. Thus, in an embodiment the first and second arms 160, 180 may be up/down independently of one another rather than simultaneously. In an embodiment, the control unit 175 may be a separate part from the robot apparatus 100, 200, 2100 that is coupled to the various drive mechanisms to control the movement of the first and second arms 160, 180.

Any of the end effectors described herein may use either pins or vacuum to hold a substrate thereon.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A semiconductor processing system comprising:

a first stack of process modules and a third stack of process modules, the first stack of process modules being spaced apart from the third stack of process modules by a first portion of an aisle;

a first robot apparatus at least partially located within the first portion of the aisle, the first robot apparatus comprising:

a first arm having a first end effector at a first end thereof and a second end effector at a second end thereof; and a second arm having a first end effector at a first end thereof and a second end effector at a second end thereof, the second arm being spaced vertically from the first arm;

wherein the first robot apparatus is configured to:

maneuver the first arm so that the first end effector of the first arm interacts with one of the process modules of the first stack or the second end effector of the first arm interacts with one of the process modules of the third stack; and maneuver the second arm so that the first end effector of the second arm interacts with one of the process modules of the first stack or the second end effector of the second arm interacts with one of the process modules of the third stack; and wherein the first robot apparatus is devoid of any rotational axis, such that the first and second arms are incapable of rotation and are configured to move only along linear axes.

2. The semiconductor processing system according to claim 1 wherein maneuvering the first and second arms to interact with the one of the process modules of the first stack comprises moving the first and second arms in a first direction, wherein maneuvering the first and second arms to interact with the one of the process modules of the third stack comprises moving the first and second arms in a second direction that is opposite the first direction, and wherein the first and second arms are configured to move in the first and second directions independently of one another.

3. The semiconductor processing system according to claim 1 wherein the first robot apparatus is further configured to move the first and second arms in first and second vertical directions, and wherein when moving the first and second arms in the first and second vertical directions the first and second arms move simultaneously so as to maintain a constant spacing distance between the first and second arms.

4. The semiconductor processing system according to claim 1 wherein the first robot apparatus comprises:

a support structure and an elevator assembly that is coupled to the support structure, each of the first and second arms being coupled to the elevator assembly;

a first drive mechanism operably coupled to the first arm and configured to move the first arm in first and second horizontal directions relative to the elevator assembly;

a second drive mechanism operably coupled to the second arm and configured to move the second arm in the first and second horizontal directions relative to the elevator assembly independently of the movement of the first arm; and a third drive mechanism operably coupled to the elevator assembly to simultaneously move the elevator assembly and the first and second arms in a vertical direction.

5. The semiconductor processing system according to claim 1 further comprising:

a second stack of process modules and a fourth stack of process modules, the second and fourth stacks of process modules being spaced apart by a second portion of the aisle; and a second robot apparatus at least partially located within the second portion of the aisle, wherein the second robot apparatus is configured to interact with the second and fourth stacks of process modules.

6. The semiconductor processing system according to claim 5 further comprising:

wherein the second robot apparatus comprises:

a first arm having a first end effector at a first end thereof and a second end effector at a second end thereof; and a second arm having a first end effector at a first end thereof and a second end effector at a second end thereof, the second arm being spaced vertically from the first arm;

wherein the second robot apparatus is configured to:

maneuver the first arm so that the first end effector of the first arm interacts with one of the process modules of the second stack;

maneuver the second arm so that the first end effector of the second arm interacts with one of the process modules of the second stack;

maneuver the first arm so that the second end effector of the first arm interacts with one of the process modules of the fourth stack; and maneuver the second arm so that the second end effector of the second arm interacts with one of the process modules of the fourth stack.

7. The semiconductor processing system according to claim 5 further comprising:

a first transport assembly comprising a first support member configured to support at least one substrate, the first support member being movable between a first position wherein the first support member is aligned with the first stack of process modules and a second position wherein the first support member is aligned with the second stack of process modules; and wherein when the first support member is in the first position the first robot apparatus is configured to interact with the first support member and when the first support member is in the second position the second robot apparatus is configured to interact with the first support member.

8. The semiconductor processing system according to claim 7 further comprising:

a second transport assembly comprising a second support member configured to support at least one substrate, the second support member being movable between a first position wherein the second support member is aligned with the third stack of process modules and a second position wherein the second support member is aligned with the fourth stack of process modules; and wherein when the second support member is in the first position the first robot apparatus is configured to interact with the second support member and when the second support member is in the second position the second robot apparatus is configured to interact with the second support member.

9. The semiconductor processing system according to claim 1 further comprising:

wherein the first arm of the first robot apparatus comprises a first plate comprising a first central portion having a first end and a second end, a first pair of support arms extending from the first end of the first central portion to form the first end effector of the first arm, and a second pair of support arms extending from the second end of the first central portion to form the second end effector of the first arm; and wherein the second arm of the first robot apparatus comprises a second plate comprising a second central portion having a first end and a second end, a third pair of support arms extending from the first end of the second central portion to form the first end effector of the second arm, and a fourth pair of support arms extending from the second end of the second central portion to form the second end effector of the second arm.

10. The semiconductor processing system according to claim 1 wherein a vertical distance between the first and second arms of the first robot apparatus is constant.

11. The semiconductor processing system according to claim 1 further comprising:

a second stack of process modules and a fourth stack of process modules, the second and fourth stacks of process modules being spaced apart by a second portion of the aisle; and wherein the first robot apparatus is configured to move between the first and second portions of the aisle so that the first robot apparatus can interact with the first and third stacks of process modules when located within the first portion of the aisle and the first robot apparatus can interact with the second and fourth stacks of process modules when located within the second portion of the aisle.

12. A semiconductor processing system comprising:

a first stack of process modules;

a third stack of process modules spaced apart from the first stack of process modules;

a first robot apparatus located between the first and third stacks of process modules, the first robot apparatus configured to: (1) support a first pre-processed substrate on a first end effector of a first arm of the first robot apparatus; (2) remove a first post-processed substrate from one of the process modules of the first stack with a first end effector of a second arm of the first robot apparatus; (3) transfer the first pre-processed substrate from the first end effector of the first arm of the first robot apparatus to the one of the process modules of the first stack; (4) support a second pre-processed substrate on a second end effector of the first arm of the first robot apparatus; (5) remove a second post-processed substrate from one of the process modules of the third stack with a second end effector of the second arm of the first robot apparatus; and (6) transfer the second pre-processed substrate from the second end effector of the first arm of the first robot apparatus to the one of the process modules of the third stack; and wherein the first and second arms are configured to move only along linear axes and are incapable of rotation about a rotational axis.

13. The semiconductor processing system according to claim 12 further comprising:

the first robot apparatus comprising an elevator assembly having a longitudinal axis, the elevator assembly configured to move in upward and downward directions that are perpendicular to the longitudinal axis, the first and second arms coupled to the elevator assembly and being vertically spaced apart from one another by a fixed distance, each of the first and second arms being configured to move relative to the elevator assembly in a direction of the longitudinal axis and being configured to move along with the elevator assembly when the elevator assembly moves in the upward and downward directions.

14. The semiconductor processing system according to claim 13 wherein the first robot apparatus is configured to remove the first post-processed substrate from the one of the process modules of the first stack by:

moving the second arm of the first robot apparatus in a first direction towards the one of the process modules of the first stack to position the first end effector of the second arm below the first post-processed substrate;

moving the elevator assembly in the upward direction so that the first end effector of the second arm supports the first post-processed substrate and lifts the first post-processed substrate away from a support structure of the one of the process modules; and moving the second arm of the first robot apparatus in a second direction that is opposite the first direction and away from the one of the process modules of the first stack.

15. The semiconductor processing system according to claim 14 wherein the first robot apparatus is configured to transfer the at least one first pre-processed substrate from the first end effector of the first arm of the first robot apparatus to the one of the process modules of the first stack by:

moving the first arm of the first robot apparatus in the first direction to position the first pre-processed substrate supported on the first end effector of the first arm above the support structure of the one of the process modules;

moving the elevator assembly in the downward direction so that the first end effector moves downwardly until the first pre-processed substrate is supported by the support structure of the one of the process modules; and moving the first arm of the first robot apparatus in the second direction.

16. The semiconductor processing system according to claim 12 further comprising:

the first robot apparatus comprising an elevator assembly having a longitudinal axis, the elevator assembly configured to move in upward and downward directions that are perpendicular to the longitudinal axis, the first and second arms coupled to the elevator assembly and being vertically spaced apart from one another by a fixed distance, each of the first and second arms being configured to move relative to the elevator assembly in a direction of the longitudinal axis and being configured to move along with the elevator assembly when the elevator assembly moves in the upward and downward directions to maintain the fixed distance.

* * * * *